(12) United States Patent
Wang et al.

(10) Patent No.: US 12,464,937 B1
(45) Date of Patent: Nov. 4, 2025

(54) PEROVSKITE OPTOELECTRIC DEVICES AND METHODS OF PRODUCING PEROVSKITE OPTOELECTRIC DEVICES ON FLEXIBLE AND ELASTIC SUBSTRATES

(71) Applicant: Washington University, St. Louis, MO (US)

(72) Inventors: Chuan Wang, St. Louis, MO (US); Junyi Zhao, St. Louis, MO (US)

(73) Assignee: Washington University, St. Louis, MO (US)

( * ) Notice: Subject to any disclaimer, the term of this patent is extended or adjusted under 35 U.S.C. 154(b) by 439 days.

(21) Appl. No.: 17/954,322

(22) Filed: Sep. 27, 2022

Related U.S. Application Data

(60) Provisional application No. 63/249,021, filed on Sep. 27, 2021.

(51) Int. Cl.
| | | |
|---|---|---|
| *H10K 71/13* | (2023.01) | |
| *H10K 30/00* | (2023.01) | |
| *H10K 50/11* | (2023.01) | |
| *H10K 71/60* | (2023.01) | |
| *H10K 85/10* | (2023.01) | |
| *H10K 85/50* | (2023.01) | |
| *H10K 77/10* | (2023.01) | |
| *H10K 102/00* | (2023.01) | |

(52) U.S. Cl.
CPC ......... *H10K 71/135* (2023.02); *H10K 30/451* (2023.02); *H10K 50/11* (2023.02); *H10K 71/611* (2023.02); *H10K 85/1135* (2023.02); *H10K 85/50* (2023.02); *H10K 77/111* (2023.02); *H10K 2102/311* (2023.02)

(58) Field of Classification Search
None
See application file for complete search history.

(56) References Cited

U.S. PATENT DOCUMENTS 10,629,771 B2    4/2020    Zhang

OTHER PUBLICATIONS

Bade et al., "Fully Printed Halide Perovskite Light-Emitting Diodes with Silver Nanowire Electrodes", *ACS Nano* 2016, 10, 1795-1801.
Zheng et al., "High-brightness perovskite quantum dot light-emitting devices using inkjet printing", *Organic Electronics* 93 (2021) 106168.
Hermerschmidt et al., "Finally, inkjet-printed metal halide perovskite LEDs—utilizing seed crystal templating of salty PEDOT:PSS", *Mater. Horiz.*, 2020, 7, 1773.
Zhang et al., "Bright Perovskite Nanocrystal Films for Efficient Light-Emitting Devices", *J. Phys. Chem. Lett.* 2016, 7, 4602-4610.
Bade et al., "Stretchable Light-Emitting Diodes with Organometal-Halide-Perovskite-Polymer Composite Emitters", *Adv. Mater.* 2017, 29, 1607053.

*Primary Examiner* — Anthony Ho

(57) ABSTRACT

A flexible perovskite LED (PeLED) device that includes a flexible PDMS substrate, a PEO-modified PEDOT:PSS transparent anode, a ($CH_3NH_3PbBr_3$)/PEO composite emissive layer, a PEI buffer layer, and an AgNW cathode is disclosed. Methods of producing the PeLED are disclosed that include printing all layers under atmospheric conditions using a printing device to pattern an anode ink, a perovskite ink, a buffer polymer ink, and a cathode ink, with each layer annealed on-site at temperatures sufficient to evaporate the solvents in each ink.

6 Claims, 57 Drawing Sheets

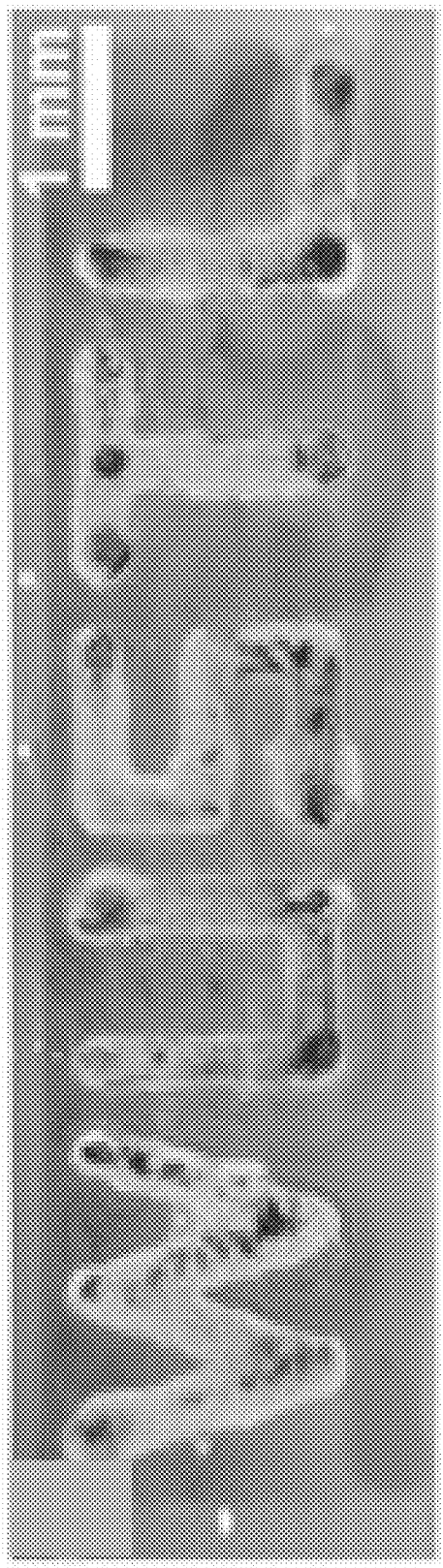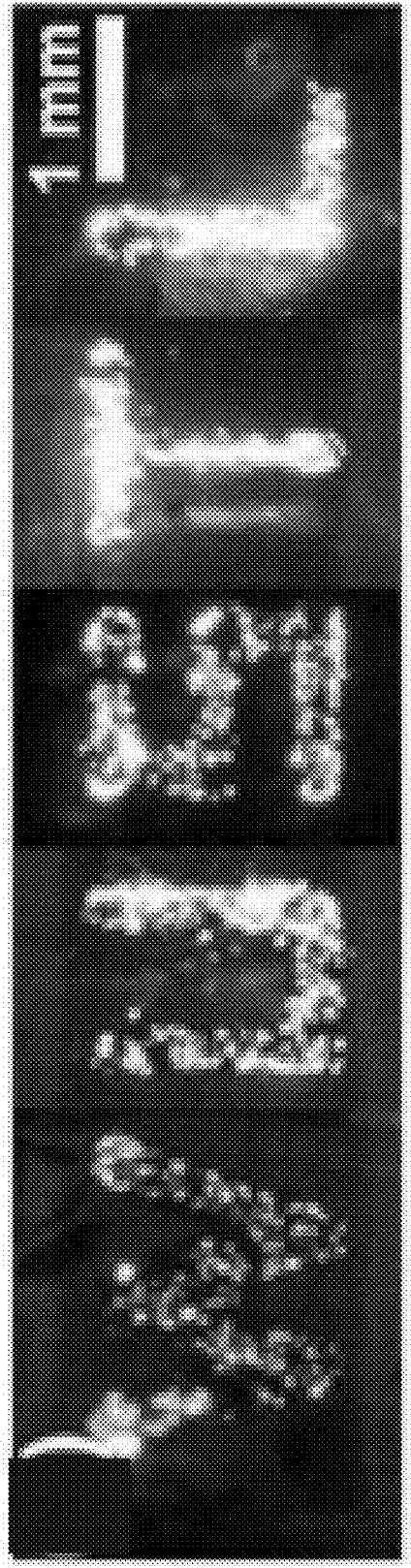
FIG. 1F
FIG. 1G

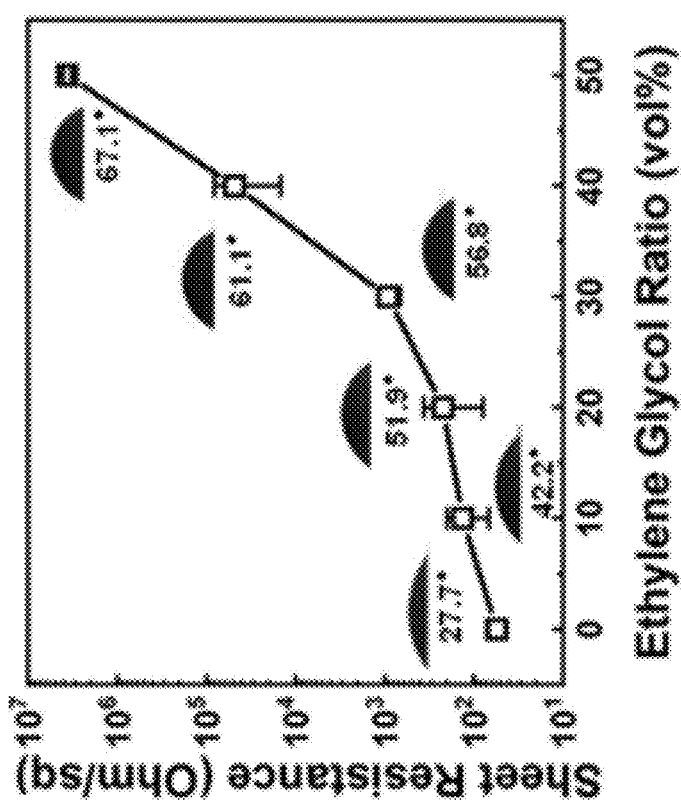
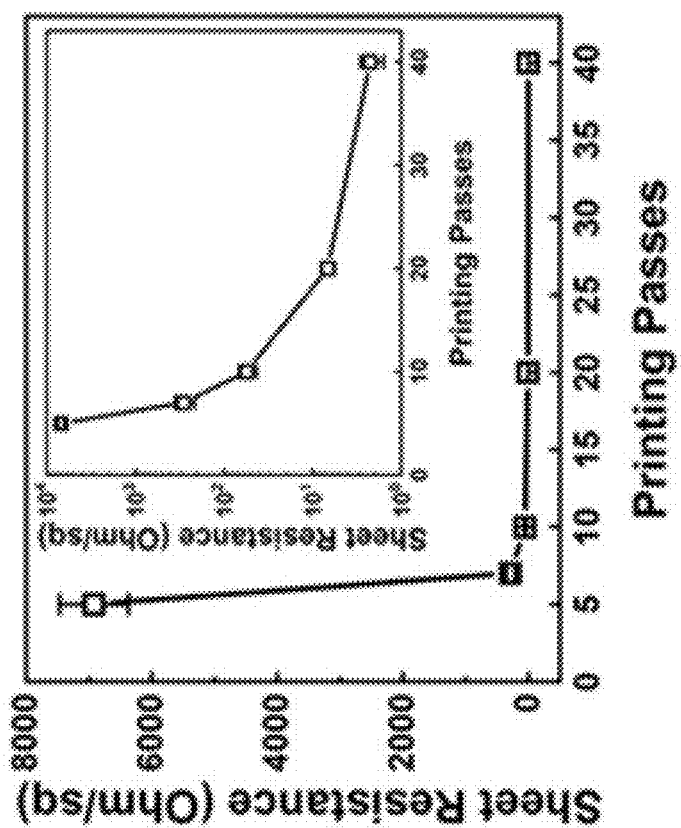
FIG. 3B
FIG. 3A

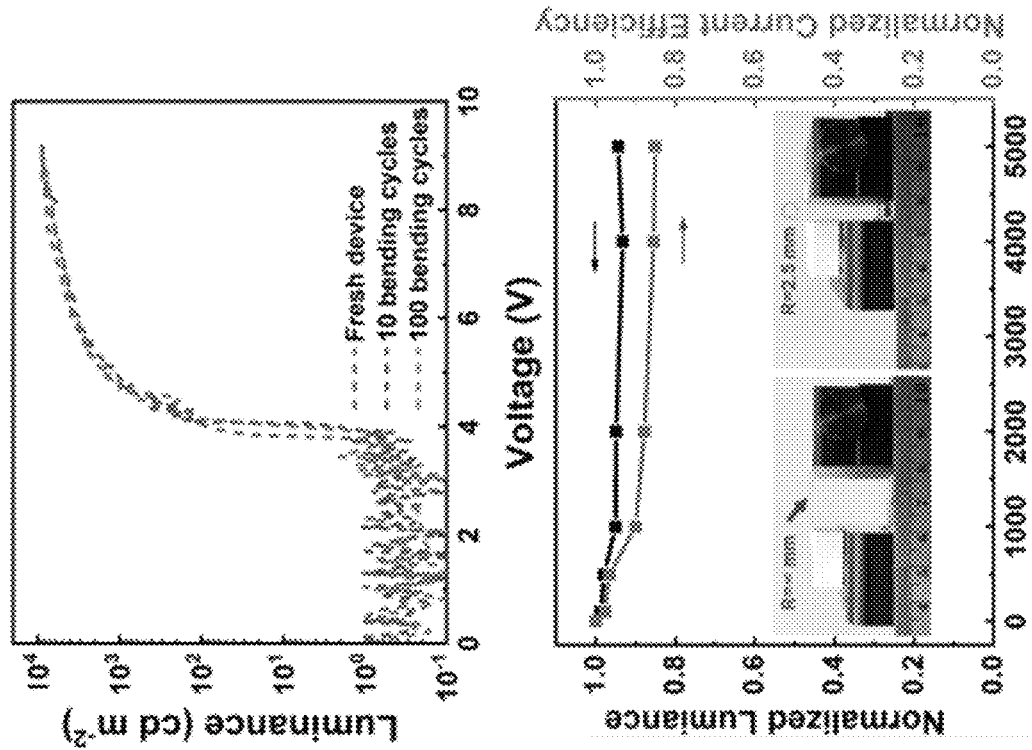
FIG. 5A
FIG. 5B
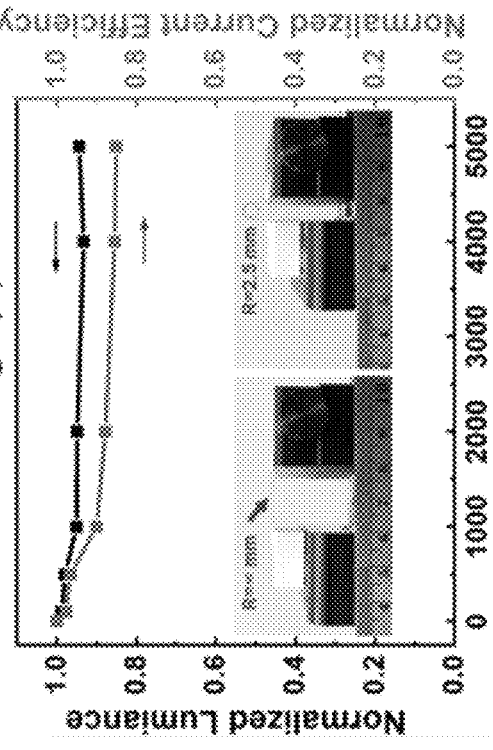
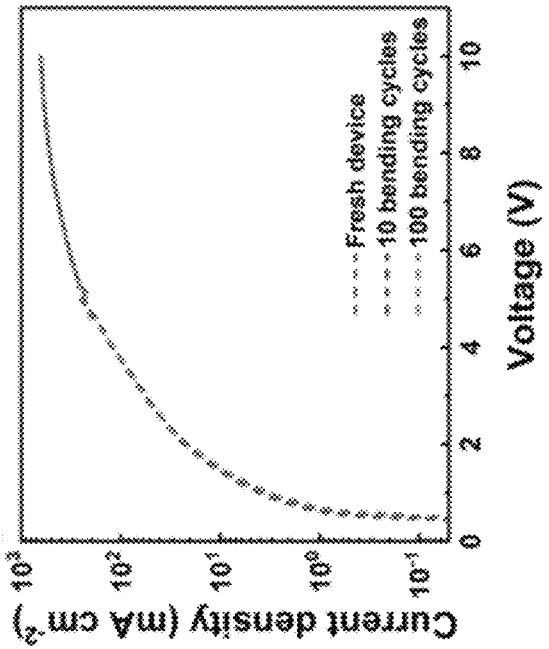
FIG. 5C
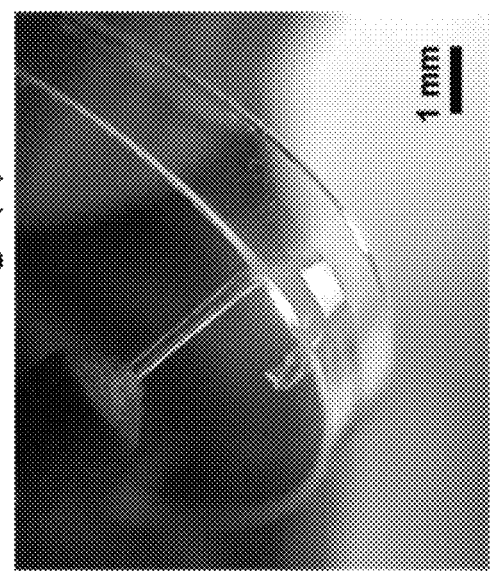
FIG. 5D

FIG. 16B
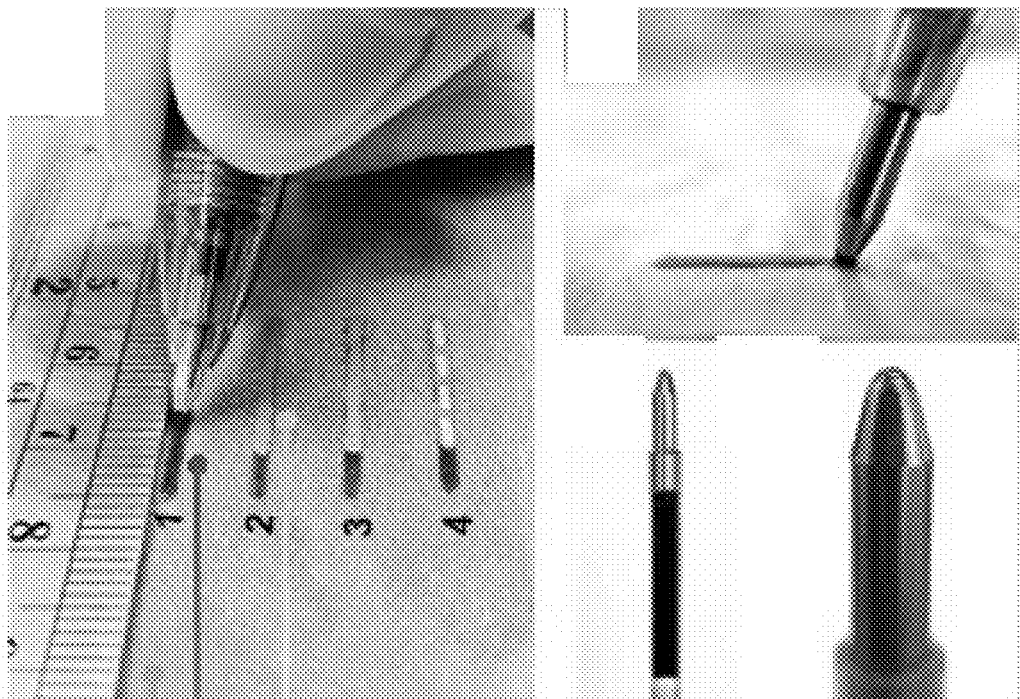
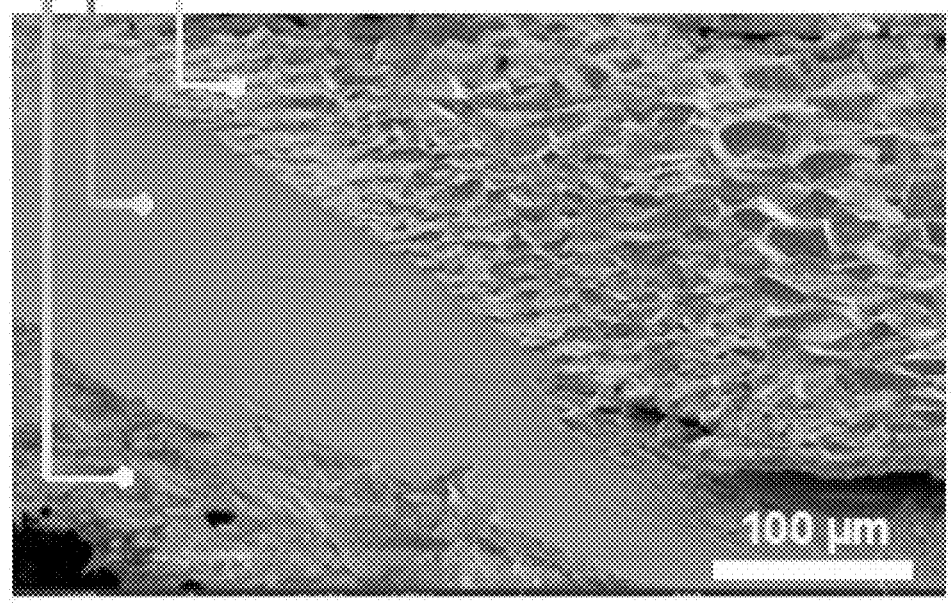
FIG. 16C

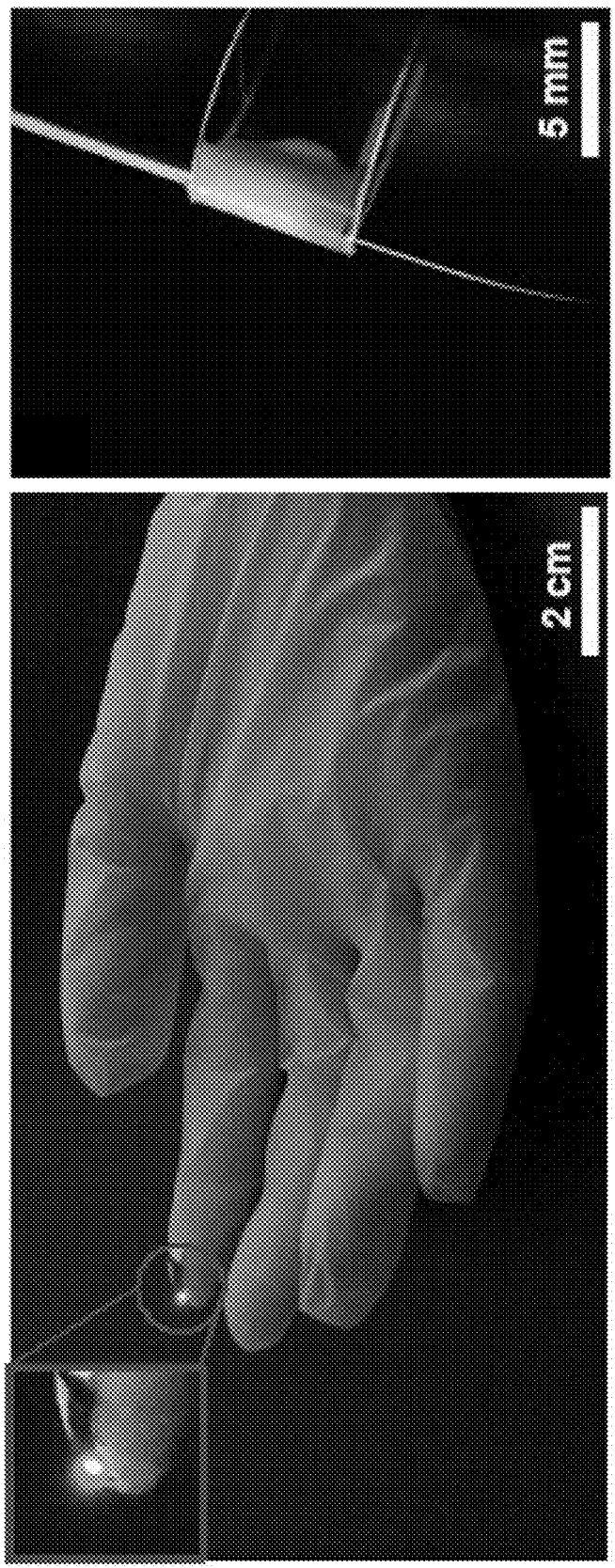

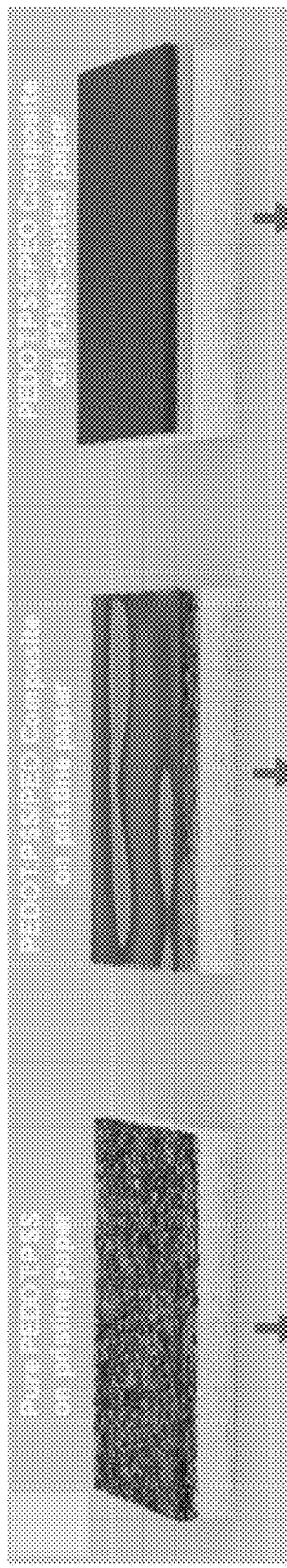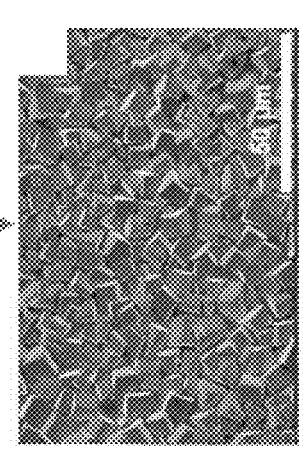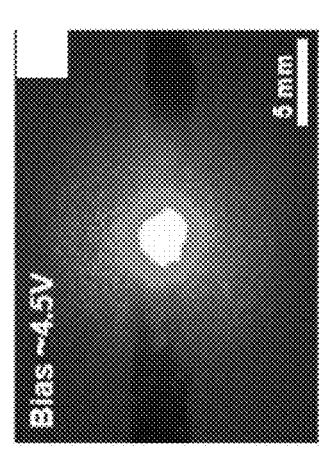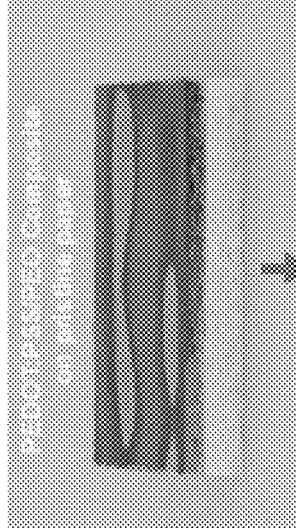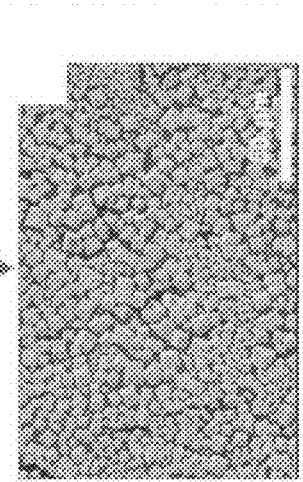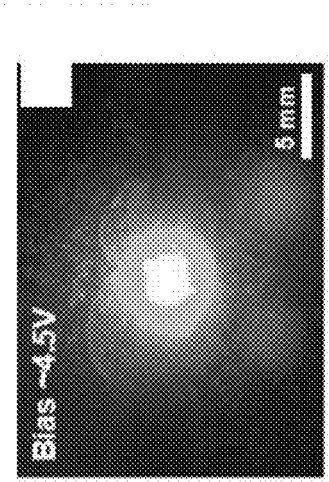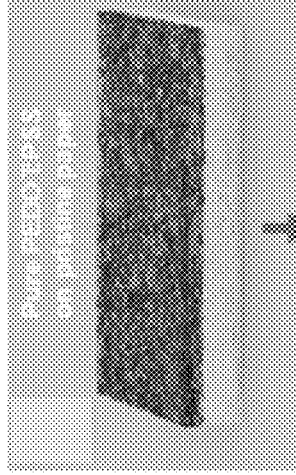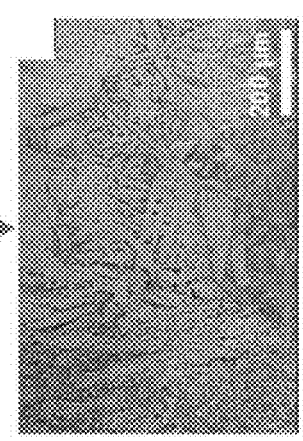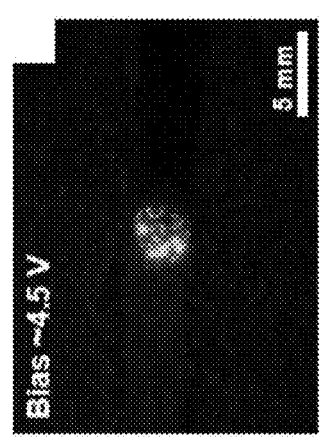
FIG. 19A  FIG. 19B  FIG. 19C  FIG. 19D

PEROVSKITE OPTOELECTRIC DEVICES AND METHODS OF PRODUCING PEROVSKITE OPTOELECTRIC DEVICES ON FLEXIBLE AND ELASTIC SUBSTRATES

CROSS-REFERENCE TO RELATED APPLICATIONS

This application claims priority from U.S. Provisional Application Ser. No. 63/249,021 filed on Sep. 27, 2021, which is incorporated herein by reference in its entirety.

STATEMENT REGARDING FEDERALLY SPONSORED RESEARCH OR DEVELOPMENT

Not applicable.

MATERIAL INCORPORATED-BY-REFERENCE

Not applicable.

FIELD OF THE DISCLOSURE

The present disclosure generally relates to organometallic halide perovskite optoelectric devices on flexible and elastic substrates and methods of fabricating the disclosed devices using ink-jet printing or handwriting methods.

BACKGROUND OF THE DISCLOSURE

Optoelectronic devices such as light-emitting diodes (LEDs) and photodetectors (PDs) have become crucial elements in emerging technologies such as flexible displays, human-machine interfaces, biomimetic image sensors, and wearable electronics. The mainstream methods used for depositing and patterning the functional layers and electrodes in these devices typically involve vacuum-based evaporation or sputtering, solution-based spin-coating, and etching. Despite offering great reproducibility and device performance, these conventional processes may be time- and energy-consuming, and the entire fabrication process flow for one batch of devices could take hours or days to complete, even without considering the time needed for stencil/mask design and manufacturing. For certain applications that demand large area substrates but with less stringent requirements on performance, printing techniques such as blade printing, bar coating, electrohydrodynamic printing, and inkjet printing have been widely studied recently as alternative methods for device fabrication. While those printing methods offer low-cost and scalable fabrication, they also have their own limitations such as the need for tedious alignment/calibration steps and weak patterning capability on nonplanar surfaces. Moreover, the ink wetting requirement generally limits the selection of substrates to rigid and flat glass or planar and smooth plastic or elastic thin-films. For emerging wearable and disposable electronics applications, there has been a growing demand for fabricating devices on substrates ubiquitous in daily life such as paper and textiles. While there has been some recent work reporting optoelectronic devices fabricated on paper and textile, nearly all still had the paper or textile coated by polymer for surface planarization instead of directly using unmodified ones that were easily accessible in daily life.

Organometal halide perovskites have sparked tremendous research interest owing to their exceptional potential for pervasive optoelectronic applications. These materials offer strong photoluminescence (PL) and electroluminescence (EL) emission, high carrier mobility, tunable optical bandgaps, and also superior solution processability, which have greatly facilitated the development of high-performance light-emitting diodes (LEDs) covering the full visible spectrum. Despite the steady improvements in quantum efficiency and device stability for perovskite LEDs (PeLEDs) over the past decade, there are still significant challenges related to the development of a more economical and time-efficient strategy for scalable fabrication of such devices in a flexible or stretchable form factor. If these challenges could be addressed, it could greatly benefit the application of PeLEDs in smart wearables and various portable electronics with flexible or stretchable displays.

As light-emitting and photoresponsive semiconductor materials, organomettallic halide perovskite has drawn a significant amount of interest as a middle ground between organic semiconductors and inorganic III-V materials, by providing a great tradeoff between performance, cost, solution processability, and scalability. Perovskite materials possess tunable bandgap, strong photoluminescence (PL) and electroluminescence (EL), and high absorption coefficients, making them ideal for next-generation light emitters and photo sensors. For example, the bandgap of perovskite can be adjusted by substituting the halide elements in $ABX_3$, where $X^-$ is $Cl^-$, $Br^-$, $I^-$, or a combination, allowing multicolor perovskite light-emitting diodes (PeLEDs) with desired emission wavelengths to be easily achieved for displays and lighting applications. There are also a variety of ways capable of further improving the performance and efficiency of perovskite optoelectronic devices, including lowering the material-level dimensionality from 3D perovskite to quasi-2D Ruddlesden-Popper perovskite (RPP); lowing the structure-level dimensionality from bulk to nanowires or nanocrystals, or blending polymer into solution-based perovskite to optimize crystallization process and film morphology. Despite the great promise of all those pioneering works on perovskite materials, most of the perovskite LEDs and PDs reported to date are based on spin coating or printing methods.

The most widely adopted procedure to produce a perovskite functional layer is to spin coat a pre-synthesized perovskite solution directly onto the substrate followed by thermal annealing to evaporate the residual solvents and promote the crystallization. Other emerging strategies include spray casting, solution evaporation, blade coating, electrohydrodynamic printing, and inkjet printing. Despite the fact that inkjet printing requires specially formulated printable ink, carefully tuned substrate wettability and ink rheology, and yields a relatively thick deposited film, the advantages of mask-free and high-resolution additive patterning make inkjet printing one of the most efficient fabrication strategies capable of satisfying the requirements for potential application scenarios in next-generation flexible displays. Inkjet printing techniques for the production of perovskite displays to date primarily focus on the patterning of just one or two layers, typically the top electrode, on a large unpatterned perovskite film prepared by a conventional fabrication process such as spin-coating, resulting in inefficient material utilization and a significant amount of active material being wasted. Additionally, these conventional coating and evaporation approaches have demonstrated limited utility for some centimeter-scale lighting panels or low-resolution patterning via time-consuming and costly stencils, which cannot satisfy the practical demands for high-resolution display panels composed of micro-scale lighting pixels and/or for customized pattern designs.

By using additive manufacturing strategies such as inkjet printing, the prepared ink can be precisely deposited at the desired location with accurate volume control at picoliter scales, resulting in an essentially zero-waste process that is capable of the actualization of high-resolution patterning and micro-scale LED arrays. Moreover, the inkjet printer can be further modified based on the demand for advanced and smart manufacturing. For instance, the substrate temperature during printing can be precisely controlled by using a thermoelectric heating pad to enable in situ sample annealing.

To date, PeLEDs fabricated using existing methods are generally not well-suited for use in applications requiring flexible materials, such as flexible displays. Pure perovskite polycrystalline films typically consist of tightly-packed nano- or micro-sized crystal grains, and typically possess relatively large Young's moduli, indicating that these films are poorly suited for reversibly bending or stretching without incurring significant damage. Moreover, existing PeLEDs are commonly constructed in a multilayer structure comprising an anode, a hole-injection layer, a light-emissive layer, an electron-injection layer, and a cathode. These layers are typically deposited on an indium-tin-oxide (ITO) glass substrate followed by an evaporated or sputtered metal top electrode. The use of such rigid substrates and brittle electrode materials further limits the mechanical flexibility of PeLEDs. To make PeLEDs that are mechanically flexible or even stretchable, a recent approach embeds perovskite microcrystals into a polymer matrix, where the polymer serves as an elastic connector to hold the brittle perovskite crystals together.

In addition, prospective flexible electrodes that can withstand deformation have recently been described using materials including sputtered metal/oxide multilayered structures, eutectic indium-gallium (ElnGa), thin films of one-dimensional nanomaterials such as carbon nanotubes, and silver nanowires (AgNWs). Among these prospective electrode materials, AgNW thin film offers high conductivity, excellent optical transparency, stretchable network structure, and the ability to be solution-processed on flexible substrates using methods such as spin-coating, spraying, screen printing, and inkjet printing. However, direct printing of such electrode materials on top of the perovskite films still poses great challenges because the perovskite films are vulnerable to attack by the solvents in the aforementioned conductive inks. In addition, these electrode materials may also result in a work function mismatch with the underlying perovskite film. Additional materials, including aliphatic amine polymers such as polyethyleneimine (PEI), have been described as potentially effective for use as a protective buffer layer between the perovskite film and electrode layer.

SUMMARY OF THE DISCLOSURE

In various aspects, a photoelectronic device is disclosed that includes a substrate, a first electrode, a photoactive layer, and a second electrode. The substrate includes any one of PDMS-coated glass, PDMS-coated PET, PDMS-coated paper, PDMS-coated textile, vinyl, latex, or metal foil. The first electrode includes polyethylene oxide (PEO)-modified poly(3,4-ethylenedioxythiophene) polystyrene sulfonate (PEO-modified PEDOT:PSS), wherein the PEO-modified PEDOT:PSS includes up to about 70 wt % of the PEO. The photoactive layer includes perovskite microcrystals embedded in a polymer matrix, wherein the perovskite microcrystals include $MAPbBr_3$, $MAPb(Cl_{1-x}Br_x)_3$, $MAPb(BrxI_{1-x})_3$, quasi-2D $BA_2(MAPbI_3)_{n-1} PbI_4$, and any combination thereof. The polymer matrix includes PEO, PS, PMMA, and any combination thereof. The second electrode includes a silver nanowire (AgNW) network. In some aspects, the first electrode, the photoactive layer, and the second electrode are formed from ink compositions applied by a printing device or a handwriting device; the printing device includes an inkjet printer or a microplotter and the handwriting device includes a pen.

In some aspects, the photoelectronic device is a vertical photoconductor that includes the first electrode positioned over the substrate, the photoactive layer positioned over the first electrode, and the second electrode positioned over the photoactive layer. The first electrode includes the PEO-modified PEDOT:PSS with about 30% wt of PEO. The photoactive layer includes the $MAPbBr_3$ perovskite crystals embedded in a PMMA polymer matrix. The second electrode includes the silver nanowire (AgNW) network.

In some aspects, the photoelectronic device is a horizontal photoconductor that includes the first electrode positioned over the substrate, the second electrode positioned over the substrate and separated from the first electrode to define a gap, and the photoactive layer positioned over the first electrode and the second electrode within the gap. The first electrode includes the PEO-modified PEDOT:PSS with about 30% wt of PEO. The second electrode includes the silver nanowire (AgNW) network. The photoactive layer includes the $MAPbBr_3$ perovskite crystals embedded in a PMMA polymer matrix.

In some aspects, the photoelectronic device is an LED that includes the first electrode positioned over the substrate, the photoactive layer positioned over the first electrode, a buffer layer positioned over the photoactive layer, and the second electrode positioned over the buffer layer. The first electrode includes the PEO-modified PEDOT:PSS with about 30% wt of PEO. The photoactive layer includes the perovskite microcrystals embedded in the polymer matrix, wherein the perovskite microcrystals include $MAPb(Cl_{1-x}Br_x)_3$, $MAPb(BrxI_{1-x})_3$, quasi-2D $BA_2(MAPbI_3)_{n-1} PbI_4$, and any combination thereof and the polymer matrix includes PEO, PS, PMMA, and any combination thereof. The buffer layer includes polyethyleneimine (PEI). The second electrode includes the silver nanowire (AgNW) network. In some aspects, the photoactive layer includes a $MAPbBr_3$/PEO composite.

In another aspect, an ink-based method of fabricating a photoelectronic device on a substrate is disclosed that includes providing the substrate; providing a first electrode ink, a photoactive layer ink, and a second electrode ink; and applying the first electrode ink, the photoactive layer ink, and the second electrode ink to produce the photoelectronic device. The substrate includes any one of PDMS-coated glass, PDMS-coated PET, PDMS-coated paper, PDMS-coated textile, vinyl, latex, or metal foil. The first electrode ink, the photoactive layer ink, and the second electrode ink are applied using a printing device or a handwriting device; the printing device includes an inkjet printer or a microplotter and the handwriting device includes a pen. In some aspects, providing the first electrode ink further comprises providing a mixture of PEDOT:PSS ink and a PEO solution, in which the mixture includes up to about 70 wt % of the PEO solution, the PEDOT:PSS ink includes an aqueous mixture of PEDOT:PSS, ethylene glycol, and Triton X-100 with a volume ratio of 100:5: 1, and the PEO solution includes PEO dissolved in DMF. In some aspects, providing the photoactive layer ink further includes providing a mixture of perovskite ink and a polymer at a perovskite: polymer weight ratio of 2:1. The perovskite ink includes a 1 M mixture of the perovskite in a solvent selected from anhydrous DMF, anhydrous DMSO and any combination thereof. The perovskite includes $MAPbBr_3$, $MAPbCl_3$, $MAPbI_3$, and any combination thereof, and the polymer includes PEO, PS, PMMA, and any combination thereof. In some aspects, providing the second electrode ink further includes providing a mixture of an AgNW dispersion in 20 vol % ethylene glycol.

In some aspects, the photoelectronic device is a vertical photoconductor, and applying the first electrode ink, the photoactive layer ink, and the second electrode ink to produce the photoelectronic device further includes applying the first electrode ink over the substrate and curing to form the first electrode on the substrate, applying the photoactive layer ink over the first electrode and curing to form the photoactive layer positioned over the first electrode, and applying the second electrode ink over the photoactive layer and curing to form the second electrode positioned over the photoactive layer. The first electrode includes the PEO-modified PEDOT:PSS with about 30% wt of PEO. The photoactive layer includes the $MAPbBr_3$ perovskite crystals embedded in a PMMA polymer matrix. The second electrode includes the silver nanowire (AgNW) network.

In some aspects, the photoelectronic device is a horizontal photoconductor, and applying the first electrode ink, the photoactive layer ink, and the second electrode ink to produce the photoelectronic device further includes applying the first electrode ink over the substrate and curing to form the first electrode on the substrate, applying the second electrode ink over the substrate and curing to form the second electrode positioned over the substrate, wherein the second electrode is separated from the first electrode to define a gap, and applying the photoactive layer ink over the first electrode and the second electrode within the gap and curing to form the photoactive layer. The first electrode includes the PEO-modified PEDOT:PSS with about 30% wt of PEO. The second electrode includes the silver nanowire (AgNW) network. The photoactive layer includes the $MAPbBr_3$ perovskite crystals embedded in a PMMA polymer matrix.

In some aspects, the photoelectronic device is an LED, and applying the first electrode ink, the photoactive layer ink, and the second electrode ink to produce the photoelectronic device further includes applying the first electrode ink over the substrate and curing to form the first electrode positioned over the substrate, applying the photoactive layer ink over the first electrode and curing to form the photoactive layer positioned over the first electrode, applying a buffer layer ink over the photoactive layer and curing to form a buffer layer positioned over the photoactive layer, and applying the second electrode ink over the buffer layer and curing to form the second electrode over the buffer layer. The first electrode includes PEO-modified PEDOT:PSS with about 30% wt of PEO. The photoactive layer includes the perovskite microcrystals embedded in a polymer matrix, wherein the perovskite microcrystals include $MAPb(Cl_{1-x}Br_x)_3$, $MAPb(BrxI_{1-x})_3$, quasi-2D $BA_2(MAPbI_3)_{n-1}$ $PbI_4$, and any combination thereof and the polymer matrix includes PEO. The buffer layer ink includes a solution of about 20 mg/ml of polyethyleneimine (PEI) dissolved in an IPA solvent. The second electrode includes the silver nanowire (AgNW) network. In some aspects, the photoactive layer includes $MAPbBr_3$ perovskite microcrystals embedded in the PEO polymer matrix. In some aspects, providing the perovskite ink further includes mixing a 1M solution of $MAPbBr_3$ in anhydrous DMF and a 1M solution of $MAPbI_3$ in anhydrous DMF in a molar ratio selected to form a 1M solution of $MAPb(BrxI_{1-x})_3$; mixing a 1M solution of $MAPbBr_3$ in anhydrous DMF and a 1M solution of $MAPbCl_3$ in anhydrous DMSO in a molar ratio selected to form a 1M solution of $MAPb(Cl_{1-x}Br_x)_3$; or mixing a 1M solution of $MAPbI_3$ in anhydrous DMF with a 0.5M solution of n-butylammonium iodide (BAI) in anhydrous DMF in a molar ratio selected to form a solution of quasi-2D $BA_2(MAPbI_3)_{n-1}$ $PbI_4$ in anhydrous DMF. In some aspects, providing the perovskite ink further includes selecting one of the 1M solution of $MAPb(BrxI_{1-x})_3$, the 1M solution of $MAPb(Cl_{1-x}Br_x)_3$, or the solution of quasi-2D $BA_2(MAPbI_3)_{n-1}PbI_4$, wherein the selected perovskite ink is configured to produce light comprising a predetermined wavelength spectrum. In some aspects, providing the mixture of PEDOT:PSS ink and the PEO solution further includes preparing a PEDOT:PSS precursor by mixing aqueous PEDOT:PSS, ethylene glycol, and Triton X-100 with a volume ratio of 100:5: 1; preparing a PEO solution by dissolving PEO in DMF with a concentration of 10 mg/ml at a temperature of about 60° C.; and mixing the PEDOT:PSS precursor and the PEO solution at a weight ratio of 100:35 to form the mixture of the PEDOT:PSS ink and the PEO solution. In some aspects, applying and curing the first electrode ink further includes curing at a temperature of about 90° C. In some aspects, applying and curing the photoactive layer ink further includes curing at a temperature ranging from about 25° C. to about 80° C. In some aspects, applying and curing the second electrode ink further includes curing at a temperature of about 90° C. In some aspects, providing a first electrode ink, a photoactive layer ink, and a second electrode ink further includes loading the first electrode ink, the photoactive layer ink, and the second electrode ink into separate pens. In some aspects, applying the first electrode ink, the photoactive layer ink, and the second electrode ink further includes handwriting the first electrode ink, the photoactive layer ink, and the second electrode ink in predetermined patterns using the separate pens.

Other objects and features will be in part apparent and in part pointed out hereinafter.

DESCRIPTION OF THE DRAWINGS

FIG. 3A is a graph of the sheet resistance of the printed AgNW thin-film as a function of the number of printing passes; the inset graph presents the same data on semi-logarithmic axes.

FIG. 3B is a graph of the sheet resistance of the AgNW networks printed on PEI/PDMS substrates (10 printing passes) as a function of the amount of EG additive in the AgNW dispersion; inset drawings illustrate the evolution of contact angles between the AgNWs/EG mixed ink droplet and substrate with increasing EG volume ratio.

FIG. 5A is a graph comparing current density versus voltage characteristics before and after being bent for up to 100 cycles.

FIG. 5B is a graph comparing luminance versus voltage characteristics before and after being bent for up to 100 cycles.

FIG. 5C is a photograph of a PeLED fabricated on a flexible PDMS substrate while lit and bent to a curvature radius of 3.5 mm.

FIG. 5D is a graph comparing normalized luminance and current efficiency measured after 5000 bending cycles with a curvature radius of 2.5 mm; inset images show the experimental setup for the bending test at pristine and bending states.

FIG. 16B contains a series of images illustrating various steps to write a PeLED layer by layer on office paper substrate using a commercial ballpoint pen, including (left) writing the PEDOT:PSS bottom electrode; (upper right) writing the perovskite emissive layer; (lower right) writing the PEI buffer layer; and (bottom) writing the AgNW top electrode.

FIG. 16C contains an isometric-view SEM image of a representative handwritten PeLED on a paper substrate.

FIG. 17A contains an image of the EL of PeLEDs drawn on a vinyl glove with the PeLED powered by a coin-cell battery.

FIG. 17B contains an image of the EL of PeLEDs drawn on a folded PET film with the PeLED powered by a coin-cell battery.

FIG. 19A is a schematic illustration showing how the PEO additive in the PEDOT:PSS ink helps encapsulate and planarize the percolating cellulose fibers of pristine office paper substrates, resulting in a surface morphology similar to PDMS-coated paper substrate.

FIG. 19B is an SEM image (top) and photograph (bottom) of a lit PeLED under a 4.5 V bias voltage; the PeLED consisted of a perovskite thin-film deposited on top of the bottom-electrode of the left-most paper substrate of FIG. 19A.

FIG. 19C is an SEM image (top) and photograph (bottom) of a lit PeLED under a 4.5 V bias voltage; the PeLED consisted of a perovskite thin-film deposited on top of the bottom-electrode of the center paper substrate of FIG. 19A.

FIG. 19D is an SEM image (top) and photograph (bottom) of a lit PeLED under a 4.5 V bias voltage; the PeLED consisted of a perovskite thin-film deposited on top of the bottom-electrode of the right-most paper substrate of FIG. 19A.

Figure 1A:
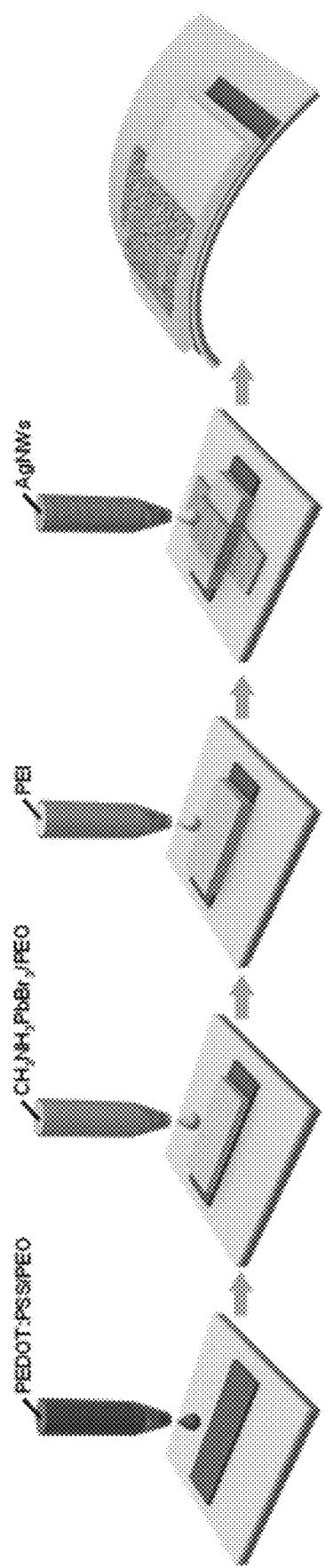
FIG. 1C is an optical micrograph image of a PeLED prepared using the disclosed method in one aspect on PDMS/glass substrate when viewed from the top AgNW cathode side.
FIG. 1D is an optical micrograph image of a PeLED prepared using the disclosed method in one aspect on PDMS/glass substrate when viewed from the bottom PEDOT:PSS/PEO anode side.
FIG. 1E is a photograph of a lit PeLED with an applied voltage of around 4.5 V.
FIG. 1F is a photograph of a printed PeLED display prototype showing "WUSTL" characters before coupling to a power source.
FIG. 1G is a photograph of a printed PeLED display prototype showing illuminated "WUSTL" characters after coupling to a power source with a 3.5 V bias to induce green light emission.
FIG. 1H is a top-view SEM image of a perovskite/PEO composite (1:1) emissive layer printed onto a PEDOT:PSS-PEO film.
FIG. 1I is a cross-sectional view SEM image of the (PEDOT:PSS/PEO)/(perovskite/PEO)/PEI/AgNWs sandwich structure printed onto a Si/SiO2 substrate.
FIG. 1J is a top-view SEM image of the AgNW top electrode of the sandwich structure of FIG. 1I.

Those of skill in the art will understand that the drawings, described below, are for illustrative purposes only. The drawings are not intended to limit the scope of the present teachings in any way.

DETAILED DESCRIPTION

Although considerable efforts and progress have been made to explore the potential of using halide perovskites in high-performance light-emitting diodes (LEDs), existing fabrication techniques based on layering on rigid substrates cannot meet the growing demand for the production of LEDs for large area flexible displays. In various aspects, devices and fabrication methods are disclosed herein that produce flexible perovskite LEDs (PeLEDs) on a variety of different flexible substrates.

In various aspects, a flexible PeLED device is disclosed that includes a flexible substrate; a transparent anode positioned over the flexible substrate; an emissive layer comprising perovskite microcrystals embedded in a polymer matrix, a buffer layer positioned over the emissive layer; and a cathode positioned over the buffer layer. In some aspects, the flexible substrate comprises PDMS on a glass or PET support layer. In some aspects, the transparent anode comprises polyethylene oxide (PEO)-modified poly(3,4-ethylenedioxythiophene) polystyrene sulfonate (PEDOT:PSS). In some aspects, the PEDOT:PSS comprises a blending ratio of about 35 vol % of PEO. In some aspects, the emissive layer comprises a methylammonium lead tribromide ($CH_3NH_3PbBr_3$)/PEO composite. In some aspects, the buffer layer comprises polyethyleneimine (PEI). In some aspects, the cathode comprises a silver nanowire (AgNW) network. In some aspects, the transparent anode, the emitting layer, the buffer layer, and the cathode are all fabricated using a printing device. In some aspects, the printing device is an inkjet printer or a microplotter.

In another aspect, a printer-based method of fabricating a PeLED device on a flexible substrate is disclosed that includes providing the flexible substrate; printing, using a printing device, an anode ink onto the flexible substrate to form a transparent anode; printing, using the printing device, perovskite ink over the transparent anode layer to form the emissive layer; printing, using the printing device, a buffer polymer ink over the emissive layer to form a buffer layer; and printing, using the printing device, a cathode ink over the buffer layer to form a cathode. In some aspects, providing the flexible substrate further comprises providing a PDMS layer on a glass or flexible polyethylene terephthalate support. In some aspects, printing the anode ink further comprises providing the anode ink comprising a polyethylene oxide (PEO)-modified poly(3,4-ethylenedioxythiophene) polystyrene sulfonate (PEDOT:PSS) composite ink. In some aspects, providing the anode ink further comprises preparing a PEDOT:PSS precursor by mixing aqueous PEDOT:PSS, ethylene glycol, and Triton X-100 with a volume ratio of 100:5: 1; preparing a PEO solution by dissolving PEO in DMF with a concentration of 10 mg/ml at 60° C.; and mixing the PEDOT:PSS precursor and the PEO solution at a weight ratio of 100:35 to form the anode ink. In some aspects, printing the anode ink further comprises printing on the flexible substrate in a predesigned anode pattern and annealing the transparent anode onsite at a temperature of about 90° C. to remove all solvents. In some aspects, printing the perovskite ink comprises providing the perovskite ink comprising a methylammonium lead tribromide ($CH_3NH_3PbBr_3$)/PEO composite ink. In some aspects, providing the ($CH_3NH_3PbBr_3$)/PEO composite ink comprises: mixing a $PbBr_2$ precursor and a $CH_3NH_3PbBr$ precursor at a molar ratio of 1:1.5 and then dissolving the precursor mixture at a concentration of 500 mg/ml in anhydrous DMSO at 70° C. to form a $CH_3NH_3PbBr_3$ precursor; dissolving poly(ethylene oxide) at a concentration of 10 mg/ml in DMF at 60° C. to form a PEO solution; mixing the $CH_3NH_3PbBr_3$ precursor and the PEO solution at a weight ratio of 1:1 at a temperature of 70° C. to produce the perovskite ink. In some aspects, printing the perovskite ink comprises printing on the transparent anode in a predesigned emissive pattern and annealing the emissive layer onsite at a temperature ranging from about 25° C. to about 80° C. In some aspects, annealing the emissive layer onsite comprises annealing at a temperature of about 65° C.

In some aspects, printing the buffer polymer ink comprises providing the buffer polymer ink comprising a polyethyleneimine (PEI) ink. In some aspects, providing the buffer polymer ink comprises dissolving branched PEI into an isopropyl alcohol (IPA) solvent at a concentration ranging from about 10 mg/mL to about 40 mg/mL to produce the buffer polymer ink. In some aspects, dissolving the branched PEI into isopropyl alcohol (IPA) comprises dissolving the branched PEI into isopropyl alcohol (IPA) at a concentration of about 20 mg/mL. In some aspects, printing the buffer polymer ink comprises printing the buffer polymer ink in a predetermined buffer pattern on the emissive layer at a temperature of about 80° C. to immediately evaporate the IPA solvent. In some aspects, printing the cathode ink further comprises providing the cathode ink comprising a silver nanowire (AgNW) ink. In some aspects, providing the cathode ink comprises mixing an AgNW dispersion in IPA with an amount of ethylene glycol (EG) ranging from 0% vol % to about 50 vol % to produce the cathode ink. In some aspects, providing the cathode ink comprises mixing about 80 vol % of the AgNW dispersion with about 20 vol % of the ethylene glycol (EG) to produce the cathode ink. In some aspects, printing the cathode ink further comprises printing the cathode ink in a predetermined cathode pattern on the buffer layer at a temperature of about 90° C. to immediately evaporate the IPA solvent from the cathode ink. In some aspects, the method is implemented within an ambient atmosphere with a humidity of about 40%. In some aspects, printing, using the printing device further comprises printing, using a printing device comprising an inkjet printer or a microplotter. In some aspects, printing, using the printing device further comprises printing at a resolution of about 250 µm.

In various aspects, flexible perovskite LED (PeLED) devices and methods of producing the PeLED devices using inkjet printing methods are disclosed. In some aspects, the PeLED device is a 4-layer structure comprising a transparent anode comprising polyethylene oxide (PEO)-modified poly (3,4-ethylenedioxythiophene) polystyrene sulfonate (PEDOT:PSS), a light-emitting layer comprising a methylammonium lead tribromide $CH_3NH_3PbBr_3$/PEO composite thin film, a buffer layer comprising PEI, and a top cathode comprising an AgNW network.

In various aspects, printing the cathode ink includes producing the silver nanowire (AgNW) ink by mixing an AgNW dispersion in an IPA solvent with an amount of ethylene glycol (EG) ranging from 0 vol % to about 50 vol %. In various other aspects, printing the cathode ink includes producing the silver nanowire (AgNW) ink by mixing an AgNW dispersion in an IPA solvent with an amount of ethylene glycol (EG) ranging from about 0 vol % to about 10 vol %, from about 5% to about 15%, from about 10 vol % to about 20 vol %, from about 15 vol % to about 25 vol %, from about 20 vol % to about 30 vol %, from about 25 vol % to 35 vol %, from about 30 vol % to 40 vol %, from about 35 vol % to 45 vol %, and from about 40 vol % to 50 vol %.

In various aspects, the PeLED devices are fabricated directly on an elastomer substrate using the methods disclosed herein, in which the PeLED device from bottom anode to top cathode is patterned solely using a highly scalable inkjet printing process. Compared to PeLEDs made using conventional microfabrication processes, the disclosed printer-based printing method significantly shortens the fabrication time by at least ten-fold (from over 5 hours to less than 25 minutes). As disclosed above, the inkjet-printed PeLEDs have a 4-layer structure (bottom electrode, perovskite emissive layer, buffer layer, top electrode) without separate electron or hole transporting layers. In some aspects, the polymer buffer layer of polyethyleneimine (PEI) was adopted to adjust the work function and to protect the perovskite layer from being attacked by the solvents of the electrode ink formulation used during top electrode printing. As described in the examples below, the flexible PeLEDs printed directly in ambient conditions achieved a turn-on voltage, maximum luminance intensity, and maximum current efficiency of 3.46 V, 10227 $cd/m^2$, and 2.01 cd/A, respectively. The PeLED devices exhibited excellent robustness and stability even when bent to a curvature radius of 2.5 mm. In various aspects, the PeLED device's structure and fabrication process as described herein are compatible with the large-scale manufacture of high-performance flexible PeLEDs over larger areas relative to existing fabrication techniques at extremely low cost and fast speed, which potentially facilitates the adoption of the PeLED technology into the design of the emerging foldable displays, smart wearables, and many other applications.

In various aspects, printer-based fabrication methods are disclosed, in which all layers of the devices are directly printed onto an elastomer substrate using inkjet printing under a variety of conditions including, but not limited to, ambient atmospheric conditions. As described in the examples below, the rheological behaviors, viscosity, wetting, and uniformity of each type of ink used to fabricate each layer of the disclosed PeLED devices were systematically evaluated and optimized to achieve optimal printing outcomes on the elastic substrates. The examples below further describe the protective function of the interfacial polymer layer of branched PEI to protect the perovskite crystals from being attacked and eroded by the solvents contained in the AgNW ink used to form the top cathode layer as well as the effect of PEI on lowering the barrier for electron injection. Moreover, because all printed layers are soft and deformable, the printed PeLEDs on polydimethylsiloxane (PDMS)/polyethylene terephthalate (PET) substrates exhibited good flexibility and can be repeatedly bent to a curvature radius of 2.5 mm or less over thousands of cycles without exhibiting any noticeable performance decay. Despite the fact that the disclosed PeLEDs were fabricated entirely in ambient conditions with a simple structure, outstanding performances were achieved with a turn-on voltage of 3.46 V, a maximum luminance intensity of 10227 $cd/m^2$, and a maximum current efficiency of 2.01 cd/A. Additionally, the cumulative time it takes to complete the entire fabrication process is significantly reduced due to the simplified 4-layer device structure, an all-solution-based and fully-printed process, a simultaneous annealing approach, and programmed automatic trajectory control of the inkjet fabrication device. Usually, for conventional fabrication processes, at least 4-5 hours are necessary to fabricate one batch of micro-scale PeLED samples via conventional spin coating, post-treatment, and metal electrode evaporation, even without considering the time of preparing indium-tin-oxide substrates and patterning stencils. In comparison, using the disclosed printer-based process, a batch of similar PeLEDs (ten 500×500 µm2 light-emissive squares) may be completed from bottom-electrode to top-electrode within about 25 min. The disclosed ink formulations, device structure, and printing processes enable highly scalable and low-cost fabrication of high-performance flexible PeLEDs for a variety of applications in display and wearable electronics.

In various aspects, a flexible halide perovskite LED fabricated entirely by highly efficient inkjet printing processes on elastic substrates is disclosed. The PeLED device has a simple 4-layer sandwich structure with a PEDOT:PSS/PEO transparent bottom electrode, a $CH_3NH_3PbBr_3$/PEO composite emissive layer, a PEI buffer layer, and an AgNW top electrode. The ink formulations used to fabricate the four layers have been systematically studied and optimized for optimal printing outcomes, as described in the examples. Moreover, by employing a PEI buffer layer in between the perovskite film and the top electrode, the perovskite emissive layer is effectively protected from the solvents in subsequent printing steps, which helps improve the device yield and performance. In some aspects, the PEI buffer layer further provides for the operation of the PeLED devices in ambient environmental conditions for extended periods with minimal degradation of performance.

In various aspects, providing the buffer polymer ink includes producing the polyethyleneimine (PEI) ink by dissolving a branched PEI into an isopropyl alcohol (IPA) solvent at a concentration ranging from about 10 mg/mL to about 40 mg/mL. In various other aspects, providing the buffer polymer ink includes producing the polyethyleneimine (PEI) ink by dissolving a branched PEI into an isopropyl alcohol (IPA) solvent at a concentration ranging from about 10 mg/mL to about 20 mg/mL, from about 15 mg/mL to about 25 mg/mL, from about 20 mg/mL to about 30 mg/mL, from about 25 mg/mL to about 35 mg/mL, and from about 30 mg/mL to about 40 mg/mL.

In one aspect, PeLEDs produced using the disclosed printer-based fabrication method have a low turn-on voltage of about 3.46 V, a maximum brightness of about 10227 cd/m$^2$, a favorable current efficiency of about 2.01 cd/A, and are robust to bending cycles without any noticeable performance degradation. These key performance metrics are largely competitive or even superior to other reported flexible PeLEDs (see Table 2 below). The ink formulations and fabrication strategies provide for low-cost and scalable manufacturing of perovskite optoelectronic devices for emerging applications.

Figure 6A:
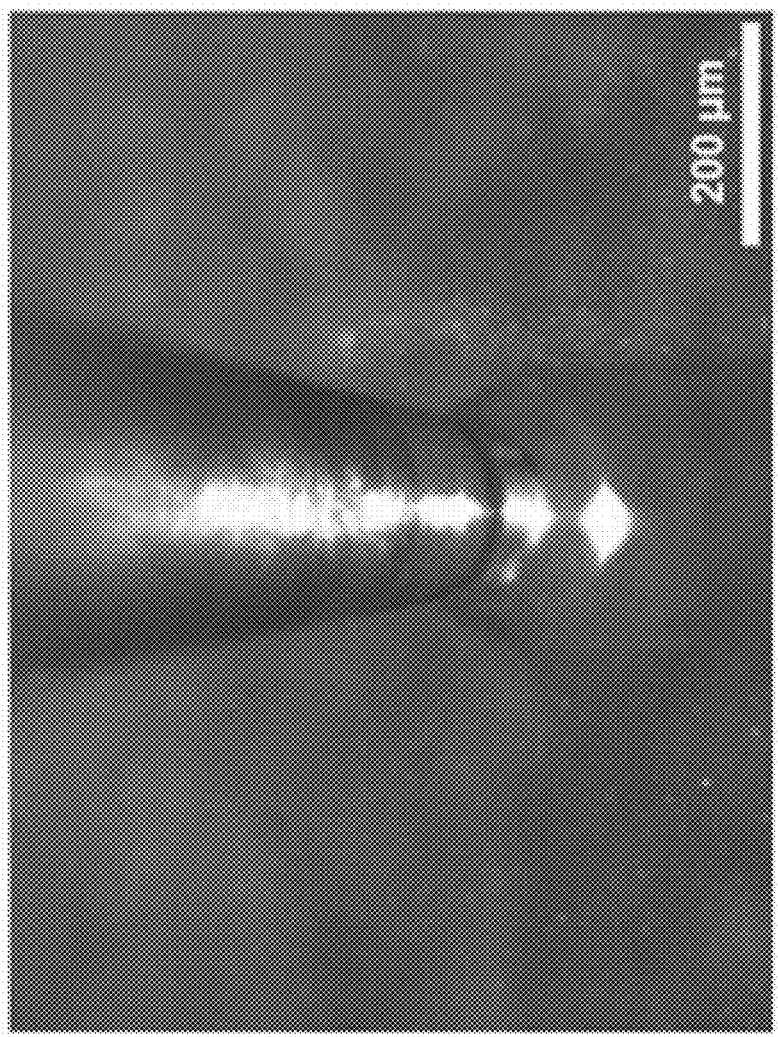
FIG. 6A is an optical micrograph of a printing nozzle filled with $CH_3NH_3PbBr_3$/PEO composite ink during the printing process.
Figure 6B:
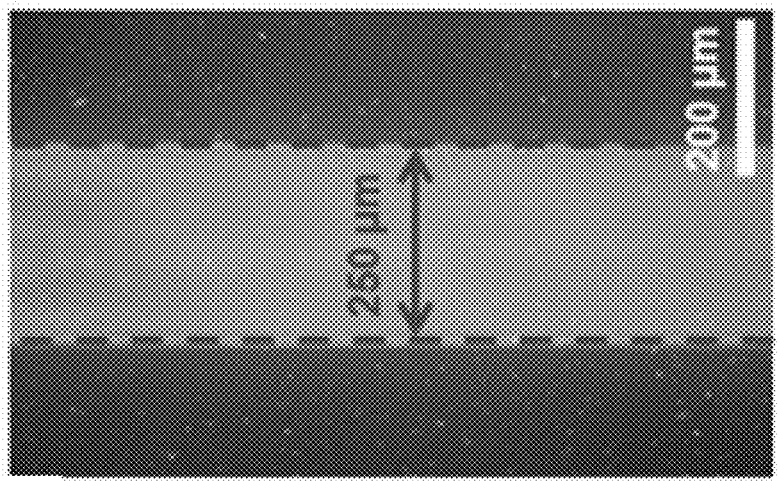
FIG. 6B is an optical micrograph of the printed perovskite printing path with a resolution of 250 μm.

In some aspects, the quality of the luminous pattern is influenced by at least one of a variety of factors including, but not limited to, the flatness of the substrate, the configuration of the nozzle-movement controlling software configured to generate a smoother and steadier running in the automatic printing mode. In other aspects, the resolution of the printed display depends on at least one of a variety of factors including, but not limited to, the diameter of the ink dispenser used, the viscosity of the printable ink, and the wetting of the ink on the substrate. Without being limited to any particular theory, more viscous inks typically require a relatively large nozzle size to form a continuous liquid meniscus that can be dragged around smoothly. In some aspects, for the $CH_3NH_3PbBr_3$/PEO composite ink formulation described herein, under optimized printing conditions, a patterning resolution of about 250 µm (FIG. 6) can be achieved reliably.

In various aspects, the perovskite precursor solution is mixed with polymer PEO, where the active components crystallize and grow in the polymer matrix during the annealing process, thereby producing a perovskite emissive layer that is compatible with flexible electronics. In various aspects, the micro-scale perovskite crystals are embedded uniformly and tightly into the polymer binder, and the polymer binder further functions as an elastomeric connector for intrinsically stretchable PeLEDs.

In existing fabrication methods, an annealing step is used to form the perovskite crystals that is normally performed separately after the film-forming processes such as spin-coating, drop-casting, or screen-printing. In various aspects, the disclosed printer-based fabrication method includes simultaneous annealing during the ongoing $CH_3NH_3PbBr_3$/PEO film printing process that assists the generation of perovskite nuclei by expediting the removal of residual solvent from the $CH_3NH_3PbBr_3$/PEO ink. Assisted by this on-site simultaneous annealing strategy, there is no need to adopt any further annealing post-treatment so that the manufacturing process is significantly simplified, and the duration is greatly shortened. In various aspects, the simultaneous printing and annealing of the $CH_3NH_3PbBr_3$/PEO light-emitting layer and optionally of the other layers may be performed by placing the substrate on a heating stage with a precisely controlled temperature during printing.

In various aspects, the emissive layer may be annealed onsite at a temperature ranging from about 25° C. to about 80° C. In various other aspects, the emissive layer may be annealed onsite at a temperature ranging from about 25° C. to about 35° C., from about 30° C. to about 40° C., from about 35° C. to about 45° C., from about 40° C. to about 50° C., from about 45° C. to about 55° C., from about 50° C. to about 60° C., from about 55° C. to about 65° C., from about 60° C. to about 70° C., from about 65° C. to about 75° C., and from about 70° C. to about 80° C.

In some aspects, the printer-based method of PeLED fabrication described herein may be modified to provide for fabricating the layers of a perovskite optoelectrical device including, but not limited to a perovskite LED, photodiode, or photodetector, by applying the various inks of each layer using a ball-point pen or other hand-applied printing or writing device in lieu of the inkjet printing device. In various aspects, a method of producing high-performance hybrid organic-inorganic perovskite LEDs and PDs on unconventional substrates (paper, textile, three-dimensional surfaces) is disclosed that uses a series of regular ballpoint pens filled with formulated electronic inks similar to the inks used in the ink-jet fabrication process described herein. Non-limiting examples of suitable inks for the handwriting fabrication process are described in additional detail in the examples below. This alternative fabrication strategy provides for the fabrication of high-performance LEDs and PDs in a matter of a few minutes by an untrained individual in a time-efficient and cost-effective manner. The disclosed handwriting fabrication method is especially useful for early-stage demonstrations or applications with less stringent requirements on resolution, as well as for science popularization and education purposes.

In some aspects, the fully-handwritten perovskite LEDs and PDs employ a simple sandwich structure consisting of a composite transparent bottom electrode of poly(3,4-ethylenedioxythiophene) polystyrene sulfonate (PEDOT:PSS) and poly(ethylene oxide) (PEO), a composite active layer of methylammonium lead tribromide ($CH_3NH_3PbBr_3$) and PEO, and a silver nanowire (AgNW) top electrode. With the addition of the PEO polymer into the perovskite precursor, the voids between crystals are eliminated, resulting in a uniform and compacted functional layer.

In various aspects, the multicolor perovskite-LEDs (PeLEDs) produced using the disclosed hand-writing method may be configured to exhibit emission covering the whole visible range, in particular the green emission, with a low turn-on voltage of about 2.3 V and high brightness of greater than 600,000 cd m$^{-2}$. Furthermore, the disclosed direct handwriting approach is well-suited for the fabrication of PeLEDs on various cellulose and fabric substrates, as well as curved and otherwise irregular surfaces that cannot be accomplished via conventional coating and deposition approaches.

In various aspects, the perovskite optoelectronic devices fabricated using the disclosed handwriting-based methods are well-suited for use in a wide variety of emerging wearable health-monitoring applications. In one aspect, the disclosed handwriting-based PeLED fabrication method is used to fabricate integrated perovskite-based LEDs and PDs to form a handwritten sensor patch capable of measuring photoplethysmogram (PPG) waveforms from human subjects.

The potential of perovskite materials for emerging low-cost, large-area paper electronics or textile electronics applications ar described in additional detail in the examples below. The versatile handwriting strategy described herein is as straightforward as holding a ballpoint pen in hand to write on the target substrates, which provides for quick access to functional electronic and optoelectronic devices being "drawn" on demand even by untrained individuals in a time-saving and cost-effective manner. As further demonstrated in the examples, the disclosed handwriting fabrication process obviates conventional substrate restrictions and provides the ability to fabricate optoelectrical devices directly on many kinds of materials that are ubiquitous in our daily life, including, but not limited to, office paper, porous woven textile, translucent vinyl, stretchable latex, soft plastics, metal foil, and even on non-flat surfaces such as cylinders and spheres. The disclosed handwriting fabrication method is also an ultrafast and eco-friendly fabrication process, capable of delivering one batch of completed devices within just a few minutes, compared to the hours or days needed by conventional fabrication processes.

One of the major challenges for implementing functional electronic or optoelectronic devices on paper or textile substrates is the rough and porous surface morphology of percolating fiber or yarn networks, which may result in nonuniform film thickness and current leakage that potentially degrade device performance. As illustrated in the examples below, poly(ethylene oxide) (PEO) can be blended into the poly(3,4-ethylenedioxythiophene) polystyrene sulfonate (PEDOT:PSS) ink formulation used to fabricate the bottom electrode as described herein. The addition of PEO tunes the viscosity and rheology of ink, allowing the composite ink to not only work as a bottom electrode but also partially soaks into the surface layer of the fibrous paper or other substrates to prime and planarize the surface for better drawing and deposition of upper layers in the devices.

In various aspects, halide perovskites inks including MAPb(Cl$_{1-x}$Br$_x$)$_3$, MAPbBr$_3$, MAPb(BrxI$_{1-x}$)$_3$, MAPbI$_3$, and butylammonium (BA) group-based quasi-2D RPP are synthesized to tune the bandgap and to achieve emission wavelengths covering the entire visible spectrum as described in the examples below. Using ballpoint pens filled with those functional inks, the fabrication of perovskite optoelectronic devices, including multicolor PeLEDs, vertical perovskite photodiodes, and lateral perovskite photoconductors can all be manufactured in an ambient environment simply the handwriting fabrication method as described in the Examples below. In various aspects, the disclosed handwriting fabrication method and optoelectric devices fabricated using the disclosed method are suitable for use in emerging applications in low-cost customizable E-paper, E-textile, smart packaging, and wearable electronics.

The handwriting fabrication method described herein and associated materials including, but not limited to ballpoint pens and formulated inks as described herein have transcended the existing limitations of conventional substrates typically used to fabricate perovskite optoelectronic devices and have provided for device fabrication on unconventional substrates that are ubiquitous in daily life such as paper, woven textiles, gloves, balloons, and metals. Owing to the planarization effect of the PEO component in the PEDOT:PSS/PEO blend described herein, devices may be fabricated using the disclosed handwriting method directly on unmodified pristine office paper and other fibrous substrates. The direct handwriting method also provides enhanced controllability to pattern conformal electronic and optoelectronic devices on nonplanar and deformable surfaces. The formulated inks for use in ballpoint pens described herein provide enhanced versatility for fabricating various kinds of perovskite optoelectronic devices with different configurations in an on-demand, mask-free, energy-saving, and ultrafast manner, allowing high-performance devices to be fabricated within minutes even by an untrained user. The user-friendly and eco-friendly handwriting approach is well-suited for multiple application scenarios such as early-stage product demonstrations, research science devices, and educational devices. The low-cost and lightweight paper- or textile-based LEDs and PDs produced using the disclosed handwriting method provide a means of integrating optoelectronic modules into wearable electronics and disposable biomedical sensors.

Definitions and methods described herein are provided to better define the present disclosure and to guide those of ordinary skill in the art in the practice of the present disclosure. Unless otherwise noted, terms are to be understood according to conventional usage by those of ordinary skill in the relevant art.

In some embodiments, numbers expressing quantities of ingredients, properties such as molecular weight, reaction conditions, and so forth, used to describe and claim certain embodiments of the present disclosure are to be understood as being modified in some instances by the term "about." In some embodiments, the term "about" is used to indicate that a value includes the standard deviation of the mean for the device or method being employed to determine the value. In some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the present disclosure are approximations, the numerical values set forth in the specific examples are reported as precisely as practicable. The numerical values presented in some embodiments of the present disclosure may contain certain errors necessarily resulting from the standard deviation found in their respective testing measurements. The recitation of ranges of values herein is merely intended to serve as a shorthand method of referring individually to each separate value falling within the range. Unless otherwise indicated herein, each individual value is incorporated into the specification as if it were individually recited herein. The recitation of discrete values is understood to include ranges between each value.

In some embodiments, the terms "a" and "an" and "the" and similar references used in the context of describing a particular embodiment (especially in the context of certain of the following claims) can be construed to cover both the singular and the plural, unless specifically noted otherwise. In some embodiments, the term "or" as used herein, including the claims, is used to mean "and/or" unless explicitly indicated to refer to alternatives only or the alternatives are mutually exclusive.

The terms "comprise," "have" and "include" are open-ended linking verbs. Any forms or tenses of one or more of these verbs, such as "comprises," "comprising," "has," "having," "includes" and "including," are also open-ended. For example, any method that "comprises," "has" or "includes" one or more steps is not limited to possessing only those one or more steps and can also cover other unlisted steps. Similarly, any composition or device that "comprises," "has" or "includes" one or more features is not limited to possessing only those one or more features and can cover other unlisted features.

All methods described herein can be performed in any suitable order unless otherwise indicated herein or otherwise clearly contradicted by context. The use of any and all examples, or exemplary language (e.g., "such as") provided with respect to certain embodiments herein is intended merely to better illuminate the present disclosure and does not pose a limitation on the scope of the present disclosure otherwise claimed. No language in the specification should be construed as indicating any non-claimed element essential to the practice of the present disclosure.

Groupings of alternative elements or embodiments of the present disclosure disclosed herein are not to be construed as limitations. Each group member can be referred to and claimed individually or in any combination with other members of the group or other elements found herein. One or more members of a group can be included in, or deleted from, a group for reasons of convenience or patentability. When any such inclusion or deletion occurs, the specification is herein deemed to contain the group as modified thus fulfilling the written description of all Markush groups used in the appended claims.

All publications, patents, patent applications, and other references cited in this application are incorporated herein by reference in their entirety for all purposes to the same extent as if each individual publication, patent, patent application, or other reference was specifically and individually indicated to be incorporated by reference in its entirety for all purposes. Citation of a reference herein shall not be construed as an admission that such is prior art to the present disclosure.

Having described the present disclosure in detail, it will be apparent that modifications, variations, and equivalent embodiments are possible without departing the scope of the present disclosure defined in the appended claims. Furthermore, it should be appreciated that all examples in the present disclosure are provided as non-limiting examples.

Examples

The following non-limiting examples are provided to further illustrate the present disclosure. It should be appreciated by those of skill in the art that the techniques disclosed in the examples that follow represent approaches the inventors have found function well in the practice of the present disclosure, and thus can be considered to constitute examples of modes for its practice. However, those of skill in the art should, in light of the present disclosure, appreciate that many changes can be made in the specific embodiments that are disclosed and still obtain a like or similar result without departing from the spirit and scope of the present disclosure.

EXAMPLE 1-FABRICATION

To develop a method for producing the flexible PeLEDs using a printer-based fabrication method as disclosed herein, the following experiments were conducted.

The fabrication processes of the all-solution-processed and fully inkjet-printed PeLEDs are schematically illustrated in FIG. 1. The ink formulation and fabrication processes are described in detail below. In brief, for the optically transparent bottom anode, a composite ink comprising the aqueous suspension of PEDOT:PSS, PEO, Triton X-100, and a small amount of ethylene glycol (EG) was used. This ink formulation offers optimal printing outcomes and good electrical properties and mechanical flexibility. The above ink was printed onto oxygen plasma-treated polydimethylsiloxane (PDMS) film spun coated on either a glass substrate or PET film, followed by an annealing process to allow the solvents to completely evaporate. The emissive layer of the PeLEDs was obtained by printing a composite ink comprising $CH_3NH_3PbBr_3$ and PEO in the 1:1 weight ratio on a heated stage at temperatures ranging from 25 to 80° C.

Figure 1B:
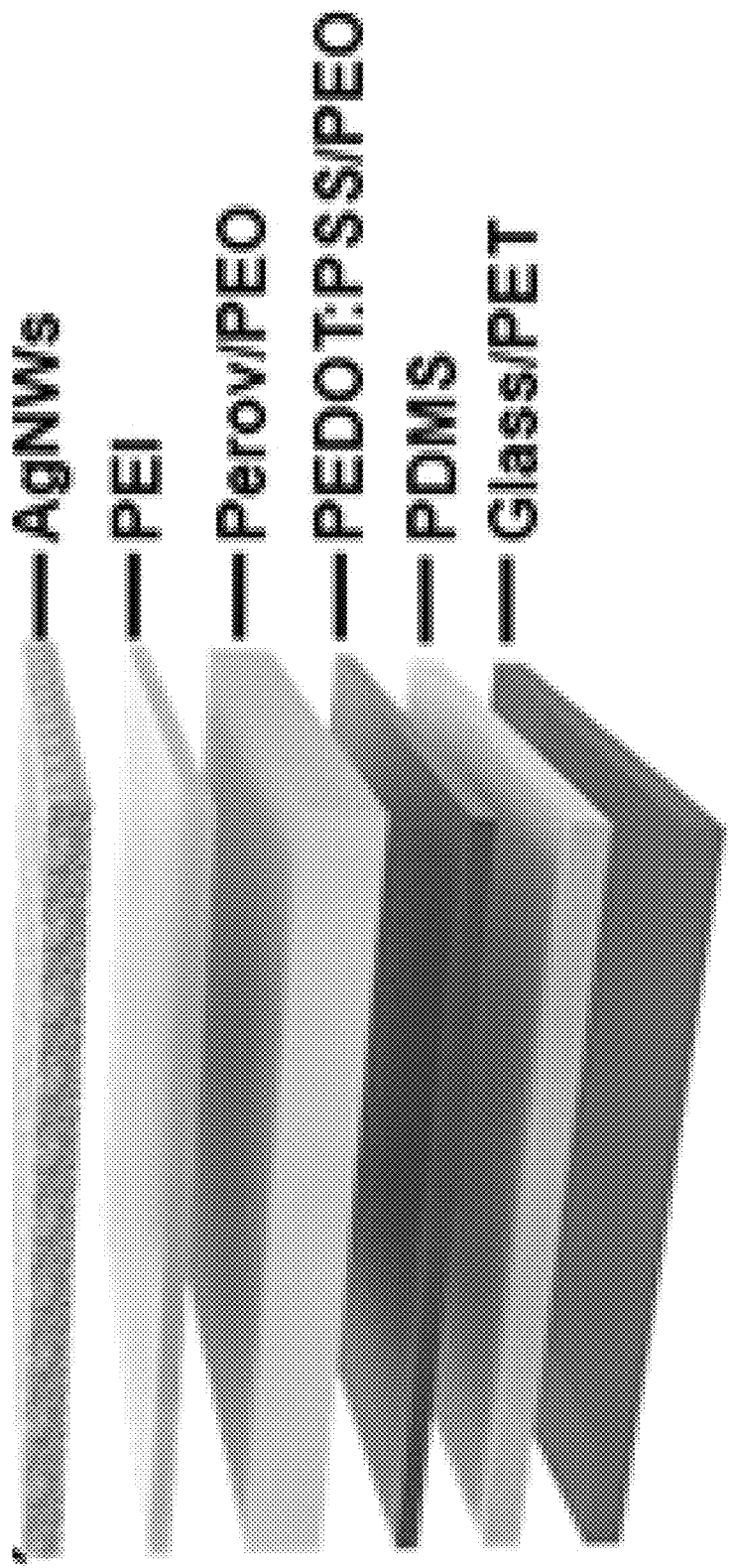

To protect the perovskite emissive layer from the subsequent printing steps, a PEI layer was printed on top of $CH_3NH_3PbBr_3$/PEO composite film at elevated temperatures to allow the solvent in PEI to evaporate immediately so that only polymer PEI was left to fully cover the emissive layer. As a final step, IPA-based AgNW ink with EG additive was printed along the perpendicular orientation to previously printed layers to form the top electrode. All steps were carried out in ambient conditions. FIG. 1B illustrates the completed PeLED with a 4-layer structure that consists of a transparent PEDOT:PSS/PEO bottom anode, a $CH_3NH_3PbBr_3$/PEO composite emissive layer, a PEI buffer layer, and an AgNW top cathode.

Materials used in the ink formulations described below included: Lead (II) bromide (PbBr2, 99.999%), poly(ethylene oxide) (PEO, average Mv~5,000,000), N,N-dimethylformamide (DMF, 99.8%), dimethyl sulfoxide (DMSO, >99.9%), branched polyethylenimine (PEI, average Mw~25,000 by LS, average Mn~10,000 by GPC), Triton X-100, ethylene glycol, and poly(3,4-ethylenedioxythiophene)-poly(styrene sulfonate) (PEDOT:PSS, 1.1% in H2O ) were purchased from Sigma-Aldrich. Methylammonium bromide ($CH_3NH_3Br$) and Sylgard 184 kit (PDMS pressure and curing agent) were purchased from "1-Material Inc" and Dow Silicones Corporation, respectively. IPA-based silver nanowire dispersion (D:90 nm, L: 20-30 µm) was purchased from ACS Material, LLC.

To form the flexible PDMS substrate, the PDMS precursor and curing agent were mixed at a mass ratio of 10:1, followed by vacuum treatment to remove the air bubbles. The PDMS substrate was prepared by casting the as-prepared PDMS onto a glass or PET substrate that was cleaned by IPA and deionized water. Right before printing the PeLED device as described below, the PDMS substrate was treated with oxygen plasma (Plasma Etch PE25-JW-HF) at 30 W for 15 s.

The entire fabrication process was carried out in ambient conditions with a humidity of around 40%. The Microplotter (Sonoplot Inc.) was modified with a thermoelectric heating pad and a temperature controller (TE Technology Inc.) to allow precise temperature control of the sample during the printing.

A PEDOT:PSS/PEO composite ink was used to form the transparent anode on the substrate. A PEDOT:PSS precursor was prepared by mixing aqueous PEDOT:PSS, ethylene glycol, and Triton X-100 with a volume ratio of 100:5: 1. The PEO solution was obtained by dissolving PEO in DMF with a concentration of 10 mg/ml followed by stirring at 60° C. The PEDOT:PSS precursor and PEO solution were then mixed with a weight ratio of 100:35 to obtain the PEDOT:PSS/PEO composite ink, which was stirred at 500 rpm for 30 min before use.

The $CH_3NH_3PbBr_3$ perovskite ink used to form the light-emitting layer was prepared by mixing the precursors of $PbBr_2$ and $CH_3NH_3Br$ with a molar ratio of 1:1.5 and then dissolving in anhydrous DMSO to reach a concentration of 500 mg/ml. The $CH_3NH_3PbBr_3$ suspension was stirred at 70° C. for 20 min to expedite the dissolution until the white sediment disappeared. The $CH_3NH_3PbBr_3$/PEO composite ink was obtained by mixing the $CH_3NH_3PbBr_3$ precursor and the PEO solution with a weight ratio of 1:1. Fresh ink was made before each experiment and stirred at 70° C. for 30 min.

A PEI ink was used to form the PEI buffer layer. The PEI ink was prepared by dissolving the branched PEI into IPA at the desired weight ratio.

The cathode layer was produced using AgNW ink. The AgNW ink consisted of as-purchased IPA-based AgNW dispersion and EG that were mixed to the desired volume ratio. Before each use, the AgNW ink was sonicated for 2 min to eliminate entangled nanowire aggregations that would otherwise cause nozzle clogging so that more uniform printing was achieved.

The PEDOT:PSS/PEO composite ink was prepared as described above and loaded into the ink dispenser of the microplotter, which was gradually lowered to establish a quasi-contact with the PDMS surface to form an ink meniscus. Predesigned patterns were printed with the ink dispenser moving at a rate of 2000 μm/s. After printing, the PEDOT:PSS/PEO film was annealed on-site at 90° C. to completely remove the solvents.

Following similar steps, the $CH_3NH_3PbBr_3$/PEO composite ink was printed on top of the PEDOT:PSS/PEO bottom electrode with a speed of 1000 μm/s with simultaneous annealing at the desired temperature ranging from 25° C. (room temperature) to 80° C. The PEI buffer layer was subsequently printed on top of the annealed perovskite composite film at a speed of 1000 μm/s. The PEI buffer layer was printed at 80° C. to evaporate the IPA solvent of the PEI ink immediately. The AgNW ink was mixed and sonicated as described above, and then printed on top of the PEI buffer layer to form the AgNW cathodes. AgNW cathodes were printed with the substrate maintained at 90° C. during printing to evaporate the IPA solvent of the AgNW ink.

Figure 1E:
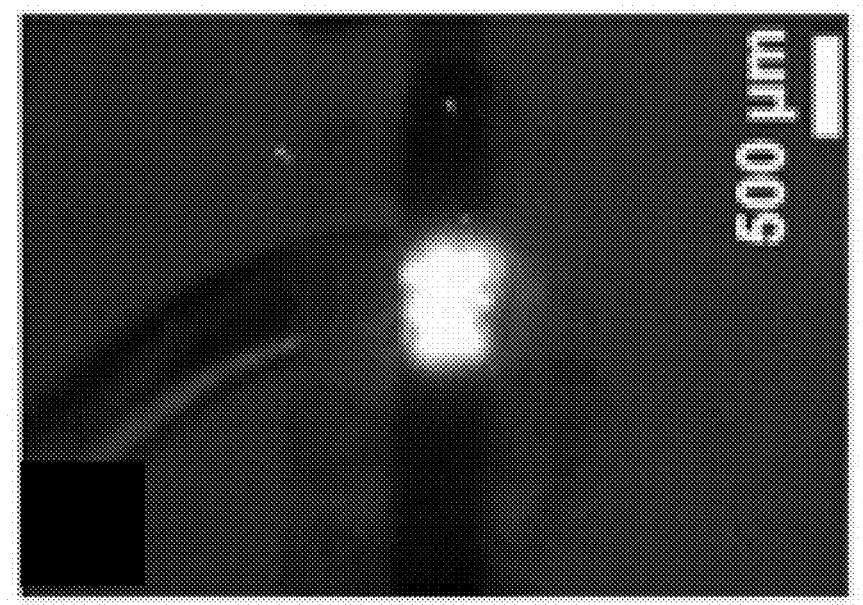
Figure 1D:
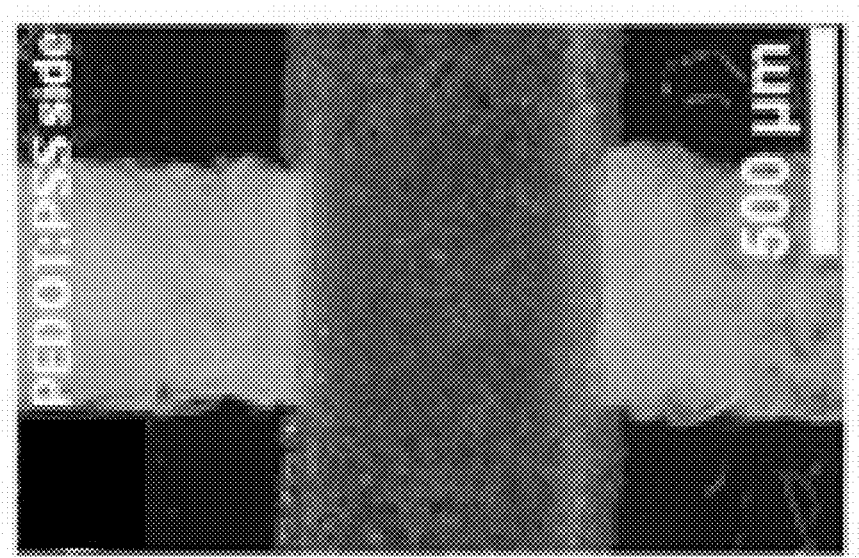
Figure 1C:
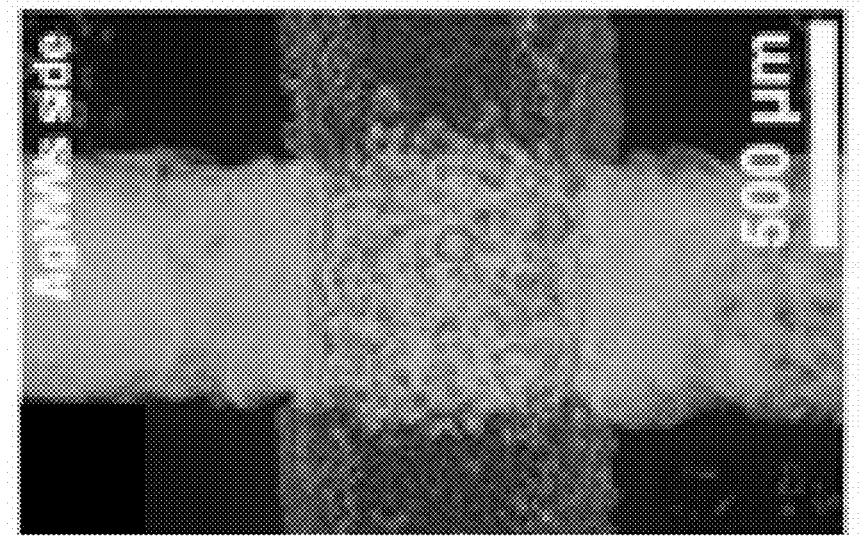

Optical micrographs of representative printed PeLEDs viewed from the top AgNW cathode side and the bottom PEDOT:PSS anode side are shown in FIGS. 1C and 1D, respectively. The overlap area (500×500 μm²) formed by the $CH_3NH_3PbBr_3$/PEO emissive layer and the AgNW top electrode formed the actual light-emitting region when a bias voltage was applied. The AgNW top electrode was quite conformal to the underlying $CH_3NH_3PbBr_3$/PEO emissive layer and the PEI layer was too thin to be distinguishable in FIG. 1I. The top view SEM image in FIG. 1J shows the dense and well-defined printed AgNW networks, which ensured low resistivity and good optoelectronic performance.

FIG. 1E shows the PeLED emitting green light under a forward bias of 4.5 V with a measured luminance intensity of around 4200 cd/m². The printer-based fabrication process described above provided for patterning the PeLED device into arbitrary shapes. By way of non-limiting example, FIG. 1F shows a display prototype patterned into "WUSTL" characters by programming the moving trajectory of the printing nozzle. The display was lit up under 3.5 V bias voltage with a luminance intensity of approximately 1000 cd/m² (FIG. 1G).

Figure 3E:
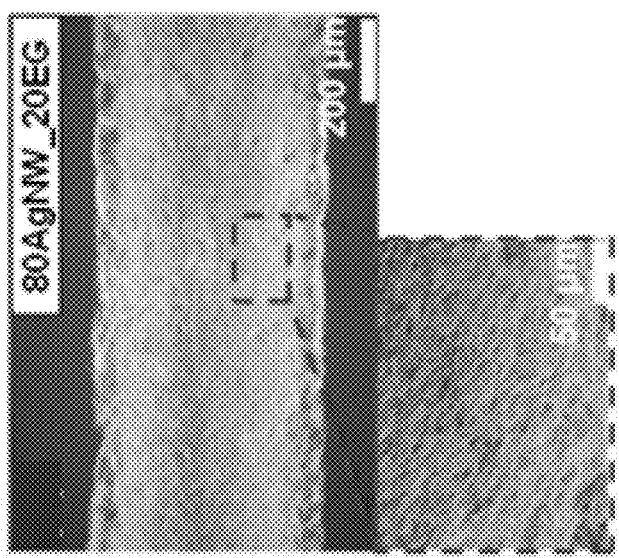
FIG. 3E contains micrographs showing the surface morphology of the printed AgNW networks (2 printing passes) using an ink comprising 80% AgNW solution and 20% EG; the inset figure is a zoomed-in view of the AgNW networks.
Figure 3D:
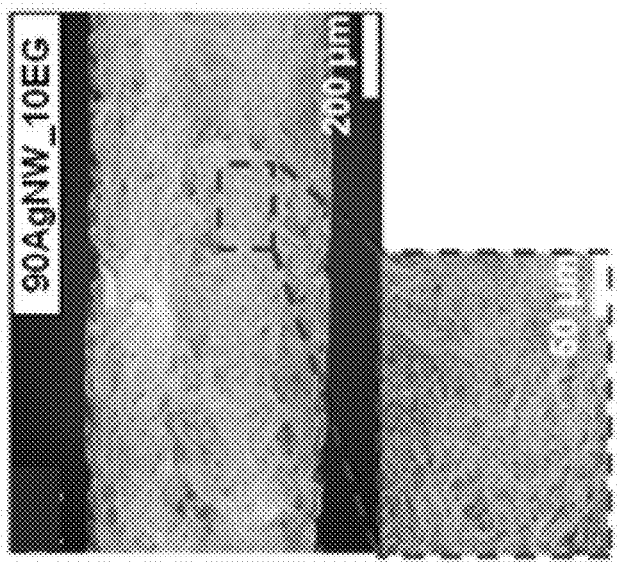
FIG. 3D contains micrographs showing the surface morphology of the printed AgNW networks (2 printing passes) using an ink comprising 90% AgNW solution and 10% EG; the inset figure is a zoomed-in view of the AgNW networks.
Figure 3C:
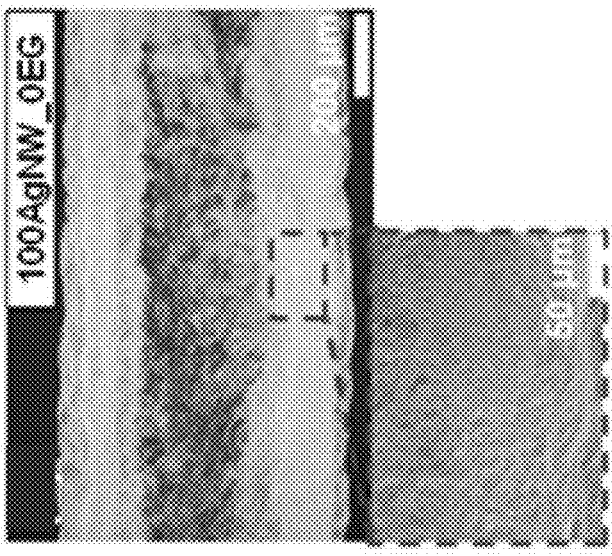
FIG. 3C contains micrographs showing the surface morphology of the printed AgNW networks (2 printing passes) using an ink comprising 100% AgNW solution; the inset figure is a zoomed-in view of the AgNW networks.
Figure 3H:
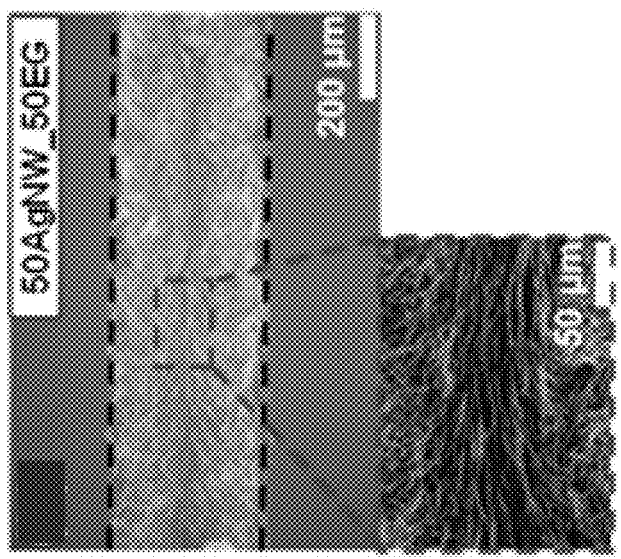
FIG. 3H contains micrographs showing the surface morphology of the printed AgNW networks (2 printing passes) using an ink comprising 50% AgNW solution and 50% EG; the inset figure is a zoomed-in view of the AgNW networks.
Figure 3G:
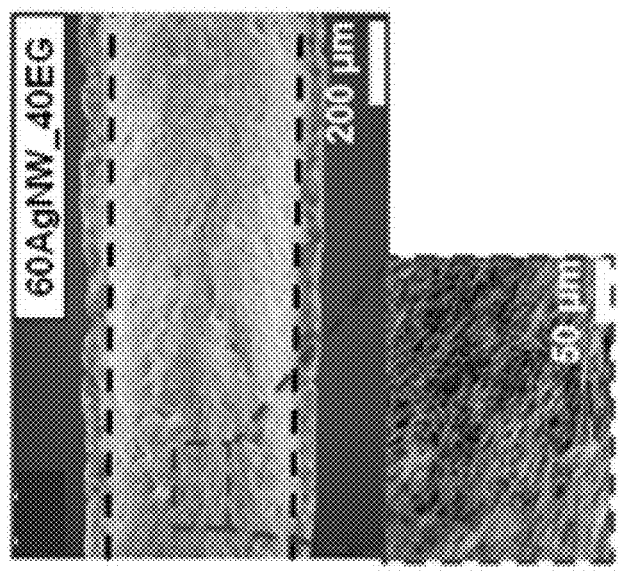
FIG. 3G contains micrographs showing the surface morphology of the printed AgNW networks (2 printing passes) using an ink comprising 60% AgNW solution and 40% EG; the inset figure is a zoomed-in view of the AgNW networks.
Figure 3F:
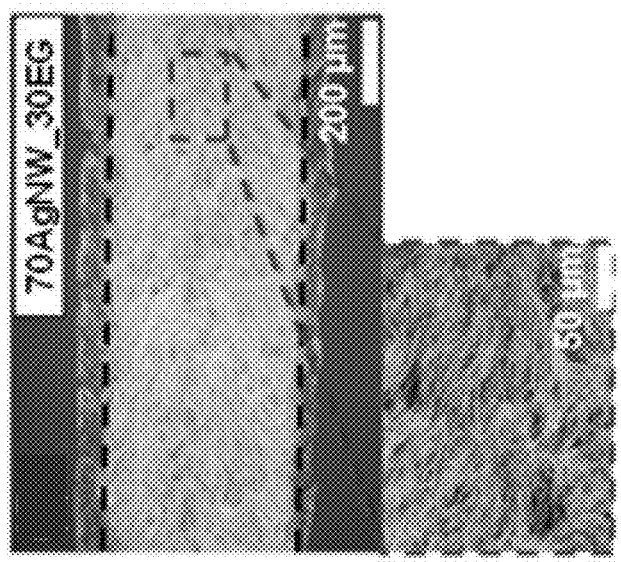
FIG. 3F contains micrographs showing the surface morphology of the printed AgNW networks (2 printing passes) using an ink comprising 70% AgNW solution and 30% EG; the inset figure is a zoomed-in view of the AgNW networks.
Figure 3I:
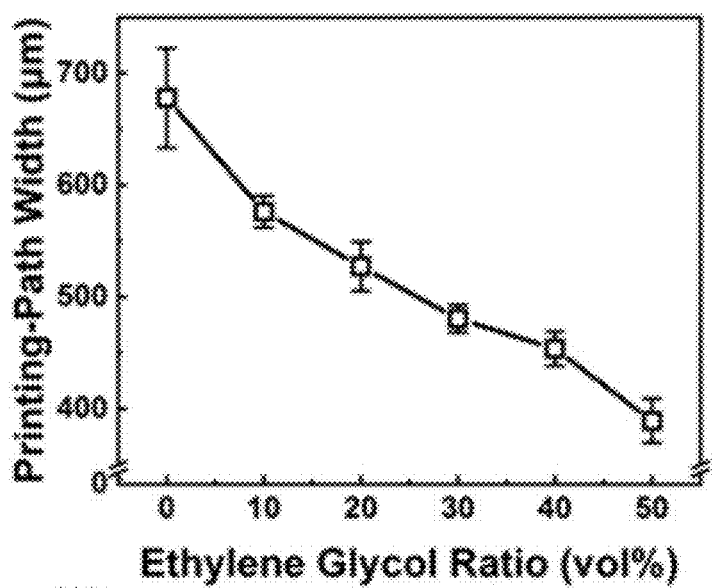
FIG. 3I is a graph of the path width of the printed AgNW pattern as a function of the EG additive volume ratio.
Figure 3J:
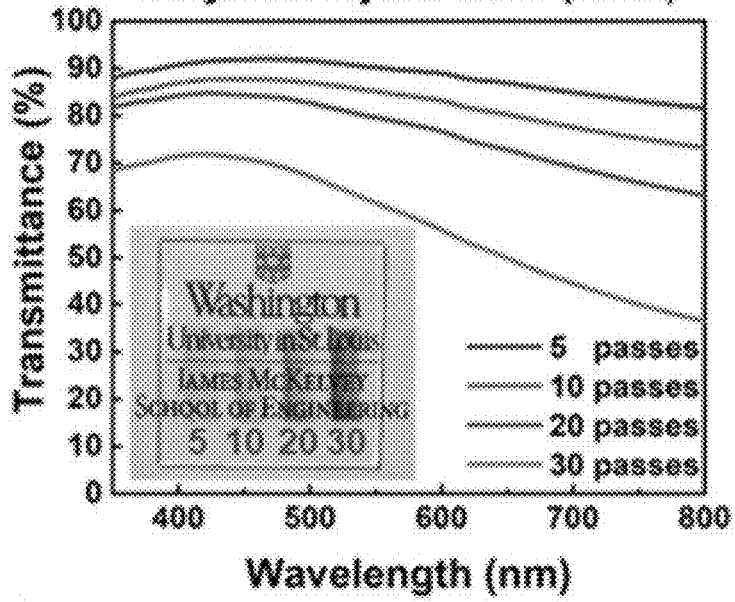
FIG. 3J is a graph comparing the transmittance spectra of the PEDOT: PSS-PEO composite film fabricated with different numbers of printing passes; the inset photograph shows the visual differences in the transparency of the film with 5, 10, 20, and 30 passes, respectively.
Figure 3K:
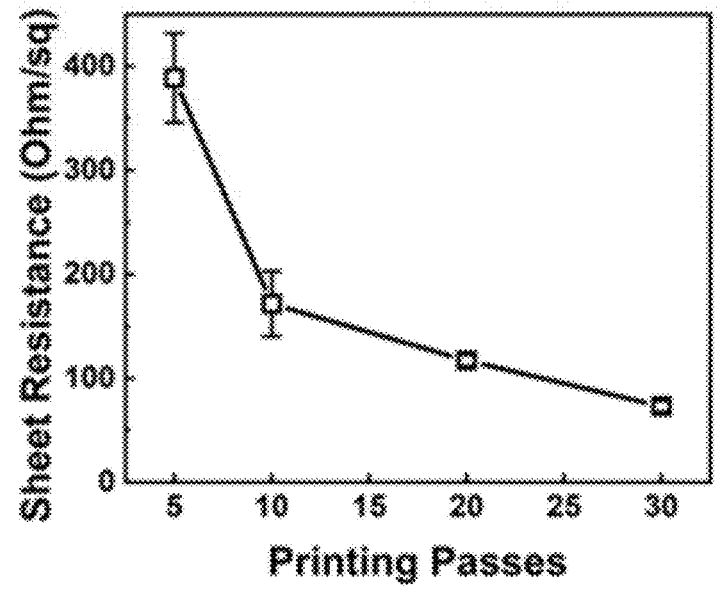
FIG. 3K is a graph of the sheet resistance of the printed PEDOT:PSS/PEO composite film as a function of the number of printing passes.

For the printed PEDOT:PSS/PEO bottom electrode, a PEO blending ratio of 35 vol % was used, which was found to be printing-friendly and offered intrinsic stretchability based on previous results. To assess the sensitivity of the optical transmittance of the printed PEDOT:PSS/PEO composite film to variations in the printing process, the following experiments were conducted. The optical transmittance of the printed PEDOT:PSS/PEO composite film with different numbers of printing passes was characterized using ultraviolet-visible spectroscopy (UV-Vis). As summarized in FIG. 3J, at a wavelength of 535 nm, the measured transmittance of the film decreased slightly from 91% to 81% as the printing passes increased from 5 to 20, followed by a considerable drop to 63% at 30 printing passes. The inset picture of FIG. 3J shows the visual difference of the printed PEDOT:PSS/PEO films with different numbers of printing passes. However, with increasing printing passes, the thickness of the PEDOT:PSS/PEO film increased so that the film conductance also improved noticeably. More specifically, the sheet resistance of the PEDOT:PSS/PEO composite electrode dropped from 389 0/sq at 5 printing passes to 73 0/sq at 30 printing passes (FIG. 3K). As a tradeoff, 20 printing passes were selected for the fabrication of the PeLED devices as described herein, resulting in high optical transparency of 81% at 535 nm wavelength and a low sheet resistance of 117/sq, which was comparable to rigid transparent electrode counterparts such as sputtered indium tin oxide (ITO).

Figure 1H:
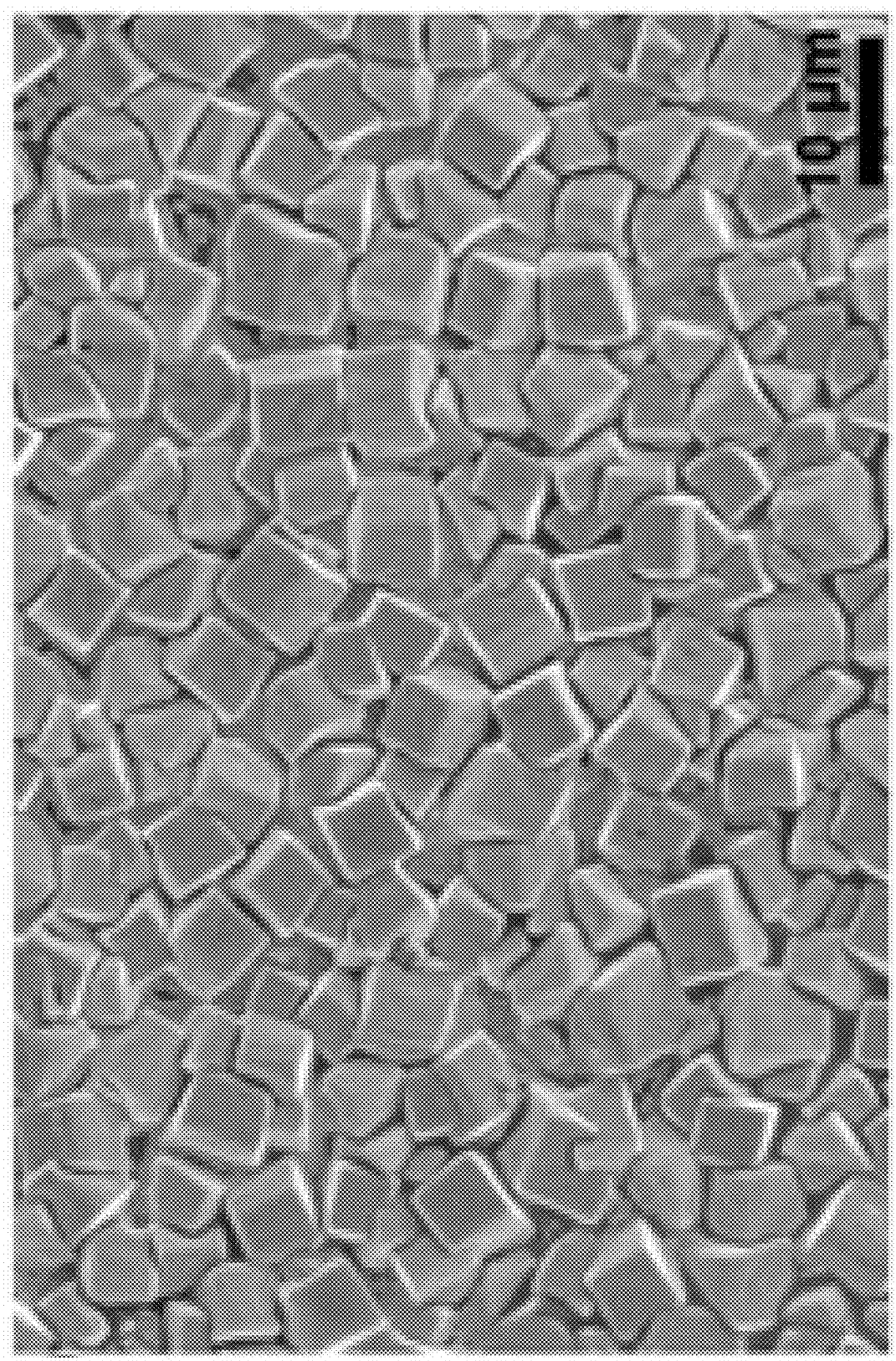
Figure 1I:
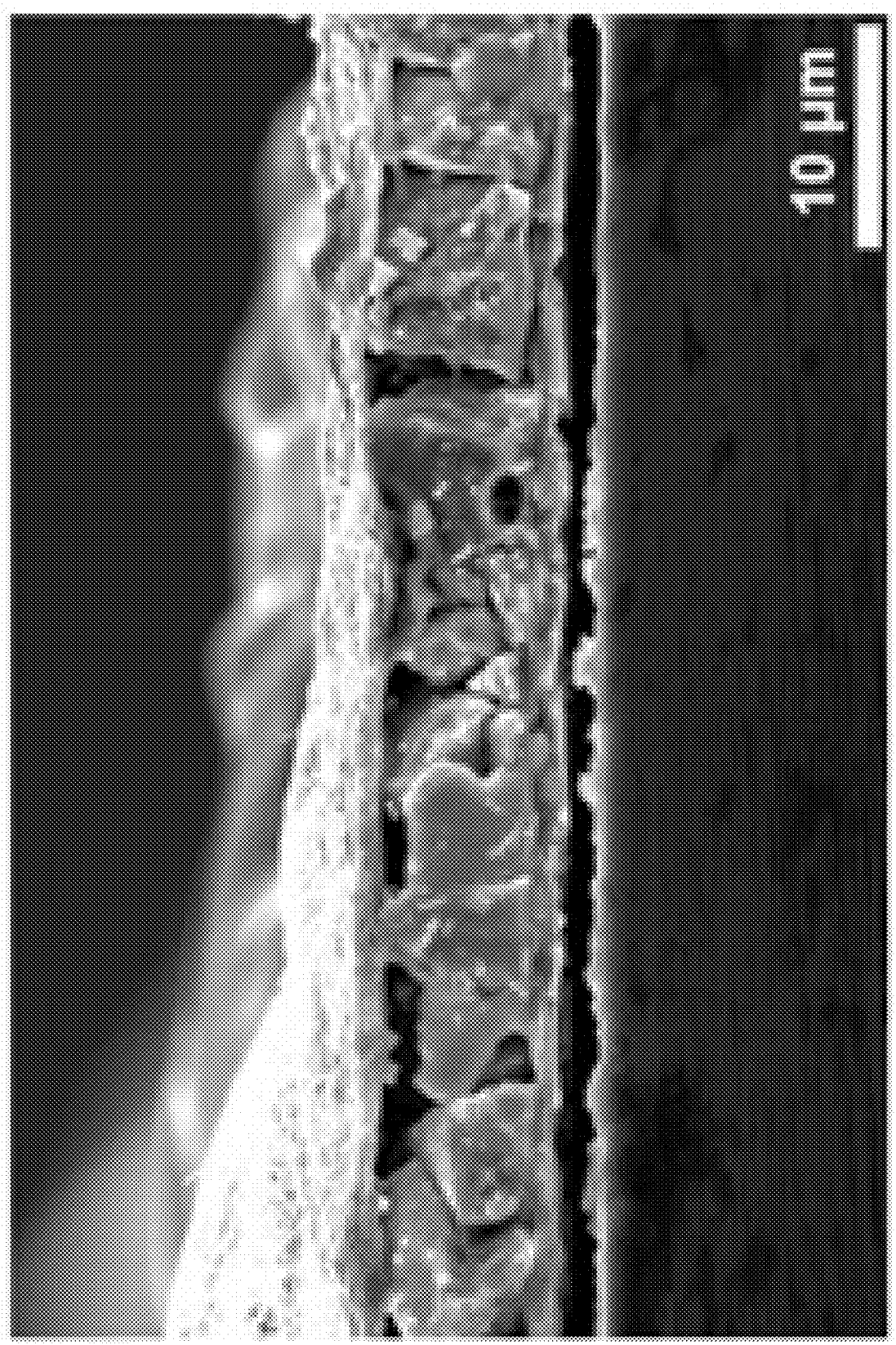
Figure 1J:
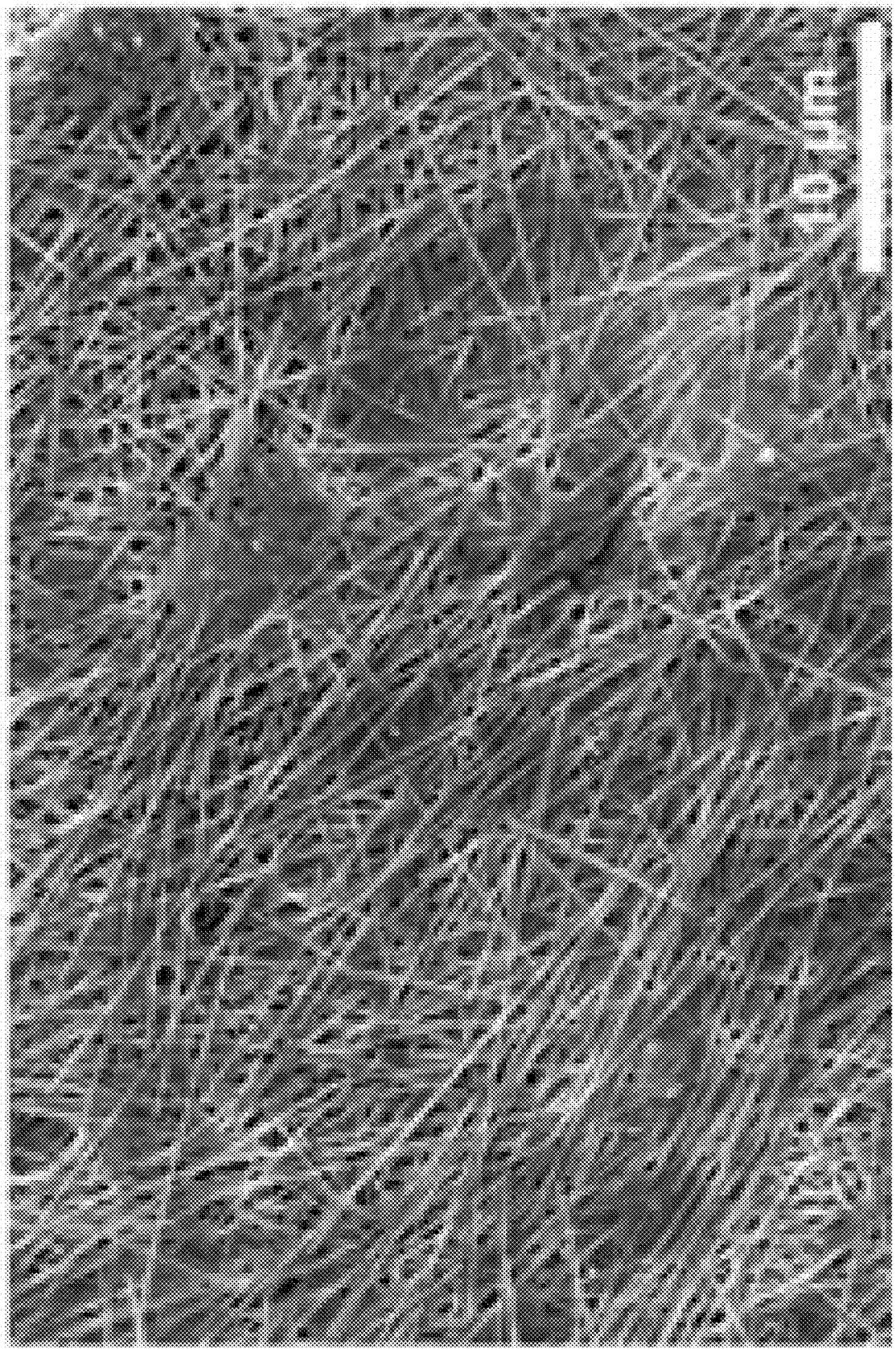

The surface morphology of the printed $CH_3NH_3PbBr_3$/PEO composite thin film was examined under the scanning electron microscope (SEM) as shown in FIG. 1H. The $CH_3NH_3PbBr_3$ crystals (size of around 5~8 μm in cuboid shape) were distributed close to each other and the voids in between the grains were filled by PEO to reach a pinhole-free state. The PEO also aided the flexibility and stretchability of the perovskite film. Cross-sectional SEM images were also taken from the printed PeLEDs (FIG. 1I) from which the various printed layers comprising the device can be seen. On top of the PEDOT:PSS/PEO film, the polymer matrix embedded with perovskite crystals had an average film thickness that is close to the grain size shown in FIG. 1H.

Figures 2A, 2B:
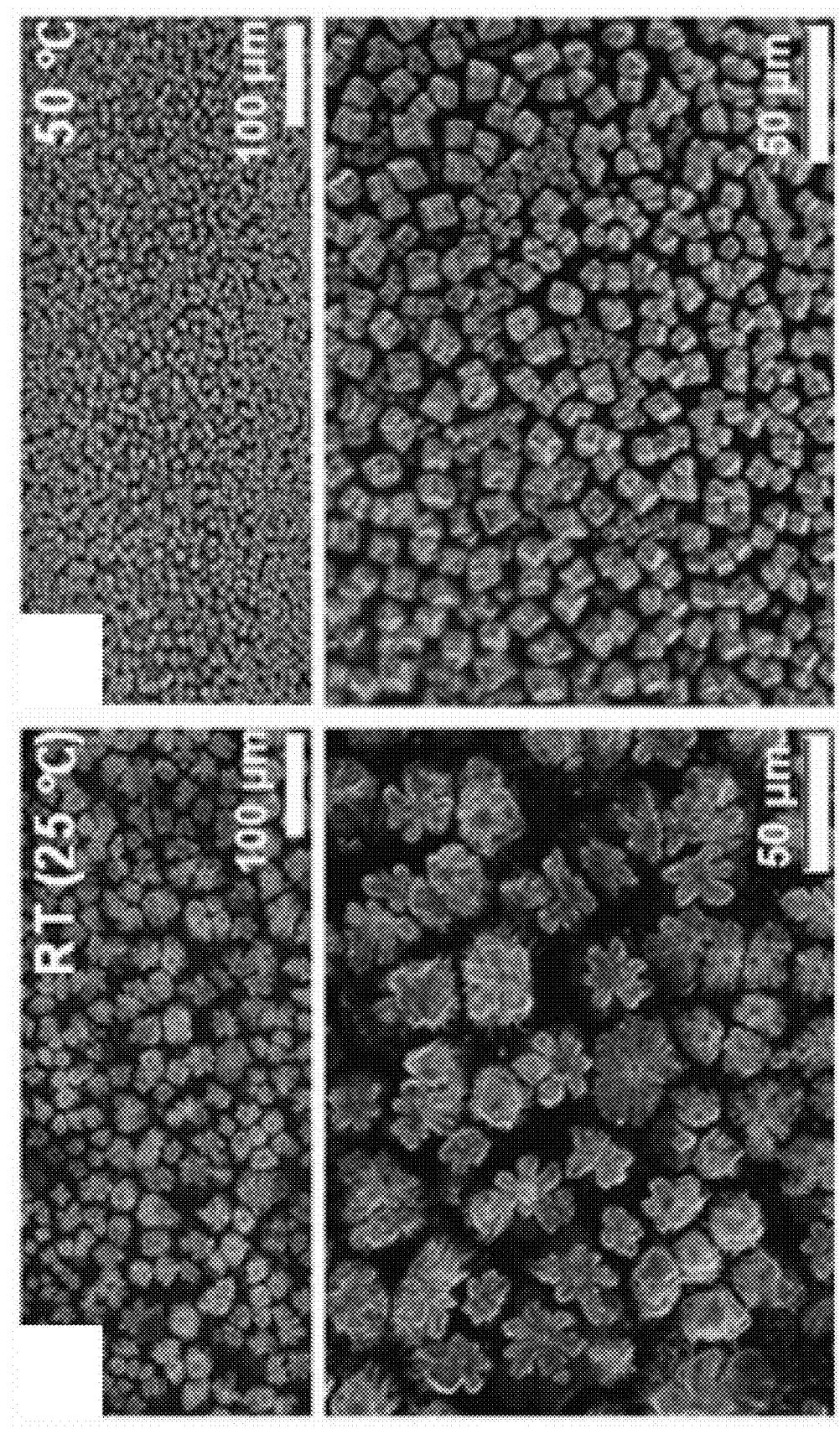
FIG. 2A is an optical micrograph showing the morphology of the printed $CH_3NH_3PbBr_3$/PEO composite film printed at a temperature of 25° C.
FIG. 2B is an optical micrograph showing the morphology of the printed $CH_3NH_3PbBr_3$/PEO composite film printed at a temperature of 50° C.
Figures 2C, 2D:
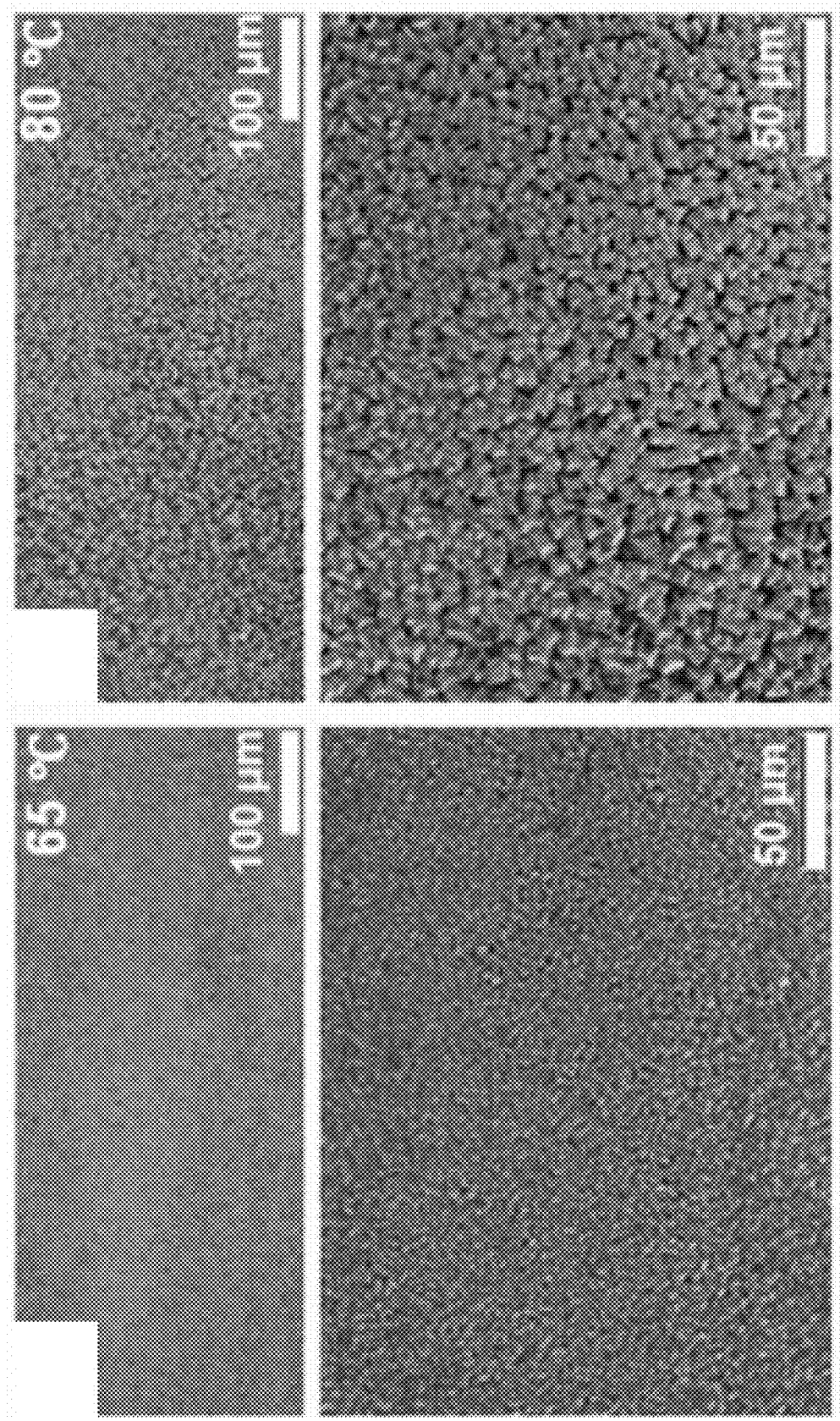
FIG. 2C is an optical micrograph showing the morphology of the printed $CH_3NH_3PbBr_3$/PEO composite film printed at a temperature of 60° C.
FIG. 2D is an optical micrograph showing the morphology of the printed $CH_3NH_3PbBr_3$/PEO composite film printed at a temperature of 80° C.

To evaluate the effect of printing temperature, $CH_3NH_3PbBr_3$/PEO composite thin films were fabricated as described above over a range of printing temperatures. The effects of printing temperature on the evolution of crystal size, shape, and density are presented in FIGS. 2A, 2B, 2C, and 2D, where the top and bottom rows show the low magnification and high magnification micrographs, respectively. When printed at room temperature of around 25° C., the $CH_3NH_3PbBr_3$ crystals formed the dendritic shape with a random size of 20~40 μm (FIG. 2A). The film was discontinuous with the grains separated by about 15~25 μm, leading to a poor coverage percentage of around 40%. This film discontinuity was a potentially detrimental factor in the device fabrication process since the voids between crystals could be easily penetrated by the solvents in subsequent printing inks, which would result in pinholes and current leakage or device breakdown. At a higher substrate temperature of around 50° C. (FIG. 2B), the perovskite precursors started to form cuboids of 10-15 μm in size, and the spacing between the crystals also shrank significantly, resulting in a better coverage ratio of over 54%. The optimal crystal morphology was achieved at 65° C. as shown in FIG. 2C; the crystallized grains reached the densest arrangements with a uniform size of 5~8 μm. The surface coverage also peaked at 65° C. to above 90%, forming a continuous, smooth, and pinhole-free film. The printing condition of 65° C. is thus selected and used in the following experiments. For even higher substrate temperatures such as 80° C. (FIG. 2D), the quality of the perovskite film degrades in terms of the lower coverage rate (~70%), nonuniform crystallization, larger grain size (8~13 μm), and more pinhole defects. Note that all samples shown in FIGS. 2A, 2B, 2C, and 2D were printed with only 2 passes (one back- and-forth round) to highlight the film morphology variation.

Figure 7:
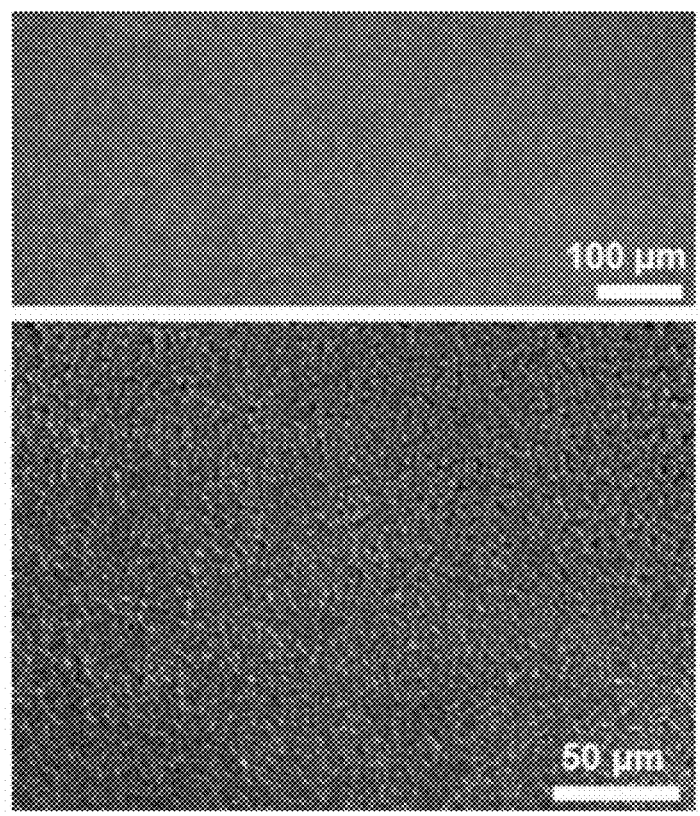
FIG. 7 contains an optical micrograph of a $CH_3NH_3PbBr_3$/PEO (1:1) composite film processed by spin coating on (PEDOT:PSS/PEO)/PDMS/glass substrate; the spin coating was performed at 1500 rpm for 30 s followed by annealing at 70° C. for 5 min.

To compare the quality of the printed film with films obtained from spin-coating (one of the most studied approaches for preparing perovskite films), a reference sample was processed by spin-coating showing the grain arrangement, as shown in FIG. 7. These results demonstrated that the printed perovskites film fabricated as described above are comparable to corresponding films fabricated using other mainstream fabrication methods.

It is well-known that perovskite is particularly sensitive to oxygen, moisture, and many common solvents. Consequently, AgNW ink cannot be printed directly on top of the perovskite film without potentially damaging the perovskite layer. As described above, a PEI buffer layer was fabricated over the perovskite layer prior to printing the AgNW ink to produce the cathodes. The PEI interfacial layer was configured to physically protect the $CH_3NH_3PbBr_3$/PEO emissive layer from attacks by multiple solvents (IPA and EG) in the AgNW ink during the top cathode printing step described above.

To assess the protective effect of the PEI buffer layer, PeLEDs were formed as described above with and without printing the PEI buffer layer over the perovskite emissive layer before printing the AgNW top cathode. The micrographs in FIGS. 4E and 4F show the PeLEDs without and with PEI interlayer when viewed from PEDOT:PSS/PEO bottom electrode side. The appearances of these two samples were drastically different. For the sample produced without PEI protection in FIG. 4E, the perovskite film was corroded significantly by the AgNW ink, and the $CH_3NH_3PbBr_3$ crystals were degraded severely with a visible color change from orange to grey. In contrast, the other sample produced with a PEI buffer layer (FIG. 4F) was well-protected without any visible corrosion based on the morphology of $CH_3NH_3PbBr_3$ crystals. Electrical tests on these two samples also confirmed that the PeLED produced without a PEI buffer layer failed while the PeLED produced with a PEI buffer layer worked well with bright light emission (FIG. 4B).

Figure 10A:
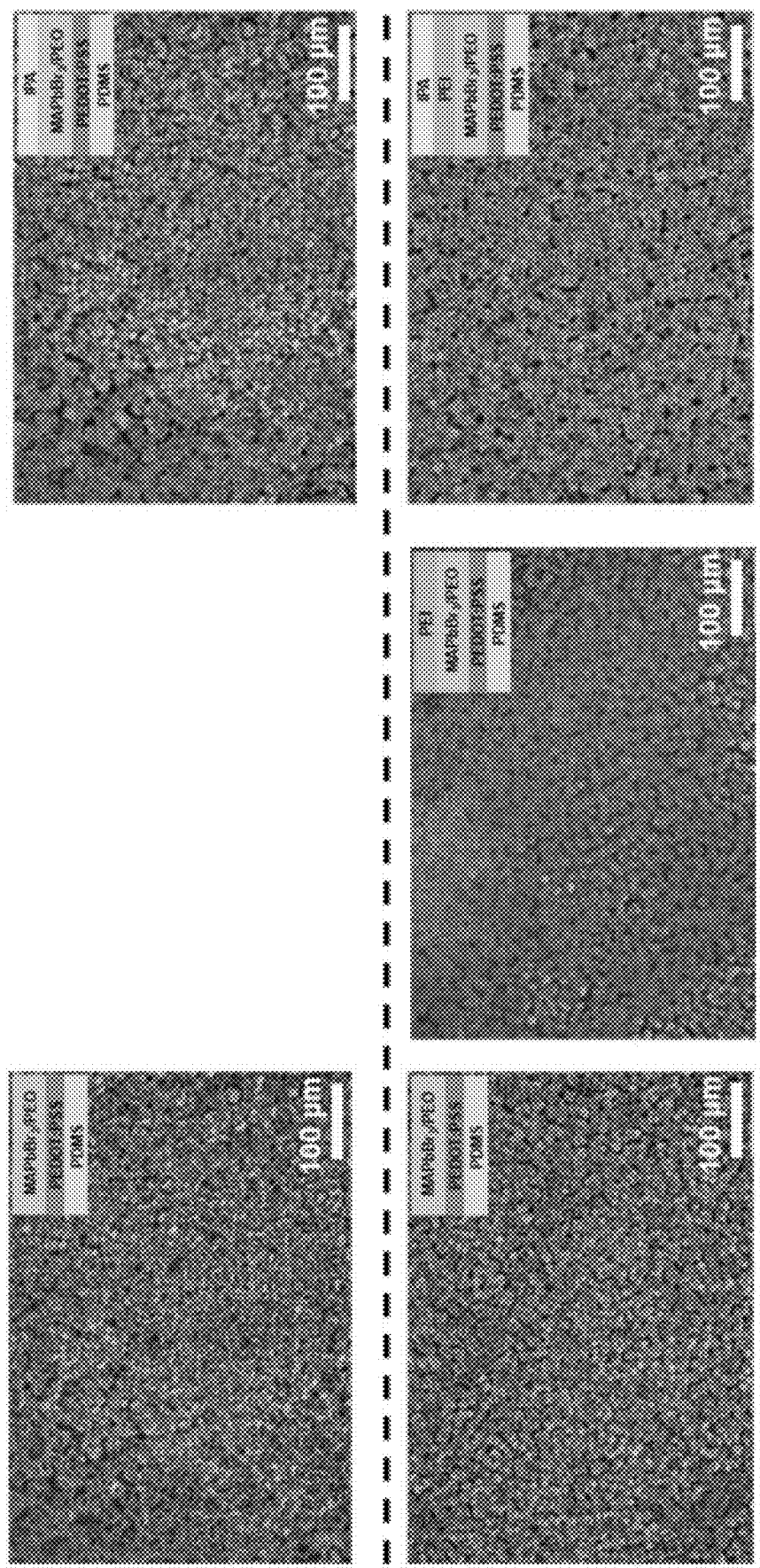
FIG. 10A contains a series of micrographs $CH_3NH_3PbBr_3$/PEO (1:1) composite films covered by a printed layer of pure IPA; images in the top row and bottom row correspond to the samples without (top) and with (bottom) a PEI buffer layer and the inset drawings illustrate the corresponding multi-layer device structure.
Figure 10B:
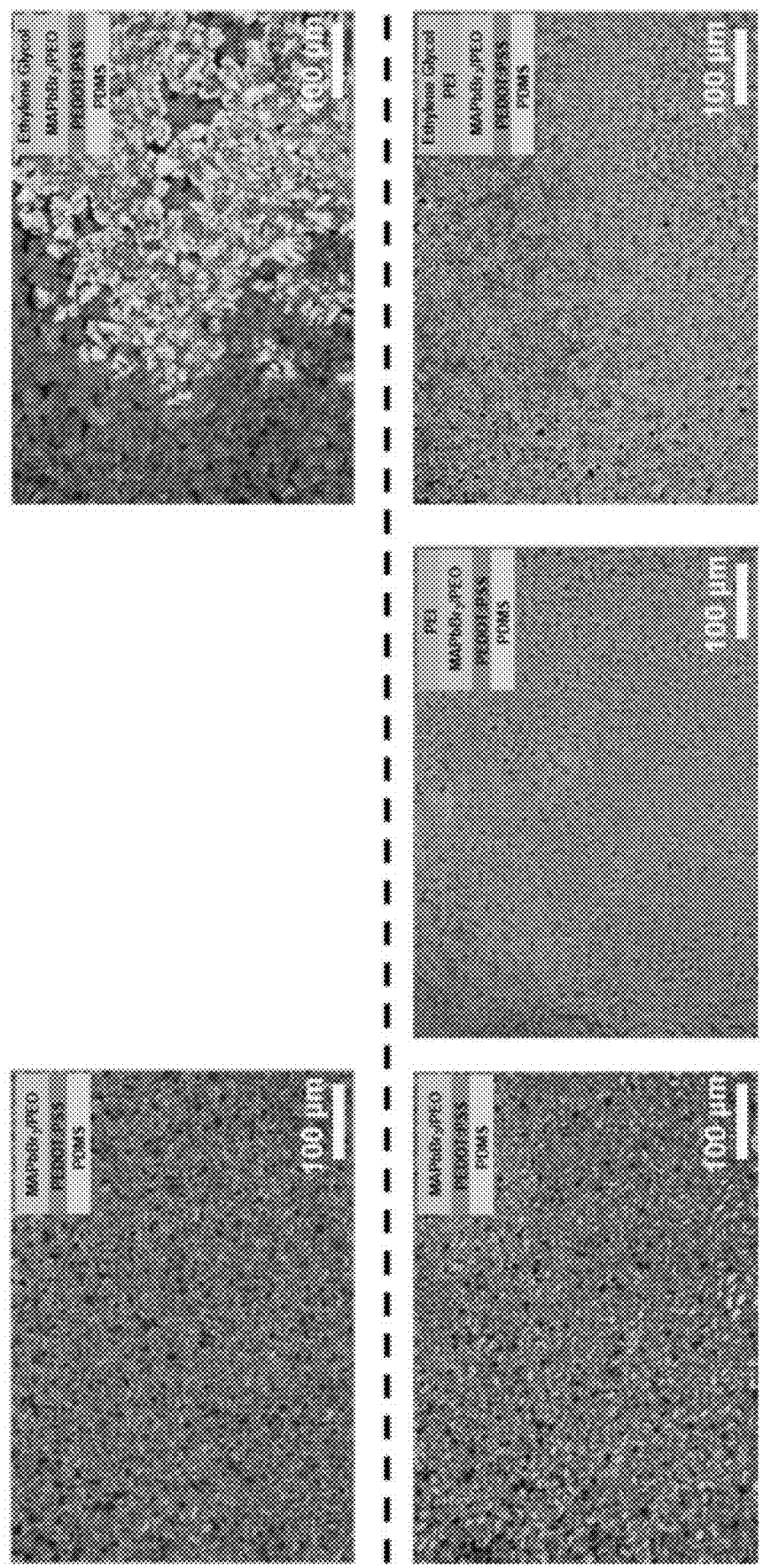
FIG. 10B contains a series of micrographs $CH_3NH_3PbBr_3$/PEO (1:1) composite films covered by a printed layer of pure EG used in the AgNW ink used to print the electrode of the PeLED device; images in the top row and bottom row correspond to the samples without (top) and with (bottom) a PEI buffer layer and the inset drawings illustrate the corresponding multi-layer device structure.

In order to determine which component in the AgNW ink was potentially harmful to the underlying perovskite functional layer, a control experiment was carried out by printing pure IPA (FIG. 10A) and pure EG (FIG. 10B) onto a $CH_3NH_3PbBr_3$/PEO layer without (top row) and with (bottom row) an interfacial PEI buffer layer. The results indicated that IPA did little harm to the perovskite emissive layer, while EG resulted in catastrophic degradation to the perovskite crystals (upper right picture in FIG. 10B) as indicated by the visible color change of the crystals, which matched the results shown in FIG. 4E. The PEI protective layer mitigated the erosion from EG (bottom right picture in FIG. 10B).

Figure 11B:
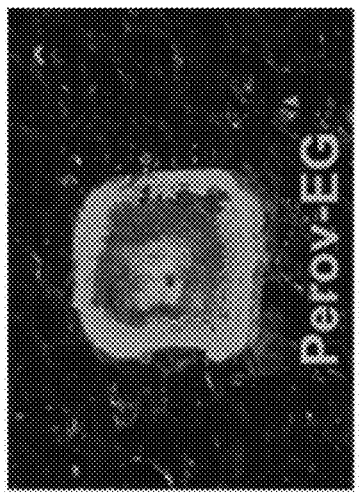
FIG. 11B is an image showing the photoluminescence of the "Perov-EG" sample under UV light illumination.
Figure 11C:
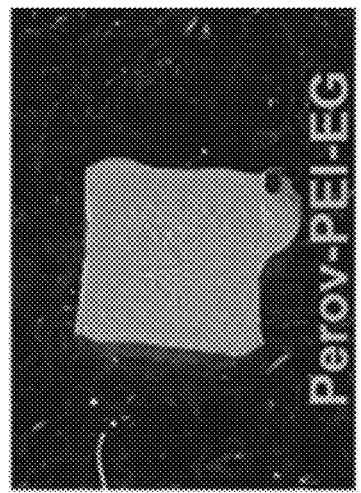
FIG. 11C is an image showing the photoluminescence of the "Perov-PEI-EG" sample under UV light illumination.
Figure 11A:
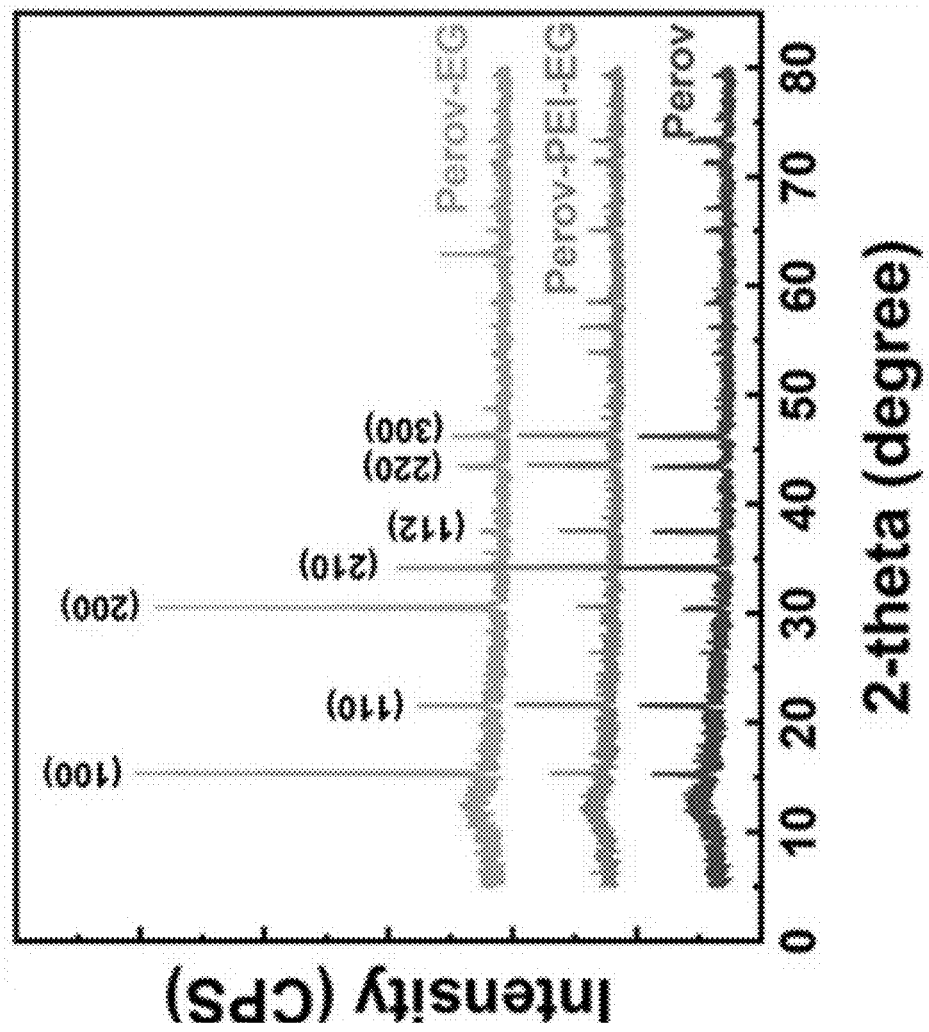
FIG. 11A is a graph comparing the X-ray diffraction (XRD) patterns of the pristine perovskite film (Perov), perovskite film with ethylene glycol printed on top (Perov-EG), and perovskite film protected by a PEI buffer layer after the same ethylene glycol treatment (Perov-PEI-EG).

To evaluate the protective function of the PEI buffer layer against the erosion of the perovskite active layer by EG, X-ray diffraction (XRD) patterns and photoluminescence were measured from the samples with and without PEI protection and the results confirmed that the PEI buffer layer protected the sensitive perovskite material from chemical attacks. FIG. 11A shows the X-ray diffraction (XRD) patterns measured from a pristine perovskite film and perovskite films treated by EG with and without PEI protection. The XRD patterns from the "Perov-EG" sample differed significantly from the "Perov" sample in terms of relative peak intensities and peak locations, indicating that the crystalline structure and arrangements of perovskite crystals were changed drastically after EG was printed on top of the perovskite functional layer. In contrast, for the samples with PEI buffer layers, the XRD pattern from the "Perov-PEI-EG" sample remained nearly identical to the pristine "Perov" film, suggesting that EG did not harm the active material in this scenario. Moreover, FIGS. 11B and 11C compare the photoluminescence from the different samples under UV lamp illumination. The region eroded by EG was not luminous, while the samples protected by the PEI buffer layer remained luminous.

Figure 9B:
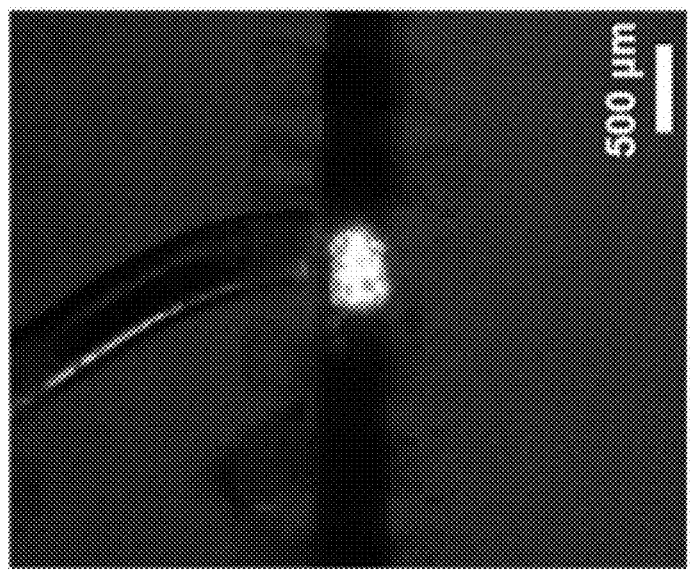
FIG. 9B is an optical photograph of the PeLED of FIG. 9A that is lit using an applied voltage of about 4.5 V.
Figure 9A:
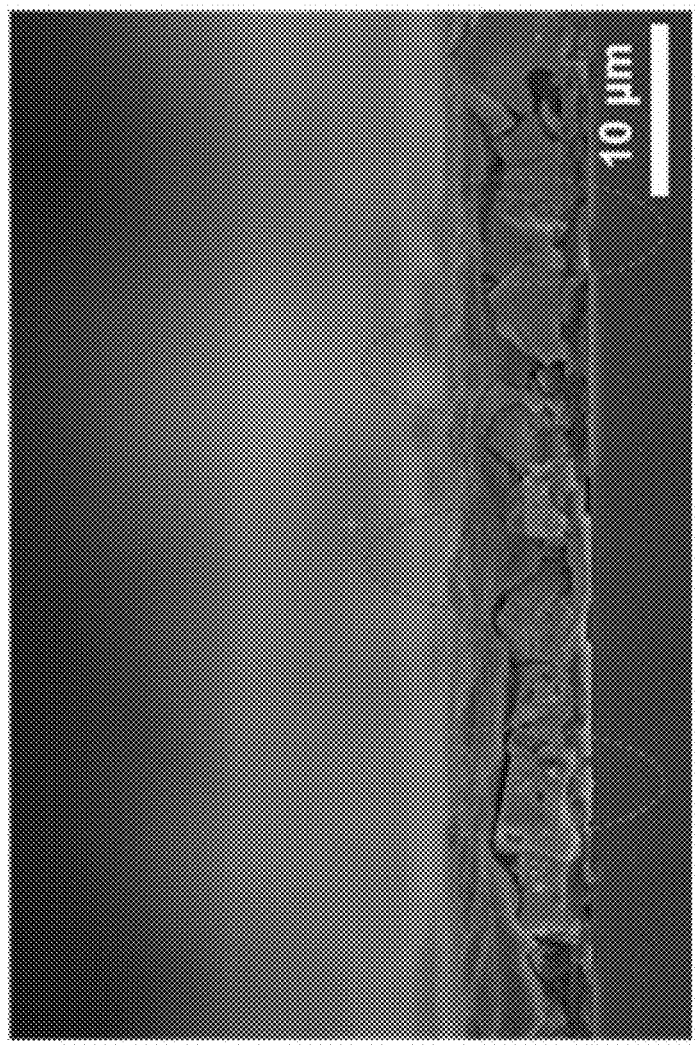
FIG. 9A is a cross-sectional SEM image of the PeLED fabricated using 40 mg/ml PEI solution as the buffer layer.

In addition, the PEI interfacial layer functioned as an electrode work function modifier, which facilitated electron injection by effectively suppressing the injection barrier. Furthermore, as the perovskite freely crystalized during the annealing process as described above, the outermost surface of the $CH_3NH_3PbBr_3$/PEO composite film was still not perfectly smooth even though most pinholes had already been filled by the PEO. As shown in FIG. 11 and FIG. 9A, the PEI buffer layer also helped planarize and smooth the surface defects of the $CH_3NH_3PbBr_3$/PEO composite film by serving as a capping agent to fill the concaves and valleys among the perovskite crystals. The PEI buffer layer further enhanced the interfacial adhesion by serving as a binder between the perovskite layer and the AgNW networks of the top cathode, resulting in a more compacted AgNW top electrode with reduced contact resistance.

Figures 12A, 12B:
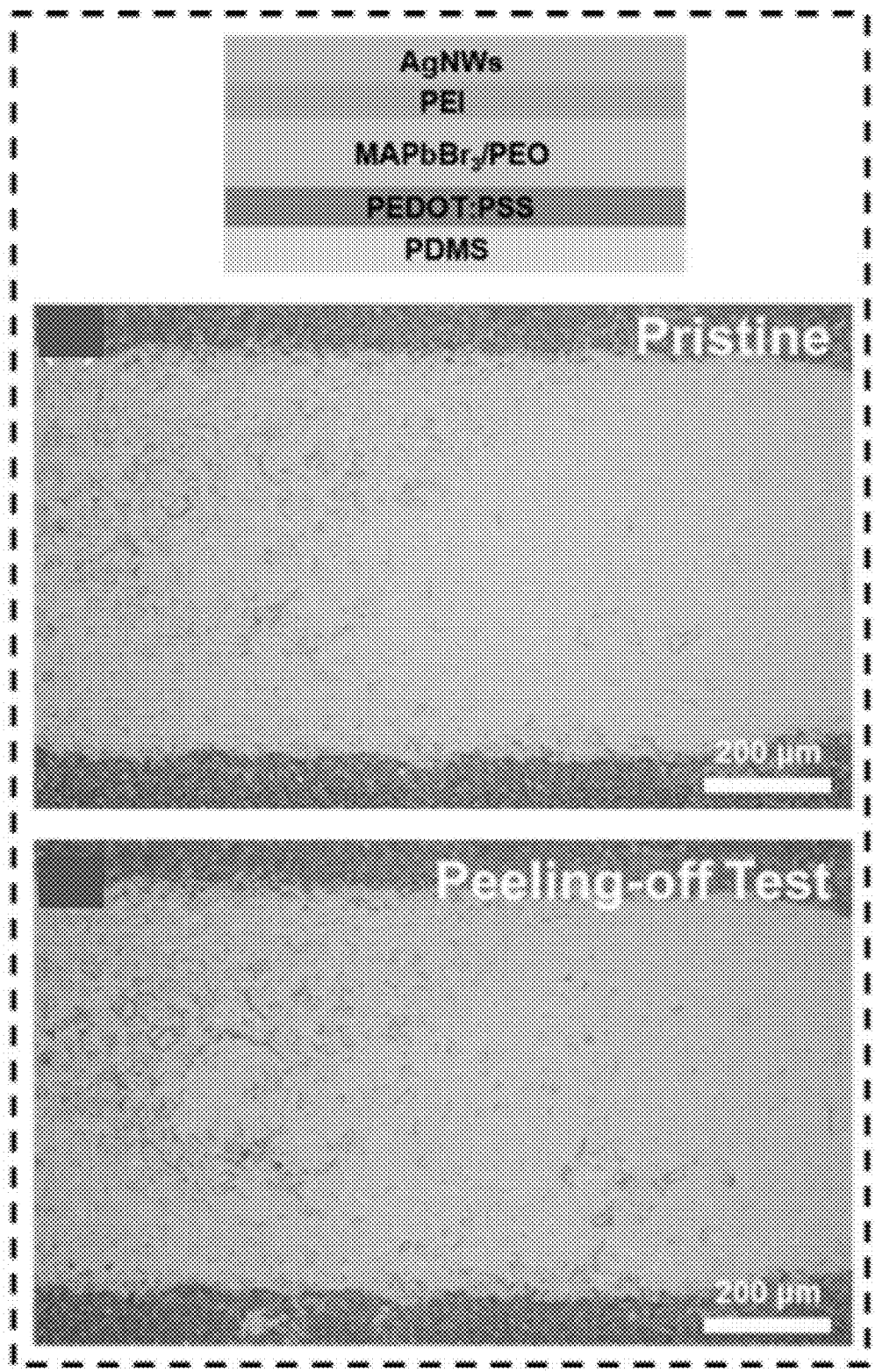
FIG. 12A is a micrograph of a PeLED with a PEI buffer layer before a peeling-off test; schematics to top show the corresponding detailed device structures; the schematic drawing above shows the corresponding detailed device structures.
FIG. 12B is a micrograph of the PeLED with a PEI buffer layer of FIG. 12A after the peeling-off test.
Figures 12C, 12D:
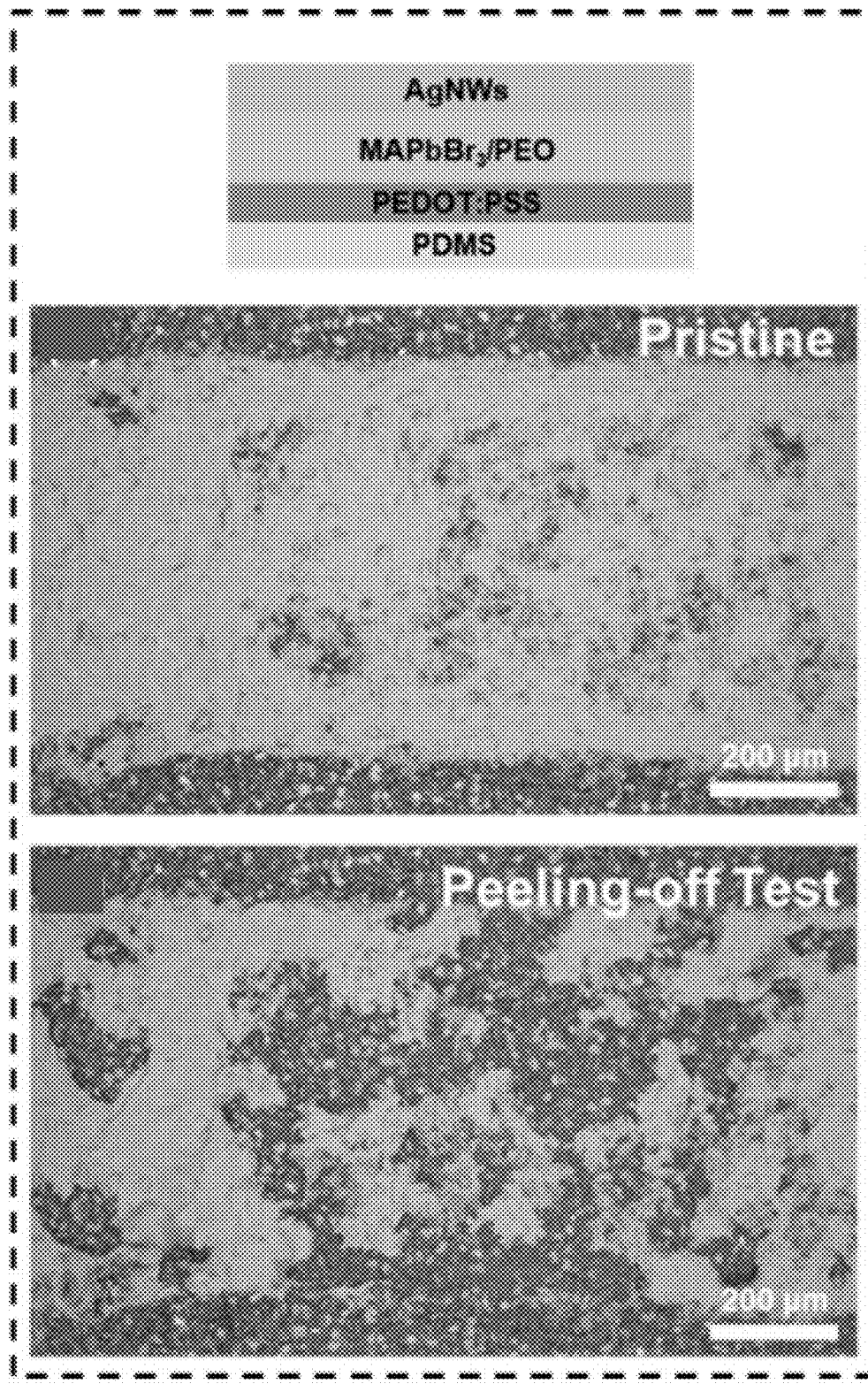
FIG. 12C is a micrograph of a PeLED without a PEI buffer layer before a peeling-off test; the schematic drawing above shows the corresponding detailed device structures.
FIG. 12D is a micrograph of the PeLED without a PEI buffer layer of FIG. 12C after the peeling-off test.

The improved adhesion provided by the PEI buffer layer was assessed using peel tests (FIG. 12), which showed that for the sample with a PEI buffer layer, the printed top AgNW electrode was denser and remained bonded to the functional layer underneath even after an adhesive tape is used. Compared with the pristine PeLEDs without a PEI buffer layer (FIG. 12C), the pristine PeLEDs with a PEI layer (FIG. 12A) exhibited denser and smoother AgNW coverage over the perovskite layer. FIGS. 12B and 12D show the top-view micrographs of PeLEDs after peel tests using adhesive tapes. It can be seen from FIG. 12B that the AgNW top electrode in the PeLED with PEI layer survived the peel test without noticeable electrode delamination. In contrast, for the sample without PEI serving as a binder (FIG. 12D), the AgNW top electrode was destroyed because the AgNWs were easily torn and removed by the adhesive tape.

Figure 2E:
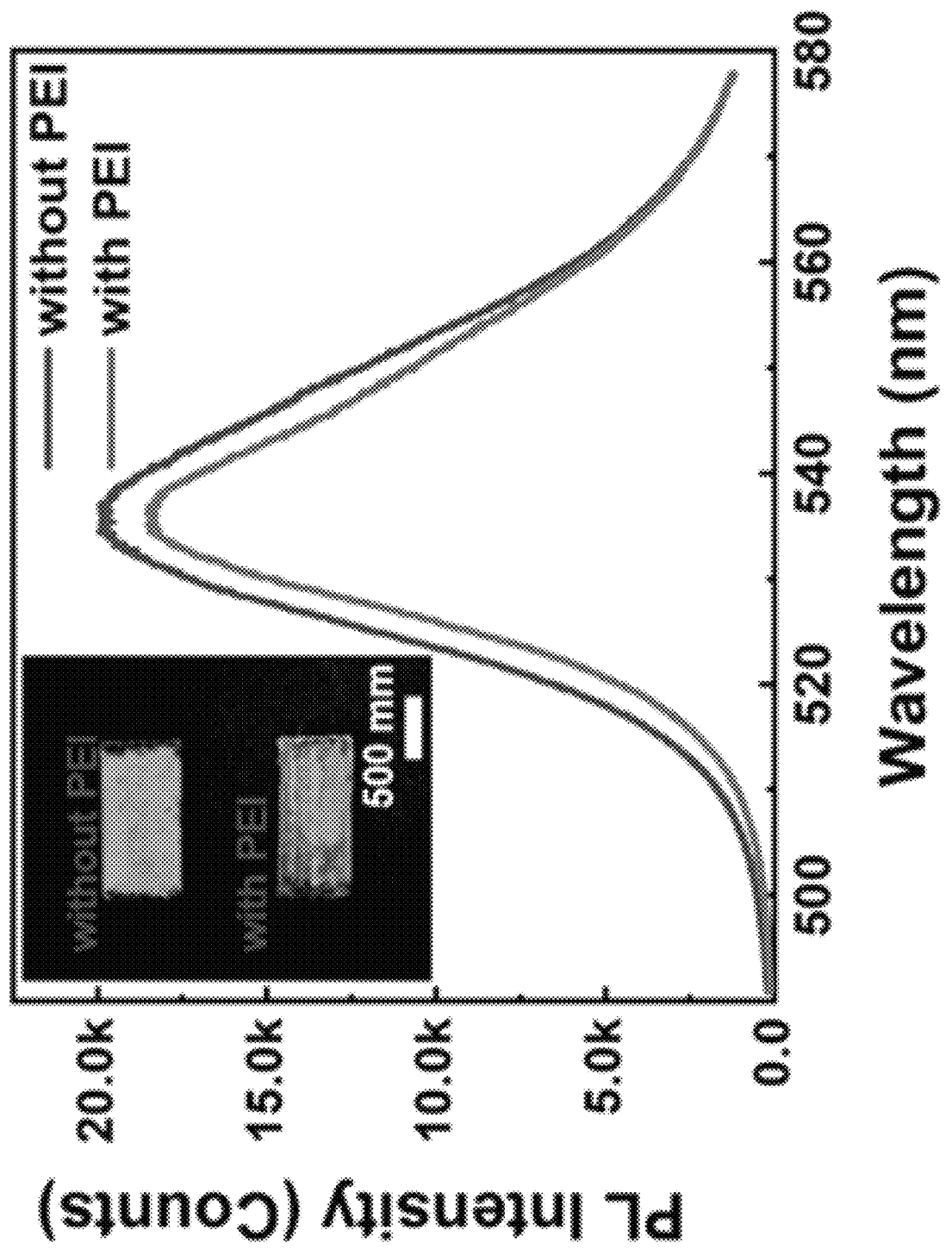
FIG. 2E is a graph comparing the photoluminescence spectra of the printed $CH_3NH_3PbBr_3$/PEO composite film (1:1) with (red trace) and without (black trace) the PEI layer, respectively; the inset shows photographs of the photoluminescence from both samples when placed under a UV light.
Figure 2F:
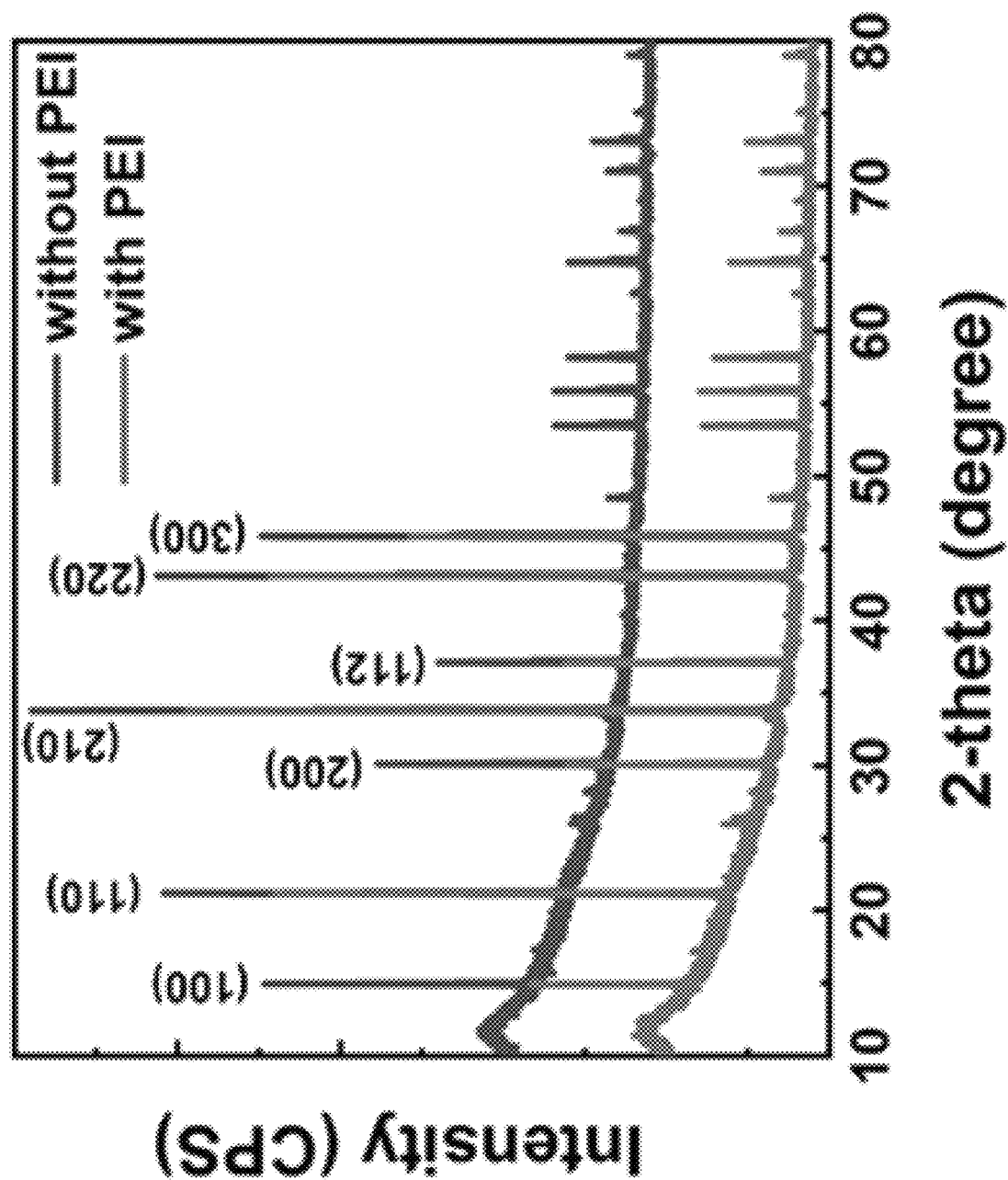
FIG. 2F is a graph comparing the X-ray diffraction pattern of the printed $CH_3NH_3PbBr_3$/PEO composite film (1:1) with (red trace) and without (black trace) the PEI layer, respectively.
Figure 8:
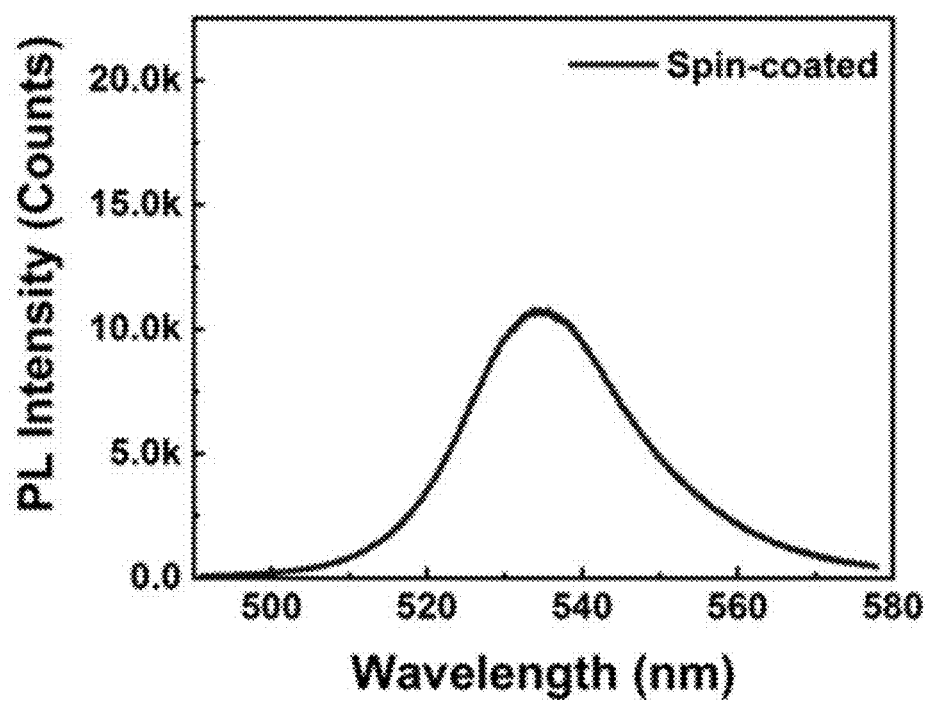
FIG. 8 is a graph showing the photoluminescence spectra of spin-coated $CH_3NH_3PbBr_3$/PEO (1:1) composite film on the glass substrate of FIG. 7.

The optical properties of the $CH_3NH_3PbBr_3$/PEO composite film with and without a PEI buffer layer were analyzed by PL spectroscopy as shown in FIG. 2E. The PL intensity peaks occurred at the same wavelength of 536 nm for both the pristine perovskite film and the film protected by the PEI buffer layer, with only a slight drop in PL intensity for the sample with PEI. These results suggested that the additional PEI protective layer had very little negative impact on the optical performance of the emissive layer. The PL spectra collected from the spin-coated $CH_3NH_3PbBr_3$/PEO film as a reference (FIG. 8) exhibited a nearly identical peak at 534 nm. The insets of FIG. 2E show pictures of the as-prepared $CH_3NH_3PbBr_3$/PEO composite film without (top) and with (bottom) a PEI buffer layer when illuminated under a UV lamp, indicating no obvious degradation in terms of color purity and luminescence intensity due to the PEI buffer layer. The crystallinity of the pristine and PEI-protected $CH_3NH_3PbBr_3$/PEO composite film was further examined by X-ray diffraction (XRD). The samples were all prepared on top of the PEDOT:PSS/PEO bottom electrode on a PDMS substrate. As shown in FIG. 2F, the location and the corresponding intensity of the diffraction peaks of these two samples were highly consistent with each other, confirming that the PEI protective layer did not alter the crystalline structure of the perovskite film.

For the top cathode, an IPA-based AgNW dispersion with a concentration of 20 mg/ml was used to develop the procedure and printing recipe described above. AgNWs dispersed in IPA solvent were selected to print the top cathode because IPA is one of the few solvents that did little damage to the perovskite film as discussed above.

To assess the effect of variations in the inkjet printing process used to fabricate the AgNW electrodes on their sheet resistance, AgNW electrodes were produced using from 5 to 40 printing passes. FIG. 3A shows measured AgNW sheet resistance (Rs) as a function of the number of printing passes used during fabrication. As the number of printing passes increased from 5 to 40, the Rs decreased drastically from 6900 0/sq to 2.2 0/sq. A good tradeoff happened at around 10 printing passes with an acceptably low Rs of 55.2 0/sq and a reasonable fabrication time (less than 30 s). Consequently, the experiments described herein fabricated the AgNW electrodes using 10 printing passes unless otherwise noted.

Typically, IPA-based inks exhibit excellent wettability on polymer substrates, causing the ink to readily bleed on these types of substrates, making precise micro-scale patterning challenging to achieve. The formulation of the IPA-based AgNW ink was modified to enhance the precision of micro-scale patterning using the printer-based fabrication method described above. In one experiment, varying amounts of ethylene glycol (EG) were added to tune the rheology and wetting properties of the AgNW ink. FIG. 3B exhibits the results of this experiment that determined that sheet resistance increased drastically from 55 0/sq to 3.6 MQ/sq as the EG volume ratio increased from 0 to 50 vol %, which was attributed to the diluted concentration of conductive nanowires. In addition, the contact angle between the AgNWs/IPA/EG mixed ink droplets and the substrate gradually increase from 27.7° C. to 67.1° C., indicating that the wettability of the ink was lowered by the inclusion of EG, rendering the AgNWs/IPA/EG mixed ink formulation more suitable for achieving high-resolution printing as compared to the EG-free formulation. The morphologies of AgNW networks printed using ink formulations with different proportions of EG are compared in FIGS. 3C, 3D, 3E, 3F, 3G, and 3H with the insets showing the zoomed-in view of the films. For the AgNW networks printed with pure IPA-based AgNW ink without EG additive (FIG. 3C), it is obvious that the nanowires were pulled towards the edges due to the coffee-ring effect caused by the fast evaporation of the IPA solvent. Such nonuniform nanowire networks resulted in poor coverage of printed top electrodes and local breakdown of the PeLED device. The addition of EG to the AgNW ink formulation effectively tuned the rheology of ink and reduced the possibilities of nozzle clogging by contributing to a more stable and uniform AgNW dispersion. With increasing EG volume ratio in the AgNW ink formulation, the coffee-ring effect was practically eliminated. Only a few nanowire aggregations were observed in AgNW ink with 10 vol % EG (FIG. 3D), and nanowire aggregations effectively vanished at higher EG concentrations (FIGS. 3E, 3F, 3G, and 3H). However, the additional EG in the AgNW ink formulation also resulted in a decrease in AgNW network densities as evidenced by the degradation of electrical conductance summarized in FIG. 3B. For the sample with 50% EG shown in FIG. 3H, the nanowire density was too low to form percolating networks and the film was almost not conductive. The effect of the EG additive on the wettability of the mixed AgNW ink was also observed as a decrease in the width of printed features. FIG. 3I summarizes printing path widths of features as a function of the vol % of EG in the AgNW ink formulation. The width of the printed features (with 2 printing passes) shrank from 677 μm to 389 μm with increasing EG ratio, suggesting that the ink seepage issue was better controlled by the addition of EG.

Considering all the factors mentioned above, the optimal AgNW ink formula was chosen to be 80 vol % IPA-based AgNWs with ambient EG. The printed electrode samples using this ink formulation exhibited a sheet resistance of 220 Q/sq and reasonable capability for precise printing.

The underlying mechanism behind the use of EG to tune the ink drying behavior and to enhance the quality of deposited AgNW networks was attributable to EG's high boiling point (197° C.) and high viscosity. The coffee ring effect was mainly due to the faster evaporation along the edge interfacial line, which induced a continuous compensating flow carrying the solute (AgNWs in this case) from the droplet center to the pinned contact line. The coffee effect was exacerbated by the fabrication of the samples on a heating pad to expedite the annealing process during printing; the elevated temperature of the substrate accelerated the outward replenishing flow and strengthen the coffee ring effect. By adding EG, the increase in boiling point slowed down the unbalanced evaporation rate difference between the central and edge regions. The addition of EG to the ink formulation also increased ink viscosity to suppress the migration of nanowires towards the marginal interface.

The results of these experiments demonstrated that PeLEDs could be successfully fabricated on flexible substrates using the printer-based fabrication method described herein.

Example 2 Performance of PeLEDs

To evaluate the performance of PeLEDs produced using the disclosed printer-based fabrication methods as described in Example 1, the following experiments were conducted.

The current density-voltage (J-V) and luminance-voltage (L-V) relationships of the PeLEDs were characterized using a measurement setup, that included a three-axis manual stage holding the PeLED sample, a z-axis linear stage holding a metal probe used to apply voltage to the sample, a silicon photodiode used to capture the light emission, and other optomechanical components purchased from ThorLabs. The PeLED device current and photodiode photocurrent were measured using a semiconductor device analyzer (Keysight B1500A). For bending tests, the sample was mounted onto a syringe pump whose motion cycles could be precisely controlled. The flat state and the bending state with desired curvature radius were implemented by adjusting the initial and ending positions of the syringe pump.

Figure 4A:
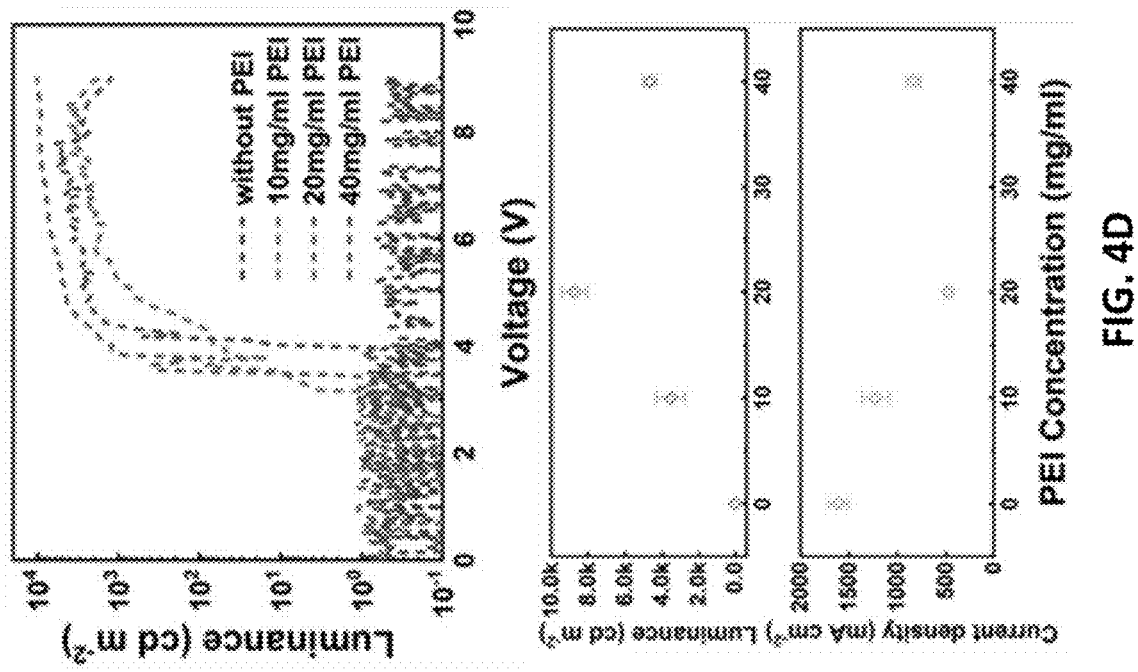
FIG. 4A is a graph comparing the current density versus voltage characteristics of the all-inkjet-printed $CH_3NH_3PbBr_3$ PeLEDs with printed PEI buffer layers of different concentrations.
Figure 4B:
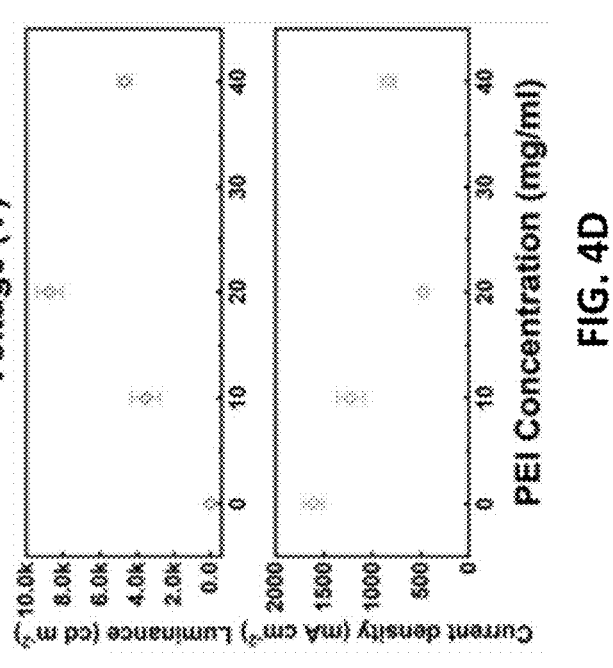
FIG. 4B is a graph comparing the luminance versus voltage characteristics of the all-inkjet-printed $CH_3NH_3PbBr_3$ PeLEDs fabricated with printed PEI buffer layers of different concentrations.
Figure 4C:
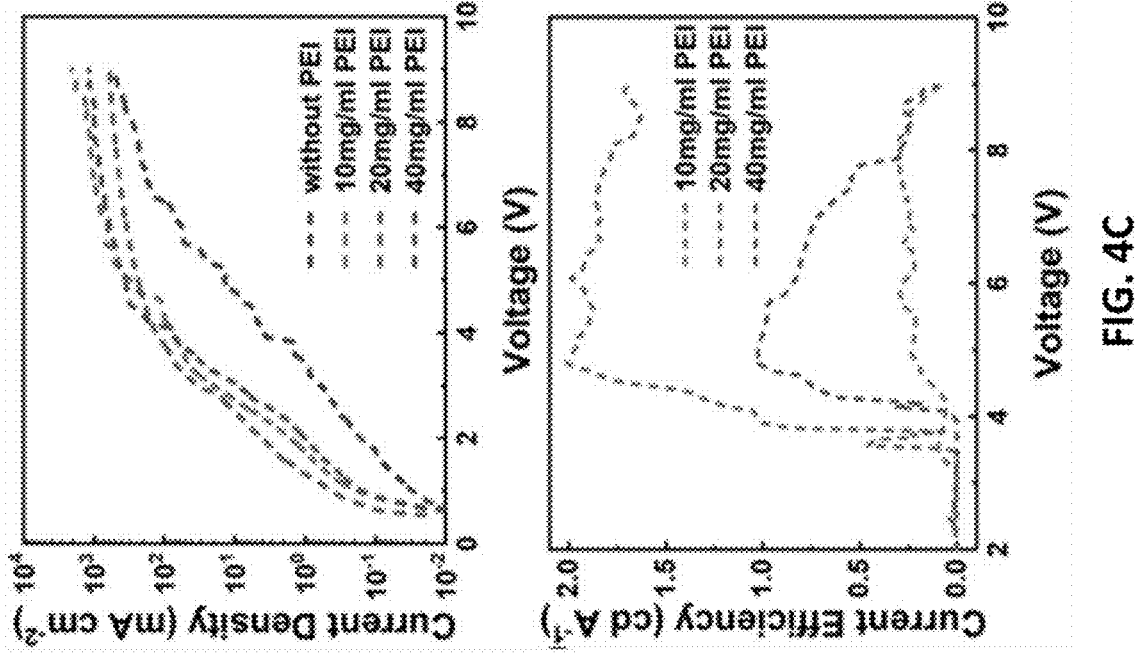
FIG. 4C is a graph comparing the current efficiency versus voltage characteristics of the all-inkjet-printed $CH_3NH_3PbBr_3$ PeLEDs fabricated with printed PEI buffer layers of different concentrations.

The current density-voltage (J-V), luminance-voltage (L-V), and current efficiency-voltage (CE-V) characteristics of PeLED samples with PEI buffers layer configurations ranging from no PEI layer to a 40 mg/ml PEI buffer layer were measured and the results are summarized in FIGS. 4A, 4B, and 4C. As discussed above, the PEI buffer layer was printed on top of the $CH_3NH_3PbBr_3$/PEO emissive layer before the printing of the top AgNW cathode. As discussed in Example 1, the PEI interfacial layer protected the perovskite emissive film from being attacked by the solvent in the AgNW ink during the top electrode printing step, which resulted in improved device yield.

However, because the branched PEI polymer of the buffer layer is an insulating polymer, the buffer layer also weakened carrier transport, and thus a tradeoff was made between device yield and device performance. The thickness of the PEI buffer layer was tuned by varying the concentration of the PEI solution. To identify the concentration of PEI solution that offered the best device performance, PeLED devices without a PEI buffer layer and with 10, 20, and 40 mg/ml of PEI printed on top of the $CH_3NH_3PbBr_3$/PEO composite film.

As shown in FIG. 4A, the J-V curves all exhibited the expected exponential relationship with bias voltage and maximum current densities $J_{max}$ of 473 mA/cm$^2$, 2100 mA/cm$^2$, 601 mA/cm$^2$, and 1232 mA/cm$^2$ (measured at 9 V) were achieved in PeLEDs without and with 10, 20, 40 mg/ml PEI, respectively. The decrease of $J_{max}$ for increasing PEI concentrations from 10 mg/ml to 20 mg/ml was attributed to the insulating nature of PEI, while the inconspicuous rise for the sample with 40 mg/ml PEI was likely explained by the nonuniform PEI film coverage caused by the printing of extremely high-viscosity PEI solution. Compared with the flat PEI capping layer with a uniform thickness in FIG. 11, the content of PEI in 40 mg/ml solution was remarkably high and became too viscous to be carried by the solvent for uniform coverage. As a result, the PEI content accumulated in valleys among perovskite crystals, resulting in some regions being thicker (red-circled regions in FIG. 9A) and some other regions being thinner (blue-circled regions in FIG. 9A) to allow more current to pass through. The nonuniform PEI buffer layer resulted in defective or even dead pixels on lit PeLEDs (FIG. 9B).

As shown in FIG. 4B, the device without the PEI buffer layer could not be lit up due to damage to the emissive layer caused by the AgNW printing process. The PeLEDs with PEI buffer layers exhibited turn-on voltages (defined as the voltage applied with luminance intensity of 1 cd/m$^2$) of 3.18 V, 3.46 V, and 4.02 V, and maximum luminance intensities $L_{max}$ of 4325 cd/m$^2$, 10227 cd/m$^2$, and 6239 cd/m$^2$, respectively. The gradual increase in turn-on voltages with higher PEI mass fractions in the buffer layers also corresponded to the PEI's insulating nature. For all tested devices, the luminance intensity increased abruptly between 3~4 V and reached a relatively flat plateau at bias voltages in excess of about 5V.

For the CE-V curves shown in FIG. 4C, the three PeLED samples with 0, 20, and 40 mg/ml of PEI in the buffer layers exhibited maximum current efficiency $CE_{max}$ of 0.32 cd/A (at 8.12 V), 2.01 cd/A (at 4.82 V), and 1.04 cd/A (at 4.83 V), respectively, and the corresponding external quantum efficiency (EQE) was calculated to be 0.128% (4070 cd/m$^2$), 0.804% (4362 cd/m$^2$), and 0.416% (2566 cd/m$^2$), respectively.

Figure 4D:
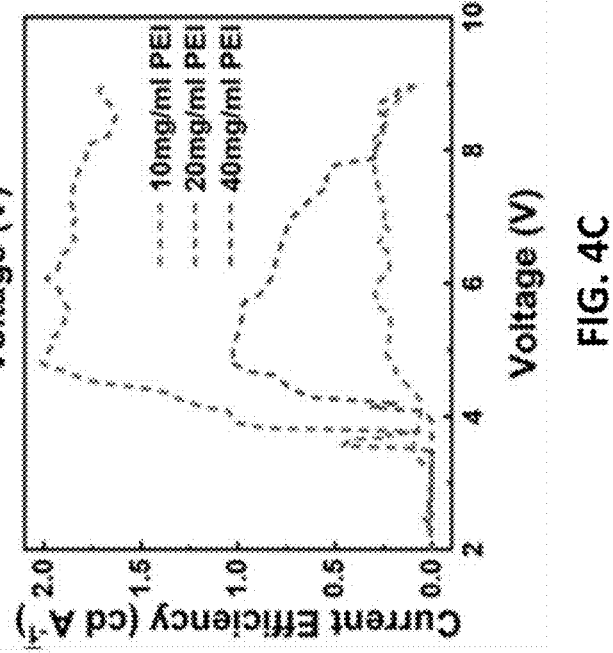
FIG. 4D is a graph showing luminance and current density versus PEI concentration with a 7 V bias voltage.
Figure 4E:
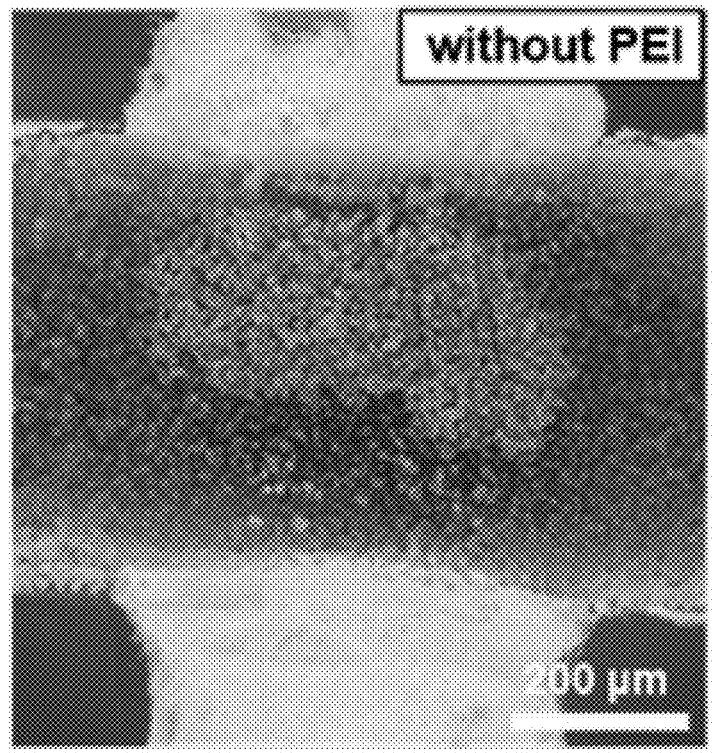
FIG. 4E is an optical micrograph of the as-prepared PeLED without an additional PEI protective layer as viewed from the bottom PEDOT:PSS/PEO anode side.
Figure 4F:
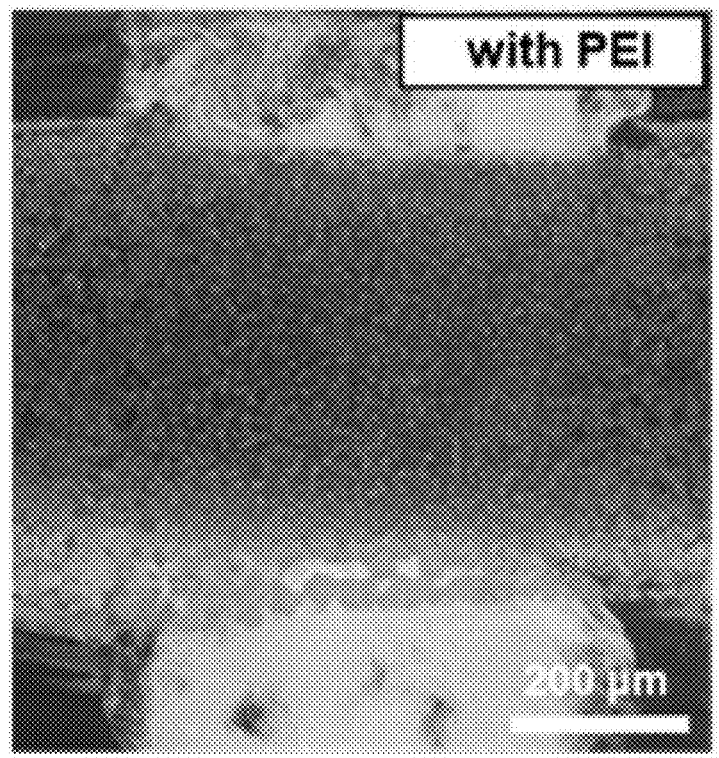
FIG. 4F is an optical micrographs of the as-prepared PeLED with an additional PEI protective layer as viewed from the bottom PEDOT:PSS/PEO anode side; the PEI layer is effective in protecting the perovskite film from being dissolved during the AgNW printing process.

FIG. 4D summarizes the luminance and current densities of the PeLEDs measured at 7V bias voltage as a function of the PEI concentrations used for printing the buffer layer. The results indicated that the 20 mg/ml PEI offered the highest luminance of 8754 cd/m$^2$ but the lowest current density of 474 mA/cm$^2$. As indicated in Table 2, the low turn-on voltage, high luminance, and efficiency demonstrated by the PeLEDs evaluated in these experiments were among the best compared to previously reported flexible PeLEDs adopting MAPbBr$_3$ polycrystalline films as the emissive layer (Table 2).

The mechanical flexibility and durability of the flexible PeLEDs fabricated using the printer-based methods as described in Example 1 were also characterized. As described in Example 1, the PeLED devices were printed on top of a PDMS substrate with a flexible polyethylene terephthalate (PET) support. Because each layer in the printed PeLEDs was intrinsically stretchable to some extent, the device was configured to withstand significant deformation with little degradation of function.

The current density and luminance of the device deformed at a 3.5 mm curvature radius were assessed before and after 10 or 100 bending cycles. As shown in FIG. 5A, the three J-V curves nearly overlapped with each other and did not exhibit any noticeable differences after 100 bending cycles. The L-V curves in FIG. 5B also demonstrated a high degree of consistency with only a slight drop in luminance intensity from 8885 cd/m$^2$ (fresh device) to 8250 cd/m$^2$ (after 100 bending cycles) at 9.0V bias voltage. As shown in FIG. 5C, when bent to a concave shape with a 3.5 mm radius, the PeLED remained lit and kept emitting stable green light.

Figures 13A, 13B:
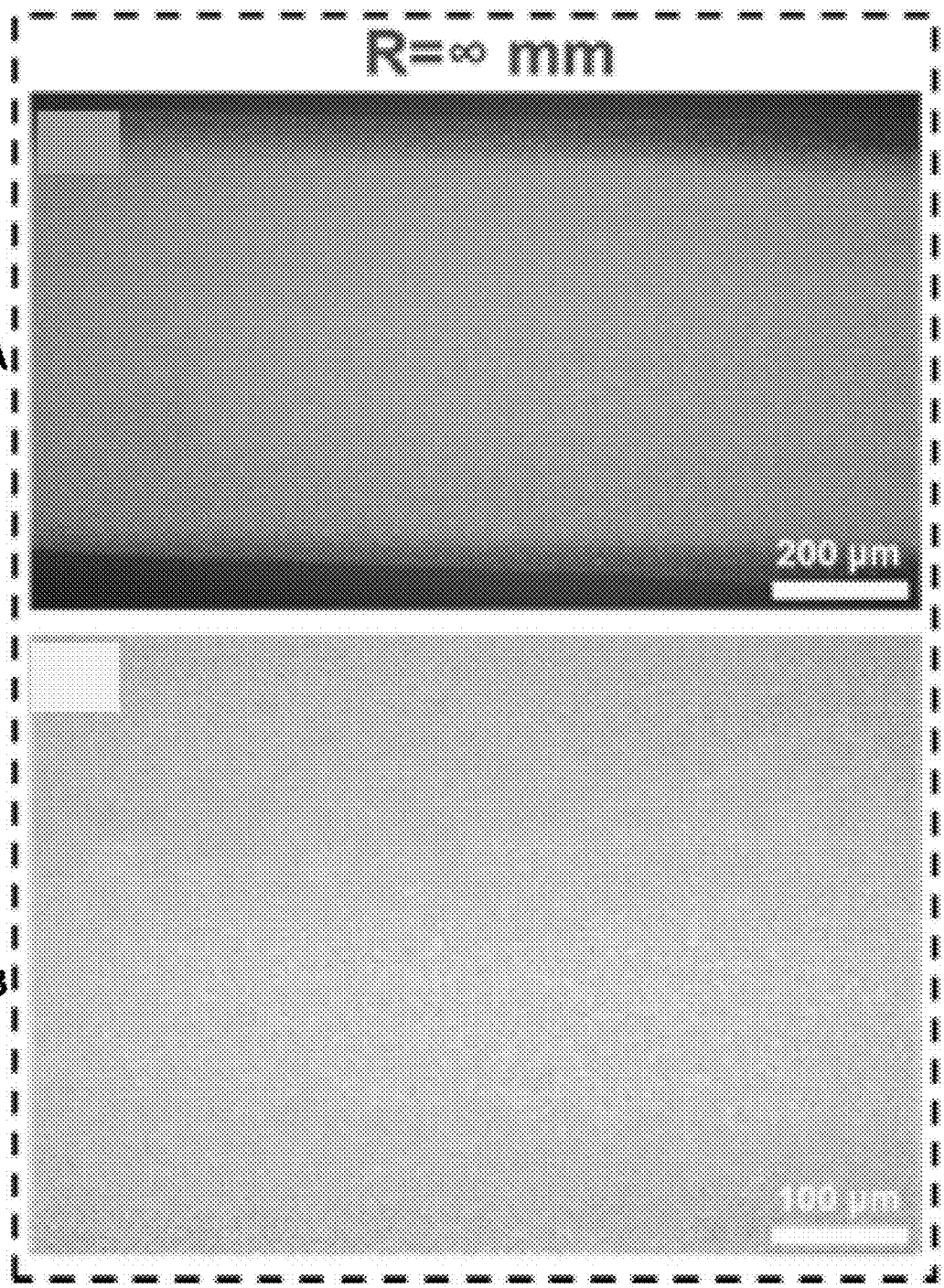
FIG. 13A is an optical micrograph of the pristine PeLEDs before subjecting to the bending tests.
FIG. 13B is a close-up view of the pristine PeLED of FIG. 13A.
Figure 13C:
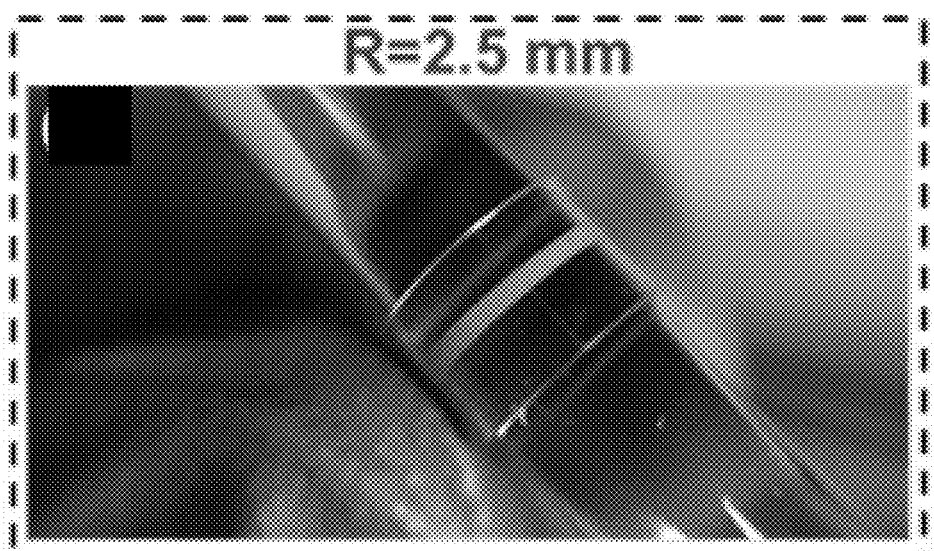
FIG. 13C is a photograph of a PET/PDMS/PEDOT:PSS/Perovskite sample wrapped on a glass rod with a radius of 2.5 mm during a bending test.
Figure 13D:
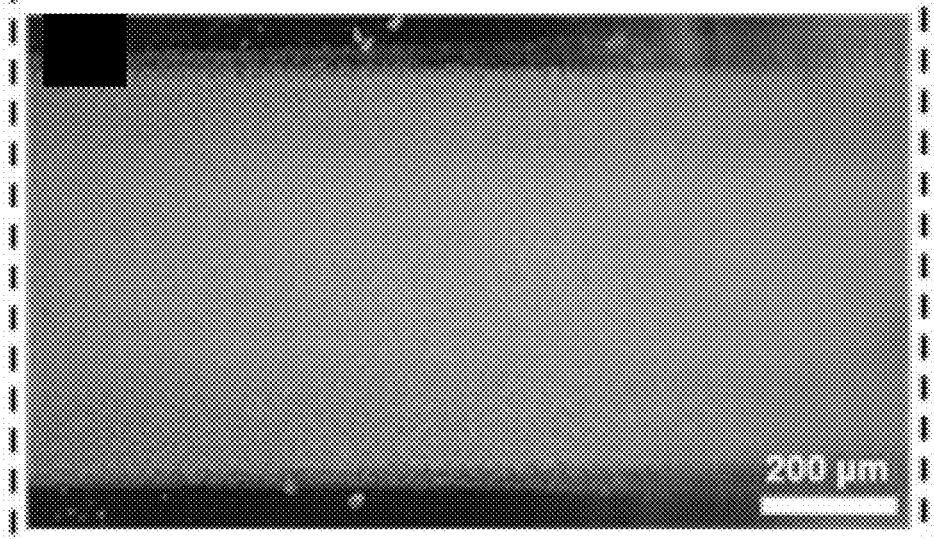
FIG. 13D is an optical micrograph of the PeLED of FIG. 13A after the bending test of FIG. 13C.
Figure 13E:
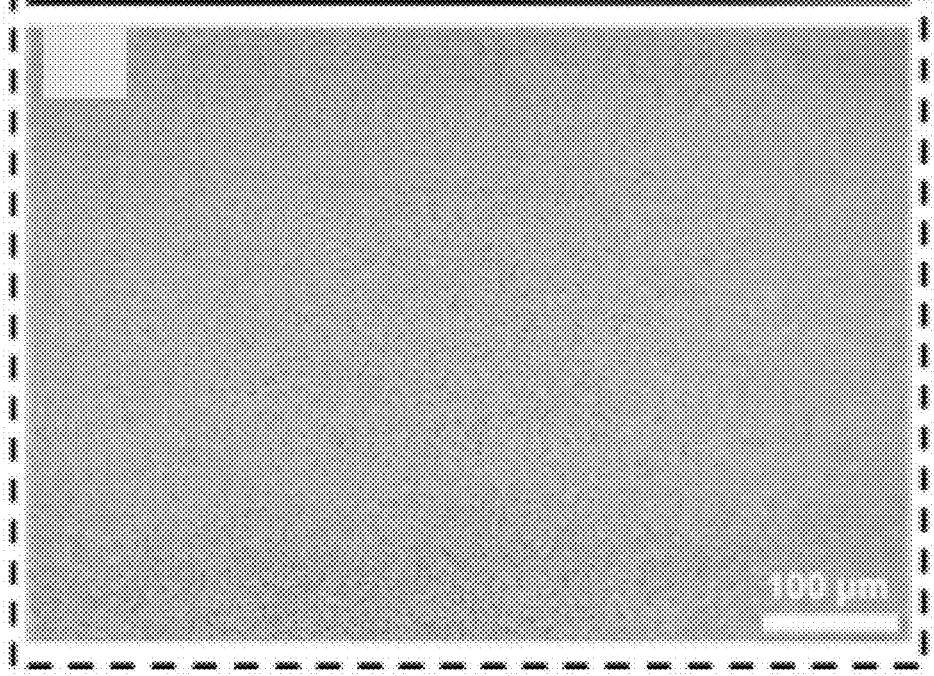
FIG. 13E is a close-up view of the PeLED of FIG. 13D.
Figure 13F:
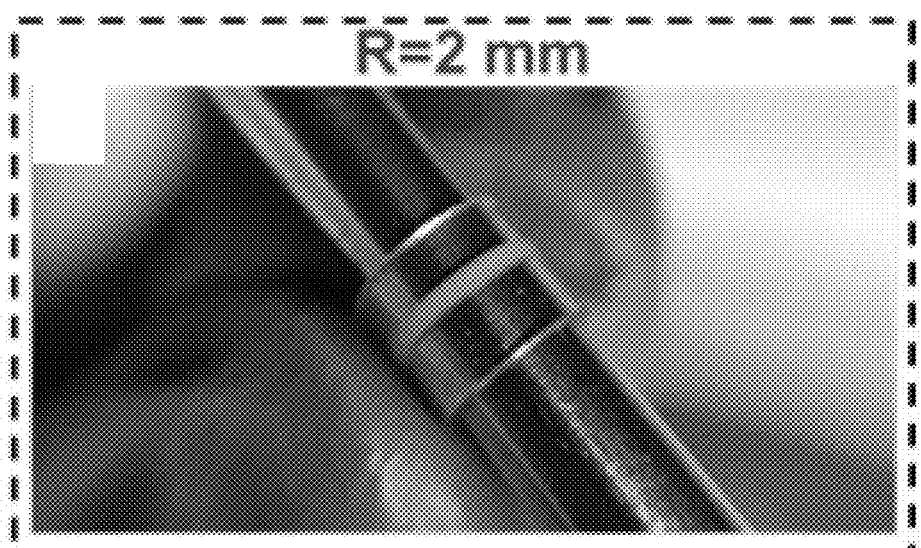
FIG. 13F is a photograph of a PET/PDMS/PEDOT:PSS/Perovskite sample wrapped on a glass rod with a radius of 2 mm during a bending test.
Figure 13G:
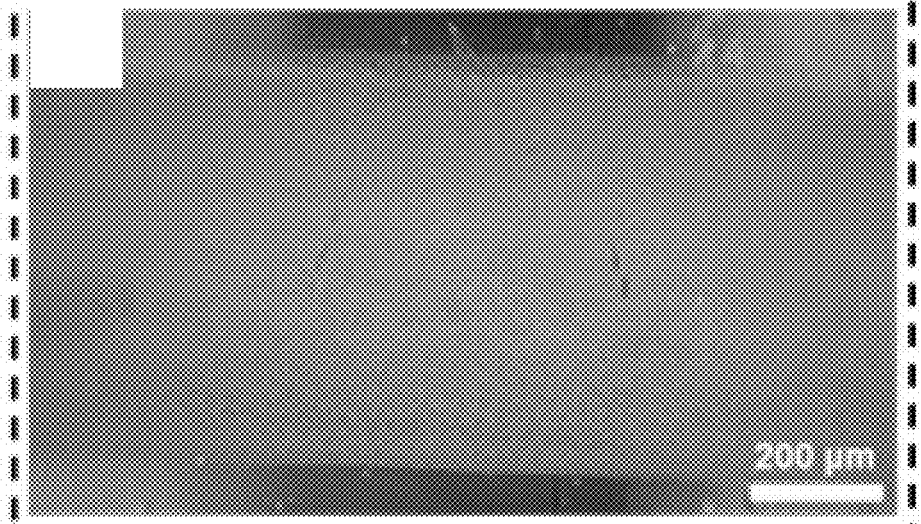
FIG. 13G is an optical micrograph of the PeLED of FIG. 13A after the bending test of FIG. 13F.
Figure 13H:
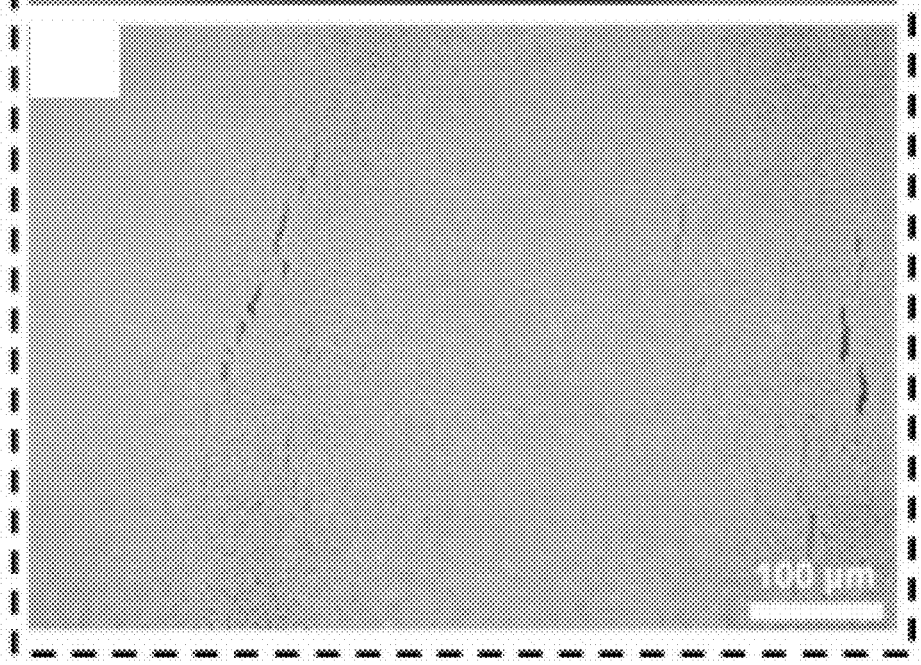
FIG. 13H is a close-up view of the PeLED of FIG. 13G.

The bending limits of the all-inkjet-printed flexible PeLEDs were assessed by inspecting the surface morphology of the perovskite film under deformation at various curvature radii. A printed PeLED was wrapped conformally onto a glass rod (FIG. 13C) and a steel rod (FIG. 13F) sequentially. Compared with the morphology of as-prepared $CH_3NH_3PbBr_3$/PEO film under flat (undeformed) conditions (FIGS. 13A and 13B), no noticeable damage occurred to the emissive layer when the sample was bent to a curvature radius of 2.5 mm (FIGS. 13D and 13E). In contrast, several tiny cracks started to appear when the sample was bent to a radius of 2 mm (FIGS. 13G and 13H). Based on the above results the bending limit of the flexible PeLED devices was determined to correspond to a curvature radius of about 2.5 mm (FIG. 13C).

In another experiment, the tensile strains induced in the PeLEDs during the bending tests described above were estimated as described below. Variables used to estimate tensile strains are illustrated schematically in FIG. 14.

Figure 14:
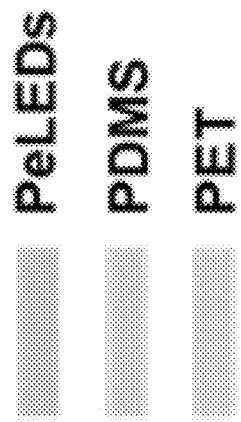
FIG. 14 is a schematic diagram showing the variables used for the estimation of tensile strain induced in the PeLEDs during bending tests.
Figure 14:
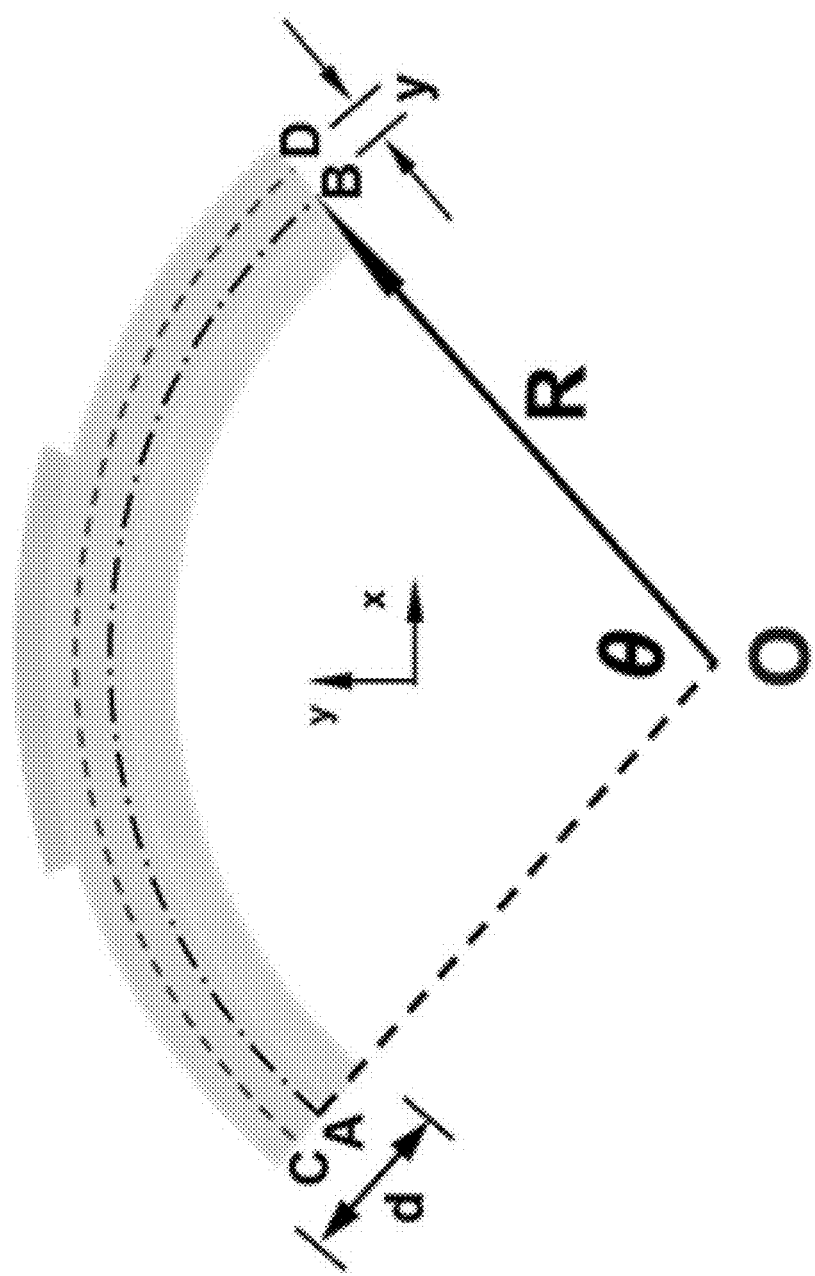

Referring to FIG. 14, a neutral line was defined along the portion of the PeLED that did not change length during the bending test. Along the neutral line, y=0 and stresses $\varepsilon_x$>0 for y>0; $\varepsilon_x$<0 for y<0. The length of the neutral line AB is expressed by equation (1):

$$L_{AB} = R\theta \qquad \text{Eqn. (1)}$$

The length of a line CD offset by a distance y from the neutral line is given by Equation (2):

$$L_{CD} = (R+y)\theta \qquad \text{Eqn. (2)}$$

The axial strain at a distance y from the neutral line is given by Equation (3):

$$\varepsilon_x = \frac{L_{CD} - L_{AB}}{L_{AB}} = \frac{(R+y)\theta - R\theta}{R\theta} = \frac{y}{R} \qquad \text{Eqn. (3)}$$

The maximal tensile strain occurs on the upper surface, as given by Equation (4):

$$\varepsilon_x = \frac{y}{R} = \frac{\frac{1}{2}d}{R} = \frac{d}{2R} \qquad \text{Eqn. (4)}$$

For the PeLED deviceS fabricated as described in Example 1 above, the dimensions of elements within the bending test sample (see FIG. 14) summarized in Table 1 below were used to estimate the tensile strain as described above.

TABLE 1

Dimensions of PeLED Test Sample for Tensile Strain Estimate

| | |
|---|---|
| PeLED thickness ($d_1$) | 10 μm |
| PDMS thickness ($d_2$) | 190 μm |
| PET thickness ($d_3$) | 150 μm |
| Total sample thickness d = ($d_1 + d_2 + d_3$) | 350 μm |
| Bending radius of sample (D) | 2.5 mm |

The maximum tensile strain on the upper surface of the PeLED was calculated by substituting the dimensions from Table 1 into Eqn. (4):

$$\varepsilon_x = \frac{d}{2R} = \frac{0.35}{2 \times 2.5} \times 100\% = 7\% \qquad \text{Eqn. (5)}$$

Figure 15:
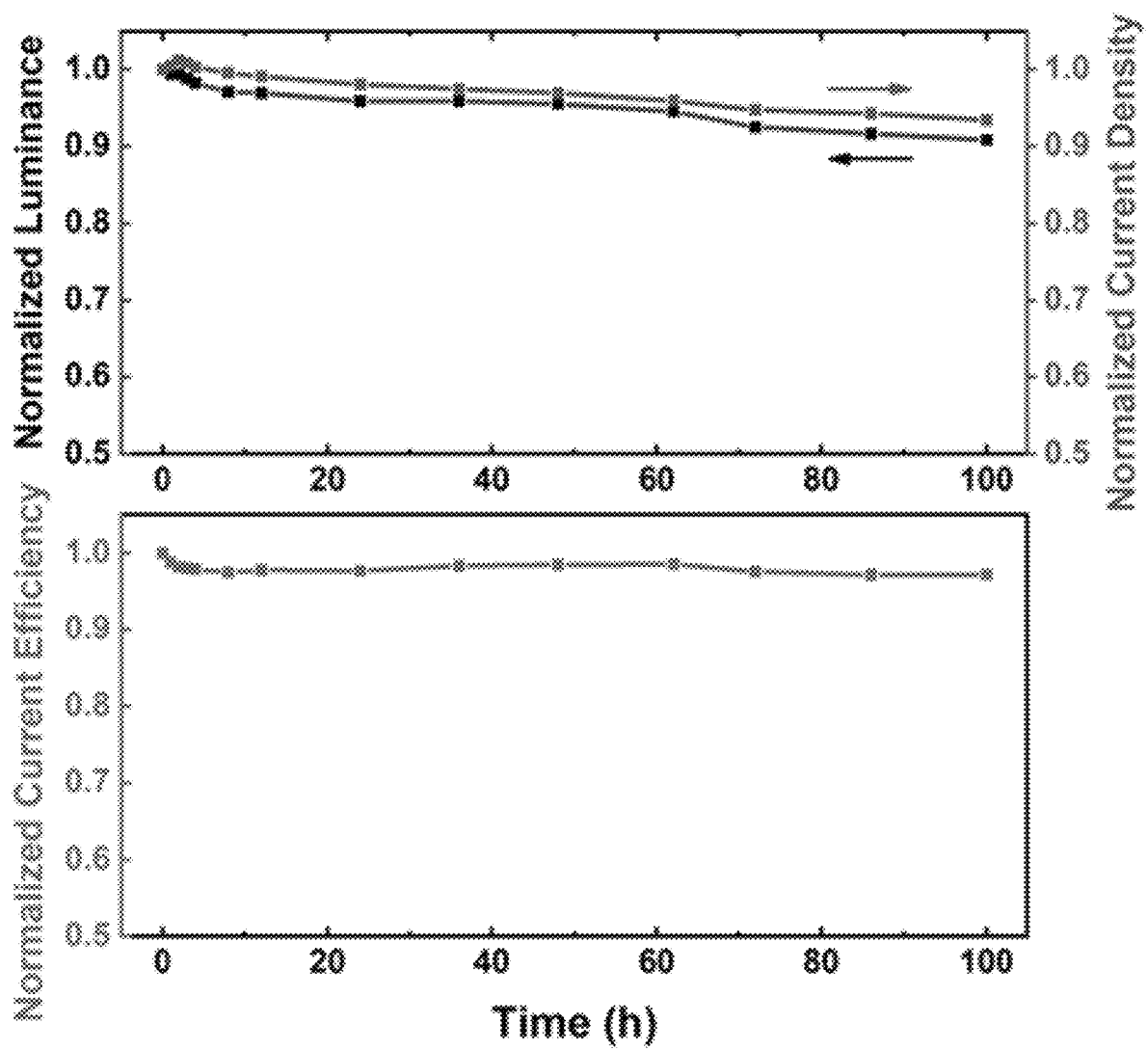
FIG. 15 contains graphs of normalized luminance and normalized current density (upper graph) as well as the normalized current efficiency (lower graph) of the all-inkjet-printed PeLEDs measured after being stored in ambient conditions for various numbers of hours; room temperature was 25° C. and the relative humidity was 40%.

Under such bending conditions, the tensile strain induced in the actual device was estimated to be around 7% (see Eqn. (5)). The durability of the flexible PeLEDs was further tested up to 5000 bending cycles. At the conclusion of this assessment, the normalized luminance only dropped by 5.5% and the corresponding current efficiency decreased by less than 15% after 5000 bending cycles (FIG. 5D), which further confirmed that a curvature radius of 2.5 mm was a safe bending limit for the PeLED device. The demonstrated mechanical robustness under such strain levels exceeded most of the previously reported flexible PeLEDs, as summarized in Table 2 below.

air due to its sensitivity to oxygen and moisture; perovskite optoelectronic devices are typically fabricated and stored inside glove boxes with protective inert gases to reduce degradation. Because the active layer of the PeLED devices disclosed herein contains polycrystalline perovskite filled by polymer binder in the voids, it is more difficult for the oxygen and moisture to penetrate the emissive layer and therefore the degradation can be significantly slowed down. As shown in FIG. 15, the normalized luminance and current density of the PeLEDs fabricated as disclosed herein experienced only slight drops of around 9.2% and 6.6%, respectively, after the sample PeLED devices were exposed to ambient air environments (temperature 25° C., humidity 40%) for 100 hours. The normalized current efficiency stayed nearly the same as the initial value without obvious decay over the same exposure period.

The results of these experiments demonstrated that the PeLED devices fabricated using the printer-based method described herein exhibited electrical performances that were at least comparable to existing flexible LED devices (see Table 2). The disclosed PeLED devices maintained performance at deformations corresponding to bending radii up to about 2.5 mm, and over the duration of at least 1000 bending cycles. Further, the inclusion of the PEI buffer layer in the disclosed PeLED devices provided for their operation in ambient conditions for extended periods of up to about 100 hours or longer with only modest degradation of performance.

Example 3 Fabrication of Perovskite Optoelectronic Devices Using Handwriting Methods To demonstrate the fabrication and performance of handwriting perovskite optoelectronic devices, the following experiments were conducted.

Figure 16A:
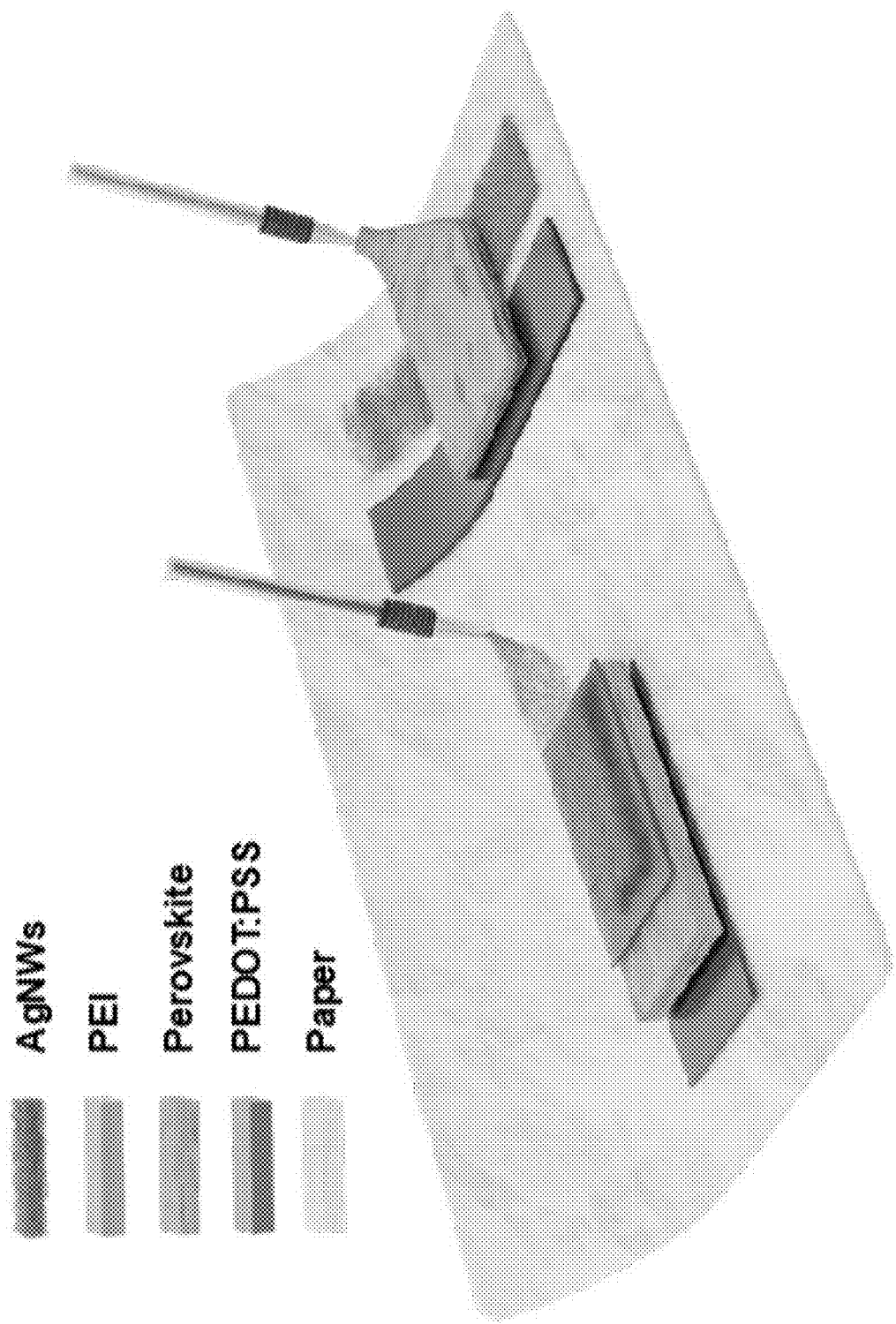
FIG. 16A is a schematic diagram illustrating the universal handwriting approach for fabricating perovskite optoelectronic devices with either vertical or lateral structures.

Processes of handwriting perovskite optoelectronic devices in either vertical perovskite photodiodes (left) or lateral perovskite photoconductors (right) are schematically illustrated in FIG. 16A. In various aspects, the process disclosed herein is widely applicable to many kinds of common substrates and the deposition of various inks may be deposited using typical handwriting habits, including, but not limited to, from bottom to top, from left to right, and layer by layer.

TABLE 2

Comparison of Bending Characteristics of PLED Devices

| Substrate | Perovskite emitter | Device structure | Turn-on (V) | Max. $L^{a)}$ (cd/m$^2$) | Max. $CE^{b)}$ (cd/A) | Bending radius (mm) | Tensile strain (%) | Microscale patternable | Ref |
|---|---|---|---|---|---|---|---|---|---|
| PET | MAPbBr$_3$ | ITO/Buf-HIL/MAPbBr$_3$/TPBI/LiF/Al | 7.8 | 24 | 0.02 | 10.5 | 0.95 | No | [1] |
| Polyacrylate | MAPbBr$_3$ | CNT/MAPbBr$_3$/AgNWs | 2.6 | 360 | 0.6 | 5 | 2 | No | [2] |
| PET | MAPbBr$_3$ | Graphene/Buf-HIL/Perov/TPBI/LiF:Al | 4 | 13000 | 16.1 | — | 0.7-5.3 | No | [3] |
| PEN | MAPbBr$_3$ | ITO/PEDOT:PSS/Perov/BCP/LiF:Al | 3.5 | 2700 | 0.42 | — | — | No | [4] |
| PDMS | MAPbBr$_3$ | PEDOT:PSS/Perov-PEO/PMMA/In | 3 | 4257 | 1.77 | 1 | — | No | [5] |
| PDMS | MAPbBr$_3$ | ACUF/ACUF/AU/PEDOT:PSS/Perov-PEO/EInGa | 2.5 | 14770 | 1.5 | 1 | — | Yes | [6] |
| PDMS | MAPbBr$_3$ | PEDOT:PSS/Perov/PEI/AgNWs | 3.4 | 10227 | 2.01 | 2.5 | 7.0 | Yes | This work |

A long-term aging test was conducted to study the stability of the printed PeLEDs. Typically, the perovskite material of the light-emitting layer degrades quickly in the Lead (II) bromide (PbBr2, 99.999%), lead (II) iodide (PbI2, 99.999%), lead (II) chloride (PbCl2, 99.999%), polyethylene oxide (PEO, average Mv~ 5 000 000), polystyrene (PS, average Mw~192 000), N,N-dimethylformamide (DMF, 99.8%), dimethyl sulfoxide (DMSO, >99.9%), toluene (anhydrous, 99.8%), branched polyethylenimine (PEI, average Mw≈25 000 by LS, average Mn≈10 000 by GPC), Triton X-1000, ethylene glycol, and poly(3,4-ethylenedioxythiophene)-poly(styrenesulfonate) (PEDOT:PSS, 1.1% in H2O) were purchased from Sigma-Aldrich. 4-methyl-2-pentanone (C6H12O, 99%) was purchased from Alfa Aesar. Polymethyl methacrylate (PMMA, Mw~950 000) was purchased from MicroChem. Methylammonium bromide ($CH_3NH_3Br$), Methylammonium iodide ($CH_3NH_3I$), and Methylammonium chloride ($CH_3NH_3Cl$) were purchased from 1-Material Inc. Sylgard 184 kit, including the silicone elastomer base and curing agent, was purchased from Dow Silicones Corporation. IPA-based silver nanowire dispersion (diameter: ~ 90 nm, length: 20-30 μm) was purchased from ACS Material, LLC.

$MAPbBr_3$ for green-color PeLEDs was synthesized following the same process reported previously15. To obtain the $MAPb(Cl_{1-x}Br_x)_3$ and $MAPb(BrxI_{1-x})_3$ for multicolor PeLEDs, pure $MAPbX3$ (X-represents a halide anion, e.g., $Cl^-$, $Br^-$, and $I^-$) perovskites were first prepared by mixing the $PbX_2$ salt and precursor MAX at a molar ration of 1:2, followed by dissolving the mixture in the solvent to reach a concentration of 1 M. Anhydrous DMF was used as the solvent for $MAPbBr_3$ and $MAPbI_3$ and anhydrous DMSO was used for $MAPbCl_3$, owing to their different solubility. The suspension was stirred at 80° C. to obtain a transparent solution without any sediment. The hybrid perovskite $MAPb(Cl_{1-x}Br_x)_3$ or $MAPb(BrxI_{1-x})_3$ were then obtained by mixing pure $MAPbBr_3$ and $MAPbCl_3$, or $MAPbBr_3$ and $MAPbI_3$ at desired molar ratios. To expedite the reaction of halide anion substitution, the mixed solution needs to be stirred at 80° C., which is also necessary to obtain stable and homogeneous ink for further usage. The quasi-2D $BA_2(MAPbI_3)_{n-1}PbI_4$ perovskite for red-color PeLEDs was prepared by dissolving organic salt n-butylammonium iodide (BAI) in anhydrous DMF to reach a concentration of 0.5 M followed by stirring at 80° C. The BAI solution was then added to the as-prepared $MAPbI_3$ at desired ratio and stirred to obtain homogeneous quasi-2D RPP ink.

The PEDOT:PSS/PEO composite ink was prepared as described below. In brief, 10 mg/ml PEO viscous solution was prepared by dissolving PEO powder into DMF and stirred at 60° C. Then the PEDOT:PSS/PEO composite ink was obtained by mixing the PEDOT:PSS ink with the PEO solution at desired weight ratio. The perovskite/PEO composite ink was prepared by mixing the as-prepared perovskite ink and PEO viscous solution with a 2:1 weight ratio. The perovskite/PS and perovskite/PMMA composite inks were prepared similarly by mixing the as-prepared perovskite ink and PS or PMMA solutions (10 mg/ml PS solution prepared by dissolving PS pellets into toluene or 10 mg/ml PMMA solution prepared by diluting PMMA with DMF) with a 2:1 weight ratio. The use of toluene as the solvent for PS could help cut the annealing time of the perovskite/PS layer. The PEI ink was prepared by dissolving and stirring PEI in IPA at 20 mg/ml. Lastly, the AgNW ink was formulated by adding 20 vol % ethylene glycol into the as-purchased AgNWs dispersion and sonicated for 60 seconds prior to use to eliminate aggregations of entangled nanowires.

Commercial ballpoint pens were used to handwrite the inks as described herein and the refills were disassembled by disconnecting the tips from the ink cartridge. The tips and cartridges were thoroughly cleaned using IPA and acetone, followed by blow dry using compressed air. The formulated inks were then injected into the empty cartridges using syringes for future use.

The photoluminescence spectra and absorption spectra of perovskite materials were characterized by a fluorometer (RF-6000, Shimadzu) and a UV-vis-NIR spectrophotometer (Perkin-Elmer Lambda 950), respectively. The transmittance spectra of various substrates were characterized with a spectrophotometer (Varian Cary 50 Bio). The SEM images were obtained using the Thermofisher Quattro ESEM system. The luminance vs. voltage (L-V) curves of the PeLED were characterized by a calibrated silicon photodiode that could capture the emitted light out of PeLEDs inside a dark box. A semiconductor device analyzer (B1500A, Keysight) was used to apply bias voltages and measure PeLED device current and PePD photocurrent. Bending tests were carried out with the assistance of an automatic syringe pump (Legato 110, KD Scientific), whose motion such as moving speed and repeating cycles could be precisely programmed. The measurements of the PePDs were all carried out inside a probe station using the semiconductor device analyzer (B1500A, Keysight) and a custom-made tunable laser irradiation system with a 530 nm green laser, a light chopper, and a power supply. The power intensity of the laser was calibrated by a digital optical power and energy meter (PM100D, Thorlabs) with a photodiode power sensor (S121C, Thorlabs). The transient photoresponse was characterized using the semiconductor analyzer in I-t sweeping mode with a fixed bias voltage. Note that the rise/fall times of the PePD were limited by the sampling rate of the equipment. The responsivity of the PePD is defined as $R=I_p/(PA)$, where P and A represent the light intensity and active area, respectively. During the measurement, the laser beam was intentionally defocused a little bit to cover the entire channel region of the devices. The active area of devices and profile of the laser beam was carefully measured with the assistance of a CCD camera and optical microscopes.

Using the handwriting fabrication method described above, a green $MAPbBr_3$ PeLED was prepared. Functional inks were loaded into pre-cleaned ballpoint pens (see FIG. 16B images iii and iv) and written onto a paper substrate. The PeLED was produced by first handwriting a PEDOT: PSS bottom electrode (trace 1 in FIG. 16B panel i). A zoomed-in image showing the PEDOT:PSS electrode drawn along a desired path in a controlled manner on the paper substrate is shown in FIG. 16B panel ii. A perovskite light-emitting layer was then handwritten over the bottom electrode (trace 2 in FIG. 16B panel i), followed by a polyethylenimine (PEI) buffer layer over the light-emitting layer (trace 3 in FIG. 16B panel i), and a silver nanowire (AgNWs) top electrode (trace 4 in FIG. 16B panel i). FIG. 16C is a scanning electron microscope (SEM) image of the hand-drawn PeLED on the paper substrate, from which the multilayer structure of the PeLED formed on percolating cellulose fibers can be clearly distinguished. The handwritten PeLED on paper exhibited great brightness and flexibility when powered by a coin cell battery as shown in FIG. 16D.

The on-demand and rapid device fabrication offered by the handwriting process complemented by the exception device performance provides for the fabrication of a variety of designs and potential applications.

Figure 16E:
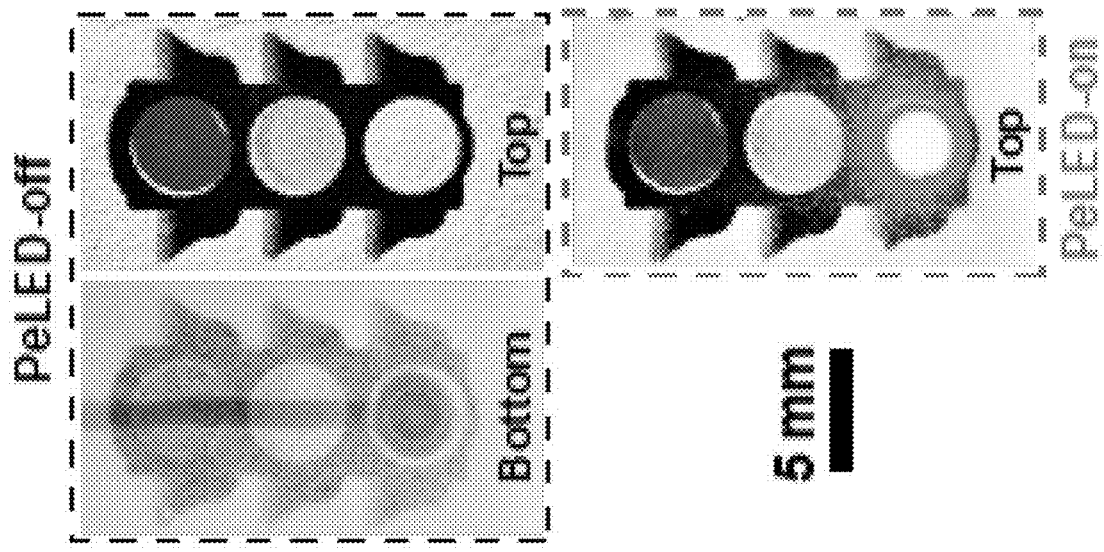
FIG. 16E contains images illustrating a "Flashing Traffic Lights" demonstration with a PeLED drawn on the back side of the printer paper being switched on and off.
Figure 16D:
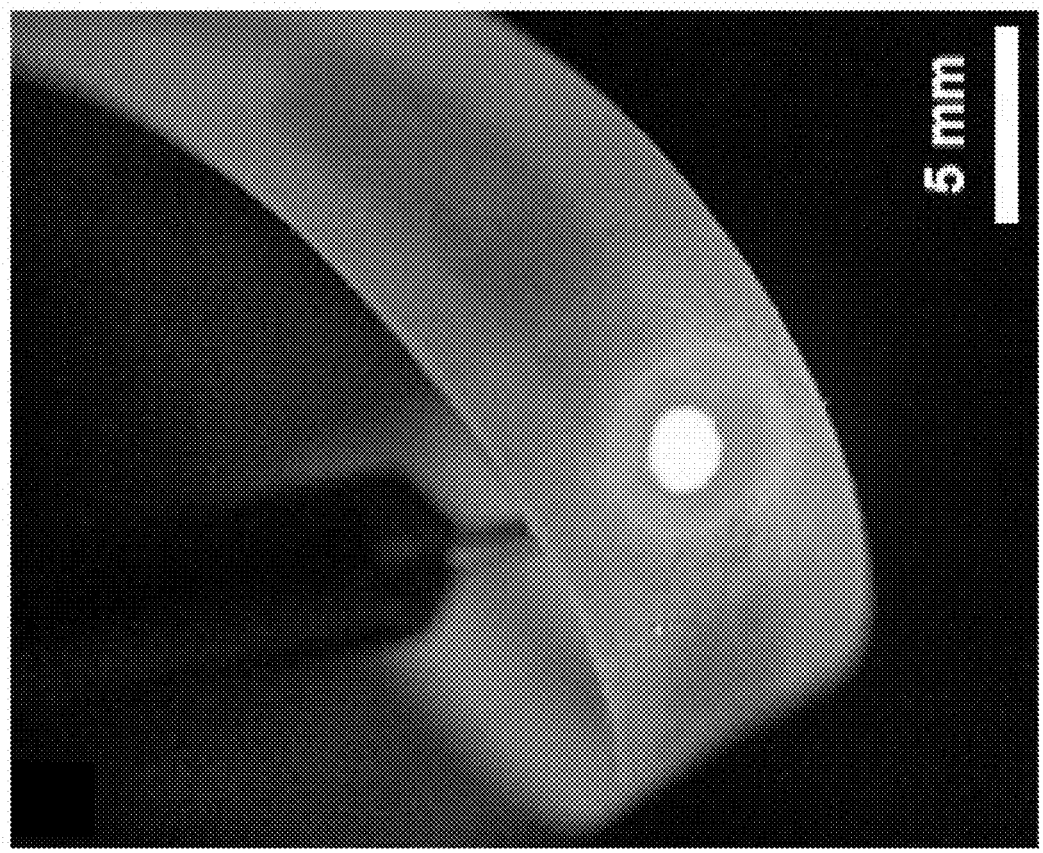
FIG. 16D contains an image showing the EL from a handwritten PeLED on a piece of bent printer paper.

As shown in FIG. 16E, a low-cost "light-emitting paper" was fabricated by directly writing a green PeLED on the bottom side of a conventional printing paper with a cartoon traffic light image printed on the paper substrate using an office printer. When powered by a 3.6-volt coin cell battery, the LED could be switched on and off to emulate the traffic light operation.

Figure 16F:
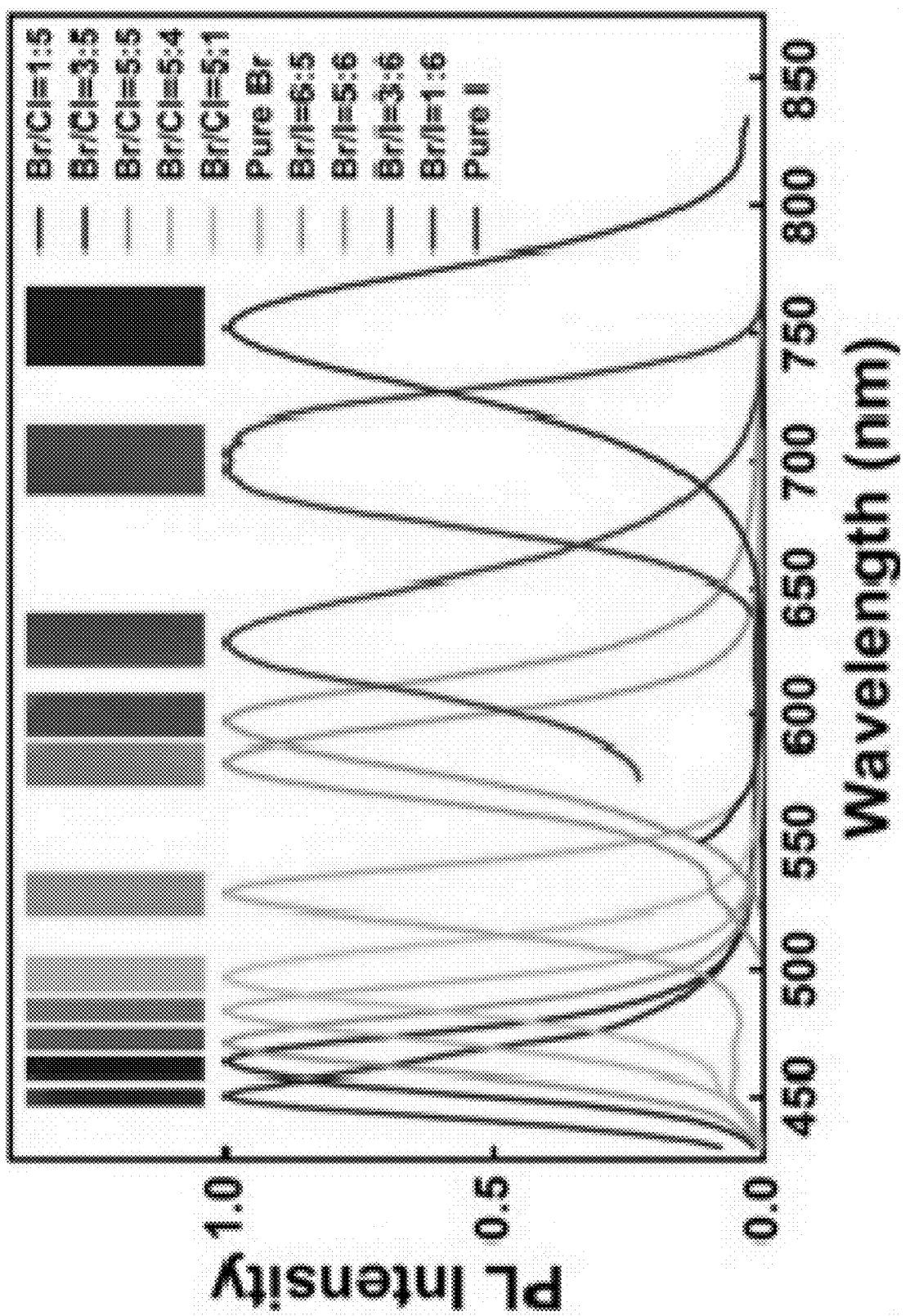
FIG. 16F is a graph of normalized PL spectra with insets showing the corresponding fluorescent pictures taken from MAPb(Cl/Br)3, MAPbBr$_3$, MAPb(Br/I)3, and MAPbI$_3$ thin films.
Figure 16G:
FIG. 16G contains images of multicolor PeLEDs written on aluminum foil without (top) and with (bottom) UV light illumination.

Halide elements in the perovskite material (MAPbX3) were substituted to formulate inks with different compositions of two halide elements to obtain emissive layers of different colors covering the entire visible spectrum. The measured PL spectra and corresponding photographs showing the $MAPb(Cl_{1-x}Br_x)_3$, $MAPbBr_3$, $MAPb(BrxI_{1-x})_3$, and $MAPbI_3$ thin films under UV light illumination are summarized in FIG. 16F. Using the multi-color perovskite inks described above, a handwritten logo was produced on an aluminum foil substrate using ballpoint pens filled with $MAPbBr_{1.36}I_{1.64}$, $MAPbBr_3$, and $MAPbCl_{1.33}Br_{1.67}$ inks as illustrated in FIG. 16G (top) and under UV illumination a red-green-blue-colored luminous glow was observed, as shown in FIG. 16G (bottom).

In terms of substrates, glass is one of the most widely used options for perovskite optoelectronics, owing to its transparency, superior thermal, chemical, mechanical stabilities, and compatibility with vacuum-based or high-temperature microfabrication processes. In contrast, the all-solution-based handwriting strategy could be performed in ambient conditions without any specific requirement for temperature or humidity, thus the target substrate is no longer restricted to glass and a wide range of low melting-point materials such as plastics or rubber latex can be used. More importantly, conventional solution-based processes such as printing or spin-coating require substrates with non-absorbing and smooth surfaces to avoid uncontrollable ink bleeding and absorption. With the handwriting strategy, the ubiquitous substrates including, but not limited to, paper, textile, and metal foil all become suitable candidates for device fabrication. Additionally, the mask-free and on-demand drawing features provide for the fabrication of customized deformable optoelectronic devices patterned directly on nonplanar and 3-dimensional (3D) surfaces.

FIG. 17A is an image of a luminous PeLED drawn directly on the fingertip of a vinyl glove that can tolerate excessive deformation caused by the first grasping and releasing repeatedly. Handwritten PeLEDs fabricated on a plastic substrate such as polyethylene terephthalate (PET) film exhibited extraordinary flexibility and robustness as shown in FIG. 17B. No noticeable damage was observed on a lit-up $MAPbBr_3$ LED stripe when the PET film substrate was completely folded around a sharp blade.

Figure 17D:
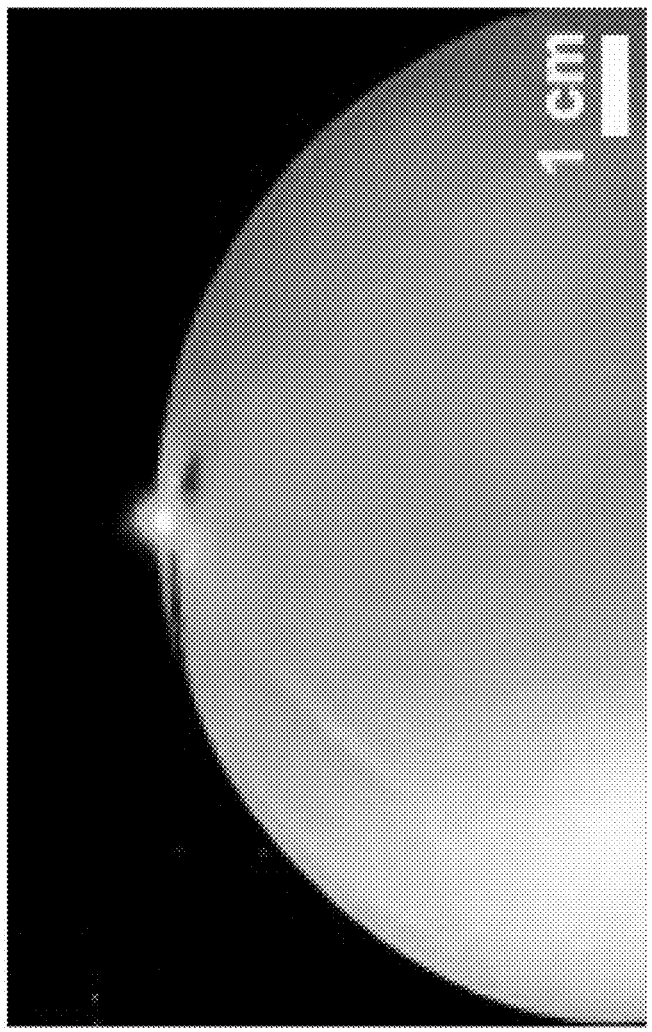
FIG. 17D contains an image of the EL of PeLEDs drawn on a latex balloon with the PeLED powered by a coin-cell battery.
Figure 17E:
FIG. 17E contains an image of handwritten PeLEDs displaying "WUSTL" characters on non-transparent aluminum foil; the device adopts an inverted structure with a transparent water-free PEDOT:PSS top electrode to allow light emission from the top side when the PeLED is powered by a coin-cell battery.
Figure 17C:
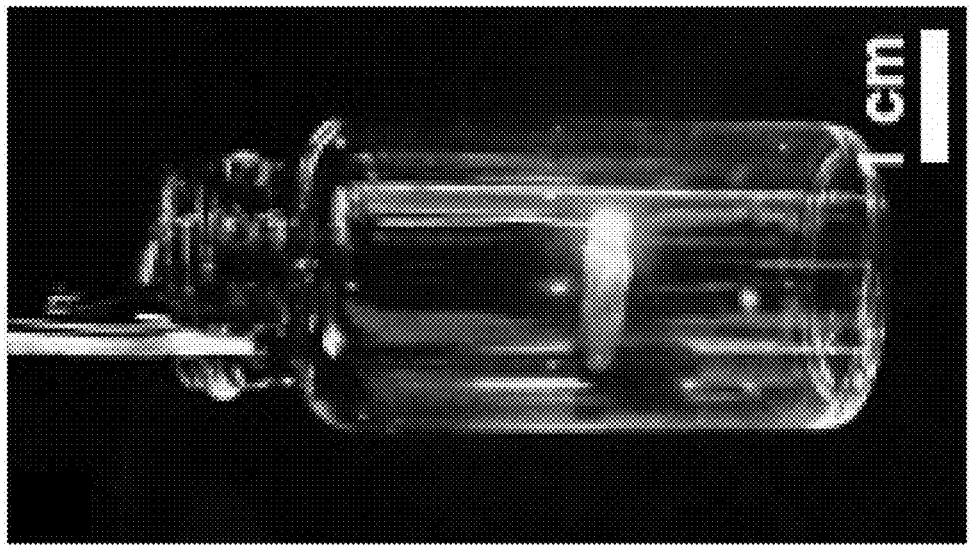
FIG. 17C contains an image of the EL of PeLEDs drawn on an interior sidewall of a glass vial with the PeLED powered by a coin-cell battery.

In various aspects, the handwriting approach offers advantages over existing state-of-the-art printing methods with respect to depositing functional materials onto complex and 3D geometries. While it is possible for roll-to-roll printing to pattern inks onto non-planar cylindrical surfaces, it is extremely difficult to achieve uniform patterning on spherical or other more complex geometries. In addition, jetting components of existing printing methods are not designed to reach the interior surfaces of multidimensional objects. As shown in FIG. 17C, a PeLED was patterned on the interior sidewall of a glass vial using the handwriting method described above. As illustrated in FIG. 17D, the PeLED was also directly written on the spherical surface of a latex balloon and survived tens of inflation/deflation cycles with a biaxial stretch of ~40% along both directions, thus revealing its sufficient mechanical stretchability.

To date, the vast majority of reported PeLEDs were constructed on transparent or semi-transparent substrates and bottom electrodes such as indium-tin-oxide (ITO), to allow the light to emit through. Non-transparent materials such as metal foil or wood were seldomly used as substrates for fabricating PeLEDs because doing so would require inverted device structures with transparent electrodes placed on top of the perovskite films. Many solution-based transparent conductors used in the fabrication of inverted structures, such as PEDOT:PSS, carbon nanotubes, or silver nanowires, are dissolved in water or organic solvents that can chemically damage underlying perovskite crystals. In some aspects, the handwriting method may be used to handwrite top-emitting PeLEDs on non-transparent substrates, such as a metal substrate. As illustrated in FIG. 17E a specially-formulated water-free PEDOT:PSS ink may be used to produce a top transparent electrode.

Electronic textiles are regarded as promising platforms for next-generation flexible displays and wearable electronics. However, the challenge lies in the great difficulty of fabricating deformable and high-performance optoelectronic devices on fabrics with porous and rough surfaces. Textile substrates (cotton, voile, chiffon, and organza) were all common fabrics found in daily life. The fabrics were spread on a glass slide followed by the same PDMS coating process used for the paper as described above until all voids between the woven fibers were filled by PDMS. The fabrics were then annealed in an oven at 80° C. until the PDMS was fully cured and then peeled off from the glass slide. The rest of the substrates used in the work including aluminum foil, vinyl gloves, PET, glass vials, and latex balloons were all found in daily life and used without further surface treatment.

Figure 17G:
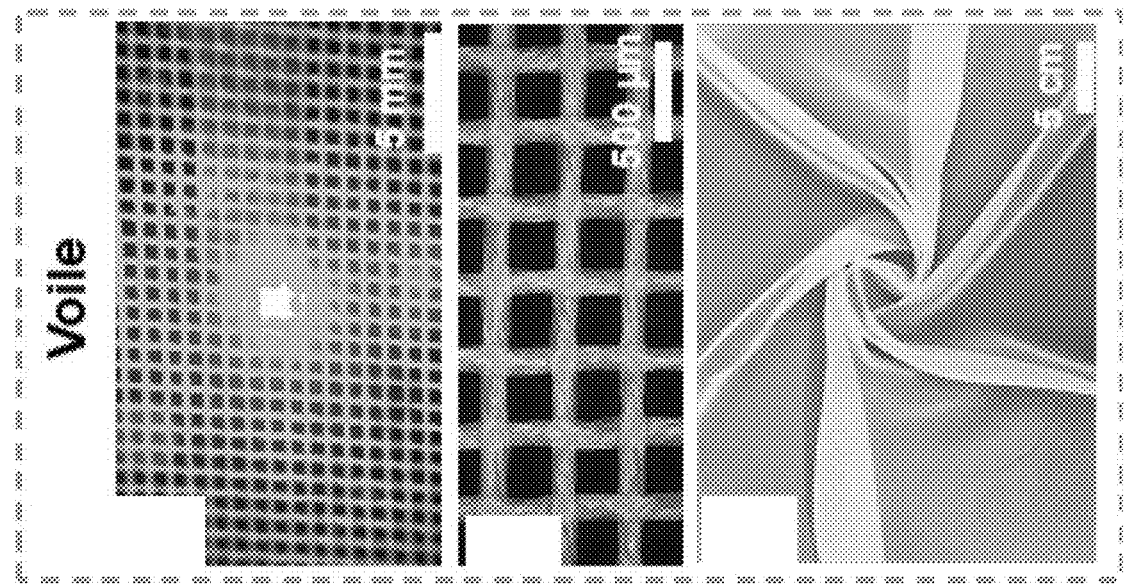
FIG. 17G contains an image of the EL of PeLEDs drawn on voile textile with the PeLED powered by a coin-cell battery.
Figure 17F:
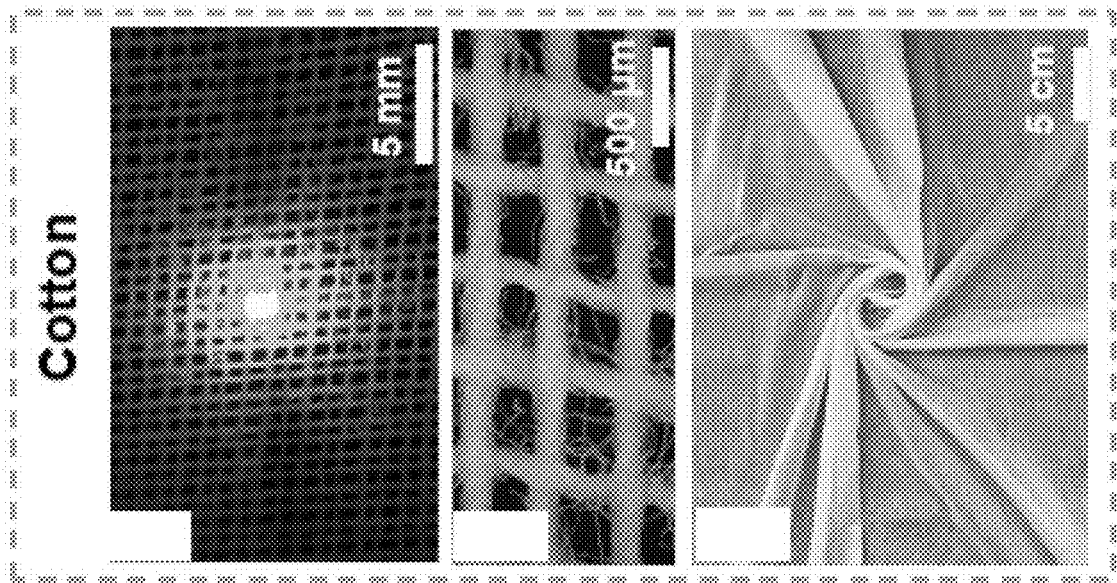
FIG. 17F contains an image of the EL of PeLEDs drawn on cotton textile with the PeLED powered by a coin-cell battery.
Figures 17H, 17I:
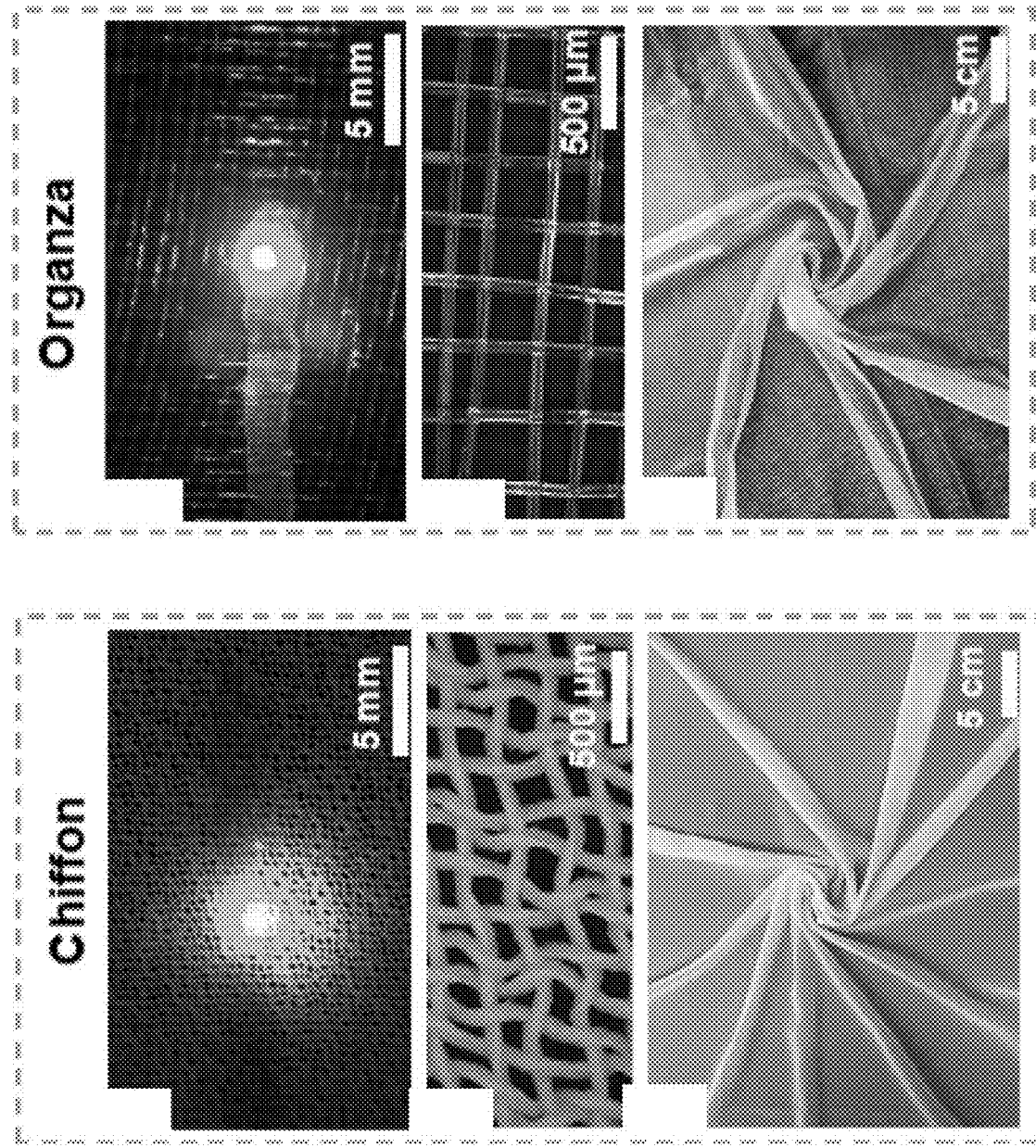
FIG. 17H contains an image of the EL of PeLEDs drawn on chiffon textile with the PeLED powered by a coin-cell battery.
FIG. 17I contains an image of the EL of PeLEDs drawn on organza textile with the PeLED powered by a coin-cell battery.

In various aspects, the handwriting fabrication method described above provides a facile approach for obtaining functional PeLEDs on various textiles including cotton (FIG. 17F) and polyester wovens such as voile (FIG. 17G), chiffon (FIG. 17H), and organza (FIG. 17I).

Example 4 Pre-Treatment of Paper Substrates and Handwritten PEDOT:PSS/PEO Bottom Electrodes To demonstrate the pre-treatment of paper substrates to impart translucent/transparent properties, and the effects of variations in formulations of bottom electrode inks on bottom electrode properties, the following experiments were conducted.

Inspired by a well-known phenomenon in daily life that a piece of paper smeared with oil will look translucent, an effective and low-cost pre-treatment was developed to achieve a semi-transparent paper substrate for building optoelectronic devices. Because oil's refractive index (n=1.466-1.474) is much closer to cellulose fibers' (n=1.469) than air's (n=1.000), less light would be scattered or refracted when interacting with the oil-smeared paper, which in turn allows more light to transmit through the cellulose fibers and making the paper more transparent.

Figure 18A:
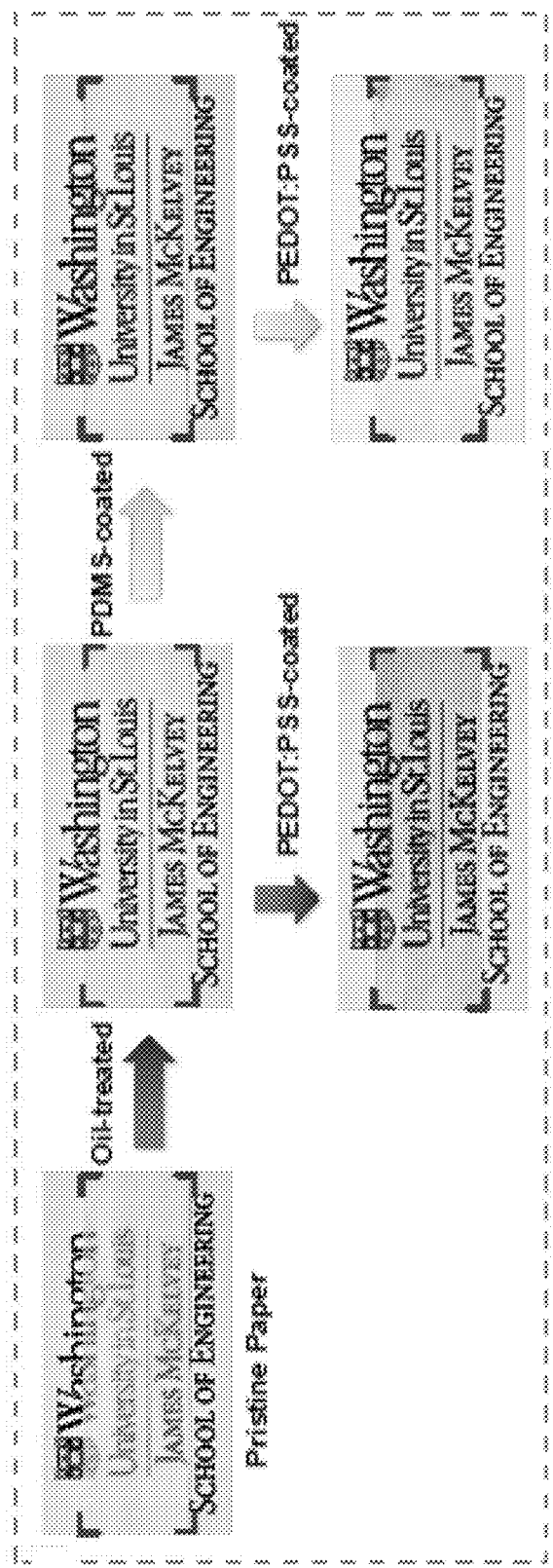
FIG. 18A contains pictures illustrating the use of oil-treatment and PDMS-coating approaches to increase the optical transparency of paper. The region circled within the red box is the treated paper sample placed on another sheet of office paper with a logo for better viewing of the sample transparency.

As shown in FIG. 18A, oil-treated office paper (FIG. 18A (ii)), even after being coated with PEDOT:PSS film (FIG. 18A (iii)), became more transparent than the office paper prior to oil treatment (FIG. 18A (i)). With oil treatment, the transmittance increased from 24.84% to 70.28% for green light (530 nm), which was an acceptable level for use as an LED substrate. Moreover, coating the oil-treated paper with a PDMS prior to the application of the PEDOT:PSS ink created a hydrophobic and non-absorbing surface (FIG. 18A (iv)) so that less PEDOT:PSS ink adhered, resulting in a more transparent conductive film (FIG. 18A(v)).

The oil-treated semi-transparent paper substrate was achieved by putting a few oil droplets onto the paper substrate, followed by spreading the oil uniformly using a glass slide and wiping off excess oil. To prepare the PDMS-coated paper substrate, PDMS solution was first prepared by mixing the elastomer base and curing agent from the Sylgard 184 kit at a weight ratio of 10:1, followed by dilution using organic solvent 4-methyl-2-pentanone and stirring at 500 rpm to get a less viscous dilution. A few liquid PDMS droplets were then pipetted onto the pristine paper substrate followed by blade-coating for several rounds until a very thin and uniform PDMS layer was formed on paper. The paper was then annealed in an oven at 70° C. for solvent evaporation and curing of PDMS.

Figure 18B:
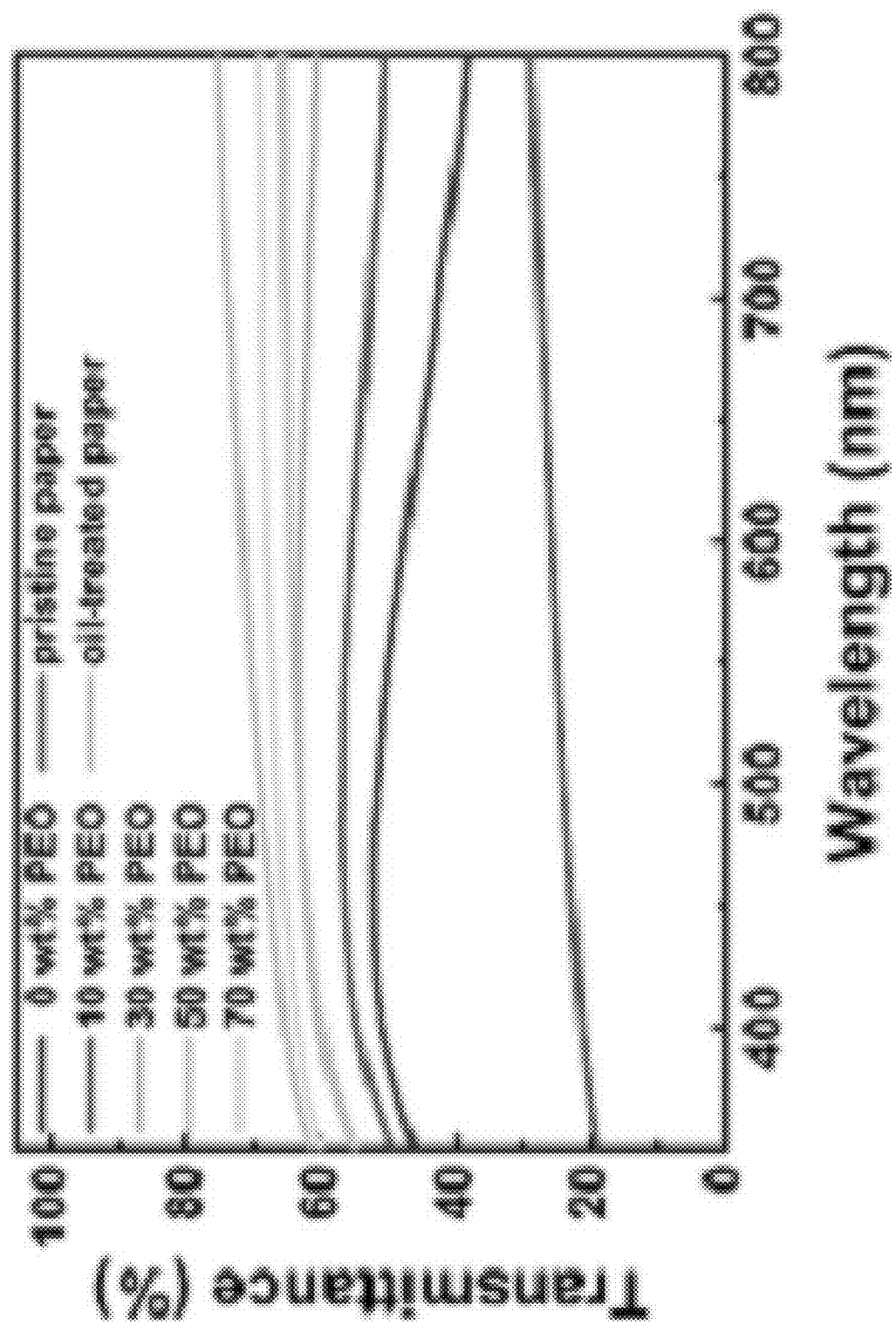
FIG. 18B is a graph of the transmittance spectra of handwritten PEDOT:PSS/PEO composite films with different PEO weight ratios on an oil-treated paper substrate.
Figure 18D:
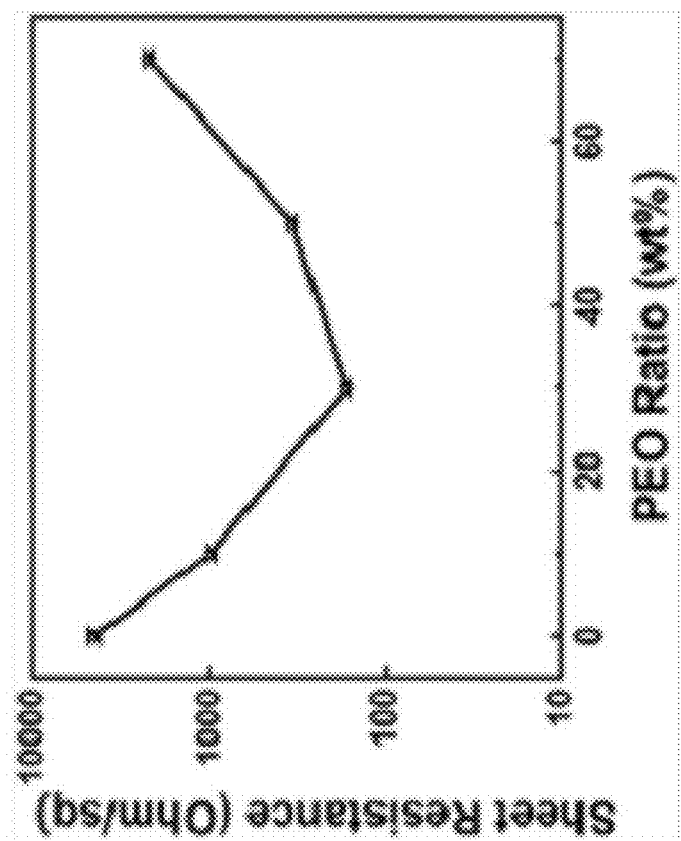
FIG. 18D contains a graph of the sheet resistance of the handwritten PEDOT:PSS/PEO electrode on a paper substrate as a function of the PEO additive weight ratio.
Figure 18C:
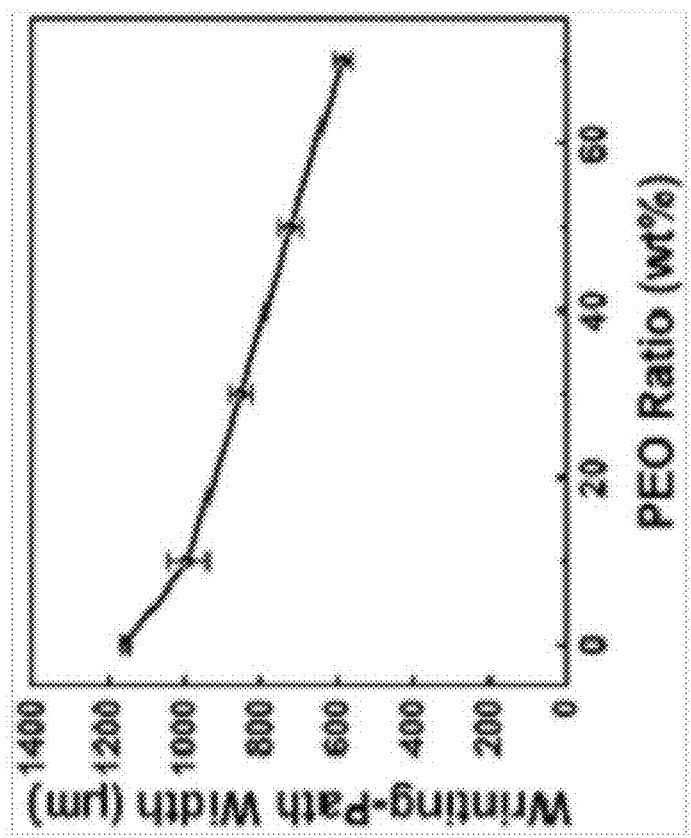
FIG. 18C contains a graph of the path width of the handwritten PEDOT: PSS/PEO composite films as a function of the PEO additive weight ratio.
Figure 18E:
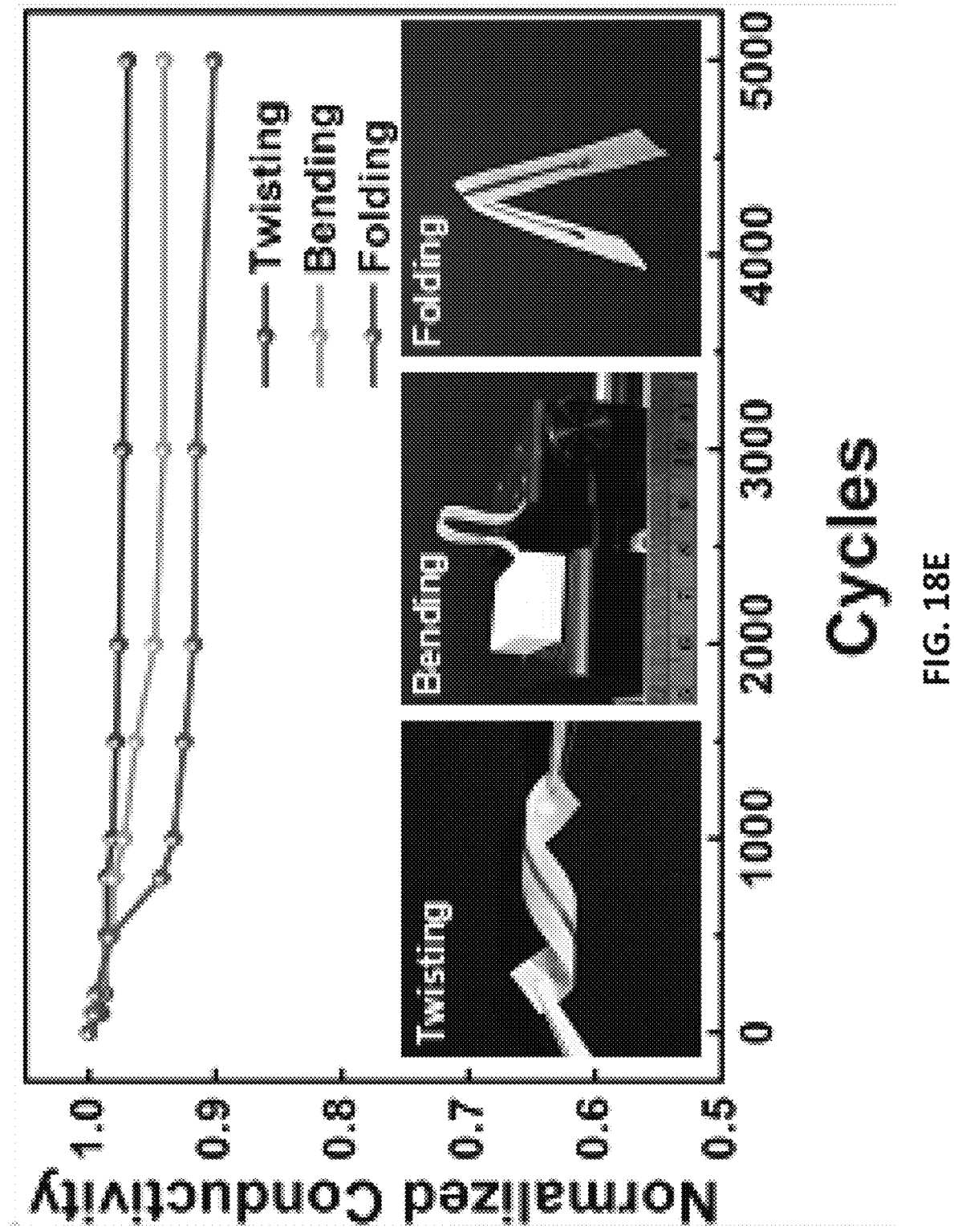
FIG. 18E contains a graph of the normalized conductivity of PEDOT:PSS/PEO composite electrodes drawn on a paper substrate after 5000 twisting, bending, or folding cycles. The insets show the images of samples and the representative twisting, bending, and folding conditions used in the tests.

In order to achieve a better handwriting experience with good resolution and film uniformity, high-molecular-weight polyethylene oxide (PEO) was mixed into PEDOT:PSS ink at different weight ratios to modify the ink rheology. Transmittance spectra of the handwritten PEDOT:PSS/PEO composite thin films on oil-treated paper were measured and presented in FIG. 18B. The transmittance increased gradually for the increasing weight ratio of the PEO additive due to the dilution of the PEDOT:PSS ink. The addition of PEO also increased the ink viscosity, which effectively increased the contact angle and limited ink spreading on paper and thus facilitated precise and controllable patterning. FIG. 18C shows the correlation between the width of the handwritten features and the PEO weight ratio, indicating that a higher PEO ratio leads to a narrower writing path using the same pen, which in turn enabled the fabrication of smaller individual devices or denser integrations. However, the improvement in resolution was accompanied by a reduction in electrical conductivity. As shown in FIG. 18D, the sheet resistance of the PEDOT:PSS/PEO composite electrode initially dropped and then increased with increasing PEO ratio. Considering the tradeoff between transparency, resolution, and sheet resistance, PEDOT:PSS mixed with 30 wt % PEO was chosen as the ink formulation for the bottom electrode, which offered 63.51% optical transparency, 852 µm writing linewidth, and the lowest sheet resistance of around 166 Ω/sq. In addition, the selection of PEO as the additive for PEDOT:PSS enabled stretchable conductors. The mechanical compliances of PEDOT:PSS/PEO composite electrodes written on paper were tested under various types of deformation (FIG. 18E), which resulted in less than 3%, 6%, and 10% conductivity degradation after 5000 cycles of twisting, bending, and folding, respectively.

Example 5 Effect of PEO Fraction of PEDOT:PSS/PEO Bottom Electrodes on Substrate Planarization To demonstrate the effect of the PEO fraction used for the fabrication of PEDOT:PSS/PEO bottom electrodes on the planarization of irregular substrate surfaces such as paper substrates, the following experiments were conducted.

The PEO additive in the PEDOT:PSS ink formulation plays a significant role in enabling direct handwriting of devices on regular fiber-based office papers, instead of on artificially synthesized paper or photo paper and other smooth paper substrates pre-coated with polymers, such as parylene and poly(methyl methacrylate) (PMMA). It is well known that rough film morphology and nonuniform film thickness could result in short circuit, a key failure mechanism in solution-processed multilayer LEDs. By adding PEO, the viscosity of the PEDOT:PSS ink increased dramatically, which slowed the penetration of the ink into the deeper layers of the paper and also helped fill voids among the percolating cellulose networks on the surface of the paper. Hence, the PEDOT:PSS/PEO layer not only serves as the bottom electrode but also functions as a planarization film that is anchored firmly by the bonding between the polymer and cellulose fibers.

FIG. 19A shows schematic illustrations of surface morphologies of PEDOT:PSS ink written on pristine paper (left), PEDOT:PSS/PEO composite ink written on pristine paper (center), and PEDOT:PSS/PEO composite ink written on PDMS-coated paper used as a reference. To investigate the influence of surface roughness and the bottom electrode on the upper device architecture, the perovskite layers drawn on top were characterized by SEM. As illustrated in FIG. 19B, the PEDOT:PSS ink was absorbed deep into the pristine paper fiber and resulted in a rough surface sample (FIG. 19B, top), and the corresponding perovskite crystals were orientated in random directions and formed some dendric patterns throughout the entire film. The EL of the handwritten PeLEDs on the rough bottom electrode of FIG. 19B exhibited poor brightness and uniformity with many dead spots (FIG. 19B, bottom). As illustrated in FIG. 19C, when a PEDOT:PSS/PEO composite electrode was applied to pristine paper, the planarization effect of the PEO additive enhanced the quality of the resulting perovskite film in terms of the consistency of grain size and percentage of crystal coverage (FIG. 19C, top), which was approaching the quality of the reference sample on PDMS-coated paper with the flattest surface (FIG. 19D, top). The extent of planarization effects could be further enhanced by increasing the weight ratio of PEO but at the cost of degraded electrical conductivity. The comparable EL uniformity from PeLEDs on pristine paper with PEDOT:PSS/PEO composite electrode (FIG. 19C, bottom) and PeLEDs on PDMS-coated paper (FIG. 19D, bottom) further demonstrated that the planarization effect offered by the PEDOT:PSS/PEO ink was beneficial for fabricating high-quality optoelectronic devices directly on untreated pristine paper.

Example 6 Characterization of Handwritten Multicolor Peleds on Paper Substrates

To characterize various aspects of PeLEDs on paper substrates fabricated using the handwriting method described above, the following experiments were conducted.

One critical challenge for achieving high-quality optoelectronic devices is the reliable deposition of pinhole-free perovskite films. This issue is challenging for a handwriting approach because the ink was extracted out of the ballpoint pen tips under manual control. To address this challenge, perovskite/polymer ink blends using different host polymers were systematically studied to determine the optimal formulation for obtaining appropriate light-emitting and photoactive layers for LEDs and PDs. Composite inks were obtained by dispersing perovskite crystals into PEO, polystyrene (PS), or PMMA polymer matrix. The perovskite/PEO composition exhibited ink rheology and viscosity that was well-suited for more precise and smoother patterning. The perovskite/PS composite composition resulted in improved uniformity and density of perovskite crystal arrangement, helped boost the brightness, and lowered the leakage current of PeLEDs. The perovskite/PMMA composition reduced grain defects and boundaries to facilitate the transport of photocarriers in photodetectors.

To systematically evaluate the handwritten PeLEDs on pristine paper, corresponding devices built on PDMS-coated paper were also prepared as a standard reference. Both types of the PeLEDs shared exactly the same device structure, starting from the PEDOT:PSS/PEO bottom anode, perovskite/PS light-emitting layer, PEI buffer layer, and AgNWs top cathode, with only differing substrates. Low boiling-point solvents such as toluene, ethanol, and isopropyl alcohol (IPA) were used in these inks to shorten annealing time or even eliminate the need for annealing at room temperature.

To fabricate the PeLEDs on pristine paper, the PEDOT: PSS/PEO composite ink was first handwritten onto the paper surface following people's normal way of daily handwriting, and the paper substrate was annealed either in an oven or on a hotplate at 80° C. until the solvent was fully evaporated. Next, the perovskite/polymer composite inks of various colors were handwritten directly on top of the PEDOT:PSS/PEO film, followed by annealing the sample at 80° C. until the film color change was observed and perovskite thoroughly crystallized. Then, the PEI ink was handwritten gently on top of the perovskite layer. Owing to the low boiling point of IPA, there is no need to heat the sample during this step as the IPA solvent would evaporate immediately during the handwriting process. Finally, as a last step, the AgNWs ink was written gently on top of the PEI buffer, leaving behind an AgNW network that uniformly covers the desired active region. The use of IPA solvent with a low boiling point in both the PEI and AgNW inks allows the annealing processes for these layers to be skipped, which helps shorten the fabrication time significantly. Similar to writing the PeLEDs on paper substrates, the processes to write the PeLEDs on PDMS-treated paper/textile, glass, plastic, rubber, or metal surfaces are largely the same as above, except that the substrates were first treated using oxygen plasma to render the surface hydrophilic and improve the wetting of the ink.

Figures 20A, 20B:
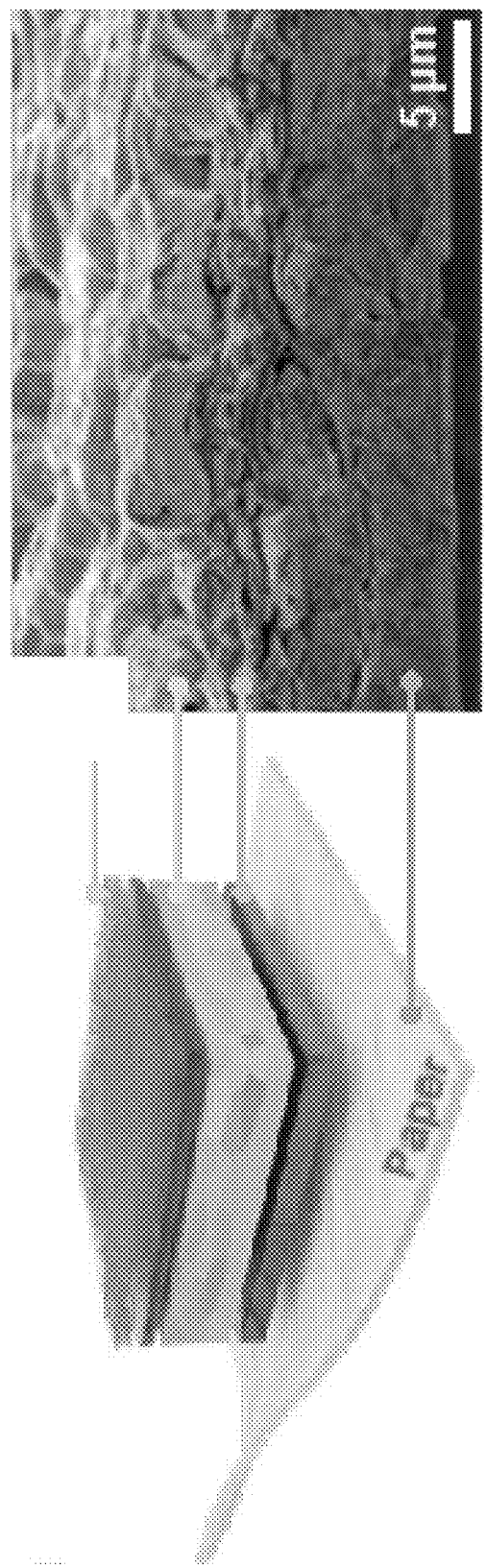
FIG. 20A is a schematic diagram illustrating a PeLED written on a pristine paper substrate.
FIG. 20B is a cross-sectional SEM image of the device of FIG. 20A.
Figures 20C, 20D:
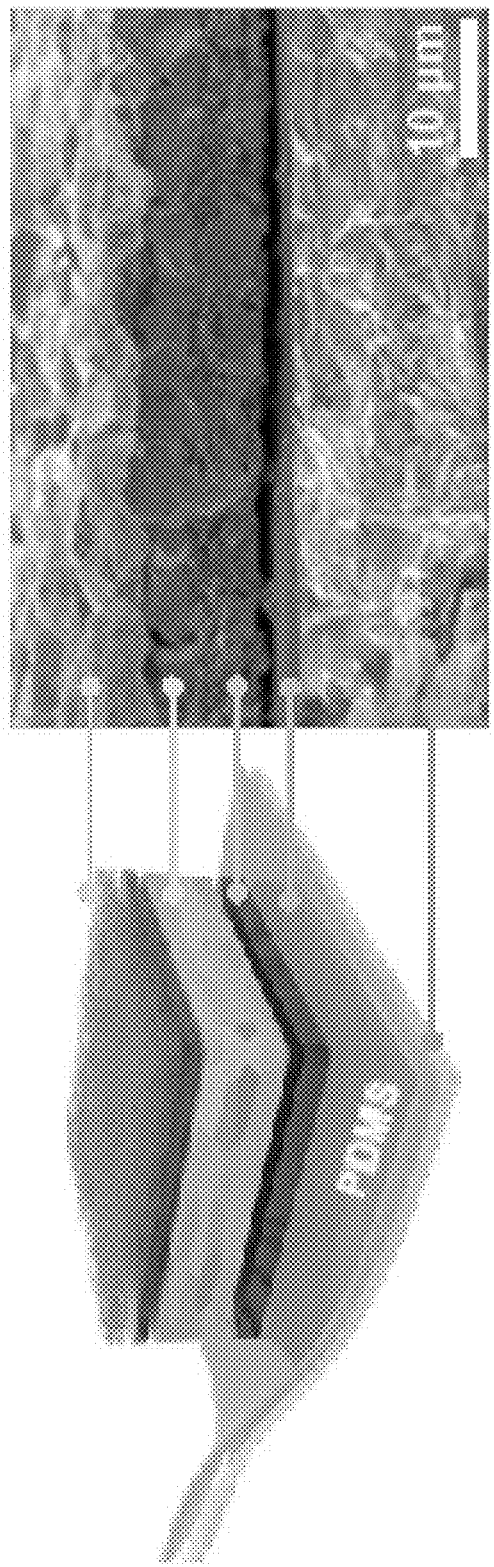
FIG. 20C is a schematic diagram illustrating a PeLED written on a PDMS-coated paper substrate.
FIG. 20D is a cross-sectional SEM image of the device of FIG. 20C.

FIG. 20A and FIG. 20C are schematic diagrams of the handwritten PeLEDs on pristine paper and PDMS-coated paper substrates, respectively. The corresponding cross-sectional SEM images are shown in FIGS. 20B and 20D, respectively. From the SEM image, one can clearly see that the PDMS coating played a critical role in planarizing the paper surface and resulted in much smoother and cleaner interfaces between the different layers in the PeLED. In contrast, for the PeLED written directly on pristine paper, the PEDOT:PSS/PEO bottom electrode partially penetrated the surface of the paper and the resulting devices yielded a rougher surface morphology. The PEI buffer layer in the device was used to protect the underneath perovskite layer from being eroded by the AgNWs ink on top and was also regarded as a work function modifier to reduce the Schottky barrier and facilitate electron injection. The PEI interfacial layers were too thin to be distinguished from these SEM images.

Figure 20F:
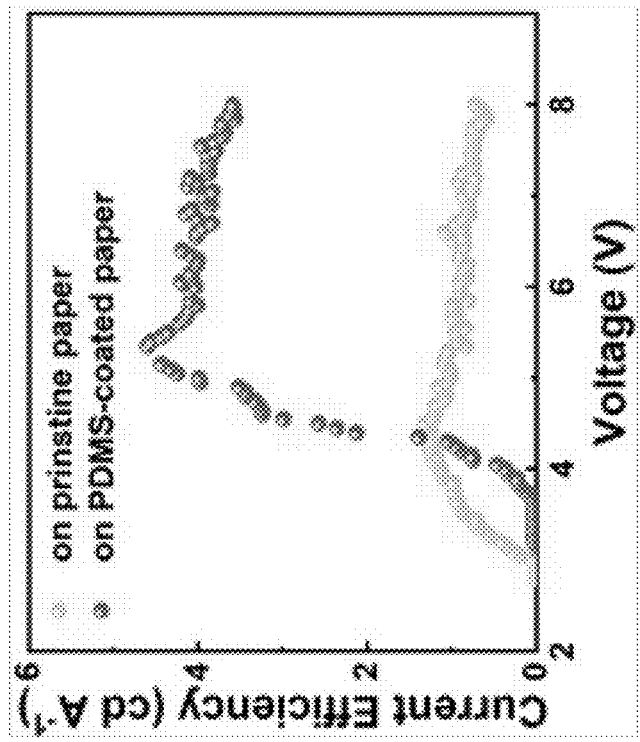
FIG. 20F is a graph of measured current density-voltage (J-V) of green PeLEDs written on a pristine paper substrate and PDMS-coated paper substrate.
Figure 20E:
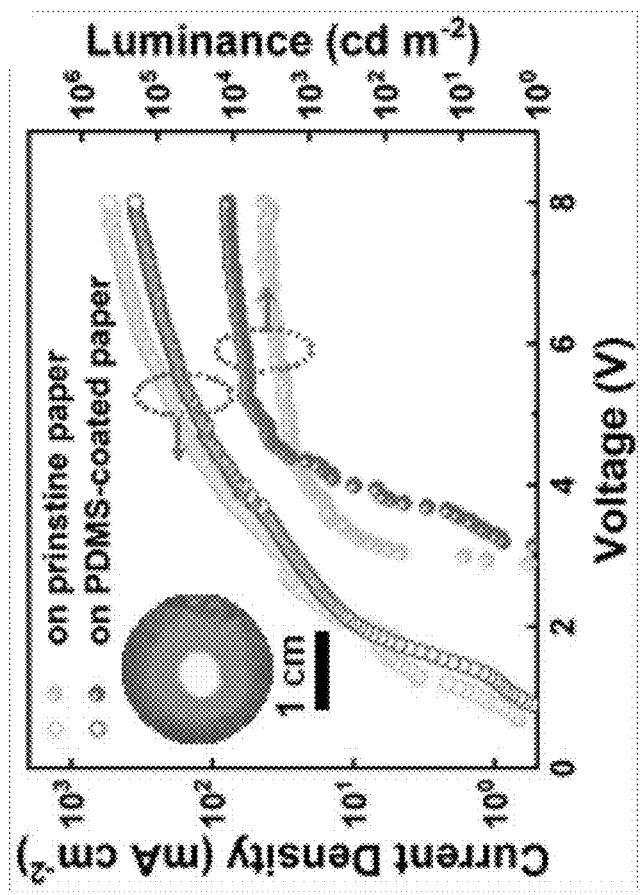
FIG. 20E is a graph of measured current density-voltage (J-V) of green PeLEDs written on a pristine paper substrate and PDMS-coated paper substrate; the inset shows the EL image of a handwritten $MAPbBr_3$ green LED.

The current density-voltage (J-V), luminance-voltage (L-V), and current efficiency-voltage (CE-V) curves of the green PeLEDs on pristine paper and PDMS-coated paper are shown in FIGS. 20E and 20FD. The maximum luminance of the handwritten PeLED on pristine paper reached 3,980 cd/m$^2$ at 6.6 V (FIG. 20E inset). Despite being lower than the luminance of 11,867 cd/m$^2$ at 7.8 V for the PeLEDs on PDMS-coated paper, it is still a respectable performance for devices made using such a simple handwriting approach. Compared with the turn-on voltage of 3.15 V for PeLEDs on PDMS-coated paper, a slightly lower threshold voltage of 2.9 V was sufficient to light up the PeLEDs on pristine paper, which is particularly meaningful for creating disposable and low-cost light sources powered by a single 3.6 V coin cell battery while producing over 600 cd/m$^2$ of brightness (FIGS. 16D, 16E, and 17A), a brightness sufficient to meet the needs for most display applications. The peak current efficiency achieved for the green PeLED was 1.365 cd/A and 4.6 cd/A on pristine paper and PDMS-coated paper, respectively. In addition to the aforementioned multicolor perovskite ink formulations (FIG. 16F), the BA group may be introduced to obtain BA$_2$(MAPbI$_3$)$_{n-1}$ PbI$_4$ quasi-2D RPP, which could help significantly boost the brightness and efficiency of red PeLEDs.

Figure 20H:
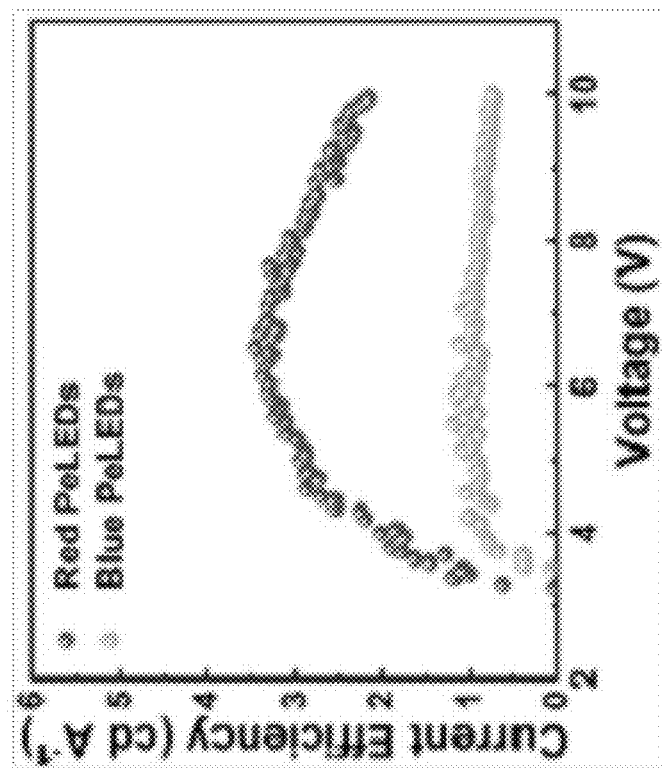
FIG. 20H is a graph of measured CE-V curves of red and blue PeLEDs written on a PDMS-coated paper substrate.
Figure 20G:
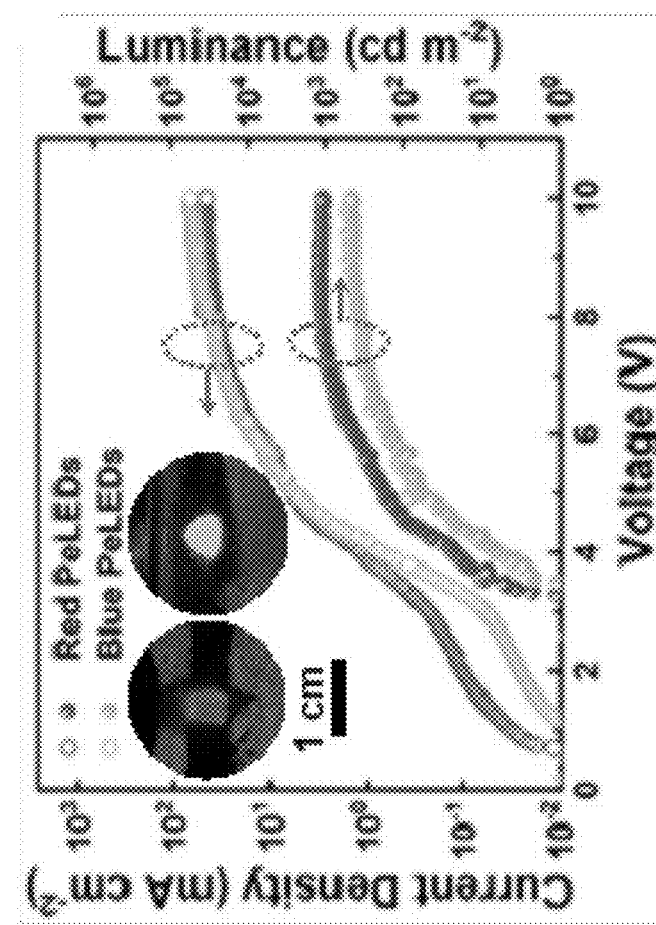
FIG. 20G is a graph of measured J-V and L-V curves of red and blue PeLEDs written on PDMS-coated paper substrate; insets show EL images of handwriting $BA_2(MAPbI_3)_{n-1}PbI_4$ red LED and $MAPb(Cl/Br)_3$ blue LED.

The J-V, L-V, and CE-V curves of red and blue PeLEDs are shown in FIGS. 20G and 20H. The red PeLED on pristine paper exhibited a maximum luminance of 1,213 cd/m$^2$ at 8.7 V (FIG. 20G inset) with a turn-on voltage of 3.25 V, while the blue PeLED exhibited a maximum luminance of 516 cd/m$^2$ at 8.95 V (FIG. 20G inset) with a higher turn-on voltage of 3.5 V. Peak current efficiency of red and blue PeLEDs reached 3.36 cd/A and 1.16 cd/A, respectively.

Figure 20I:
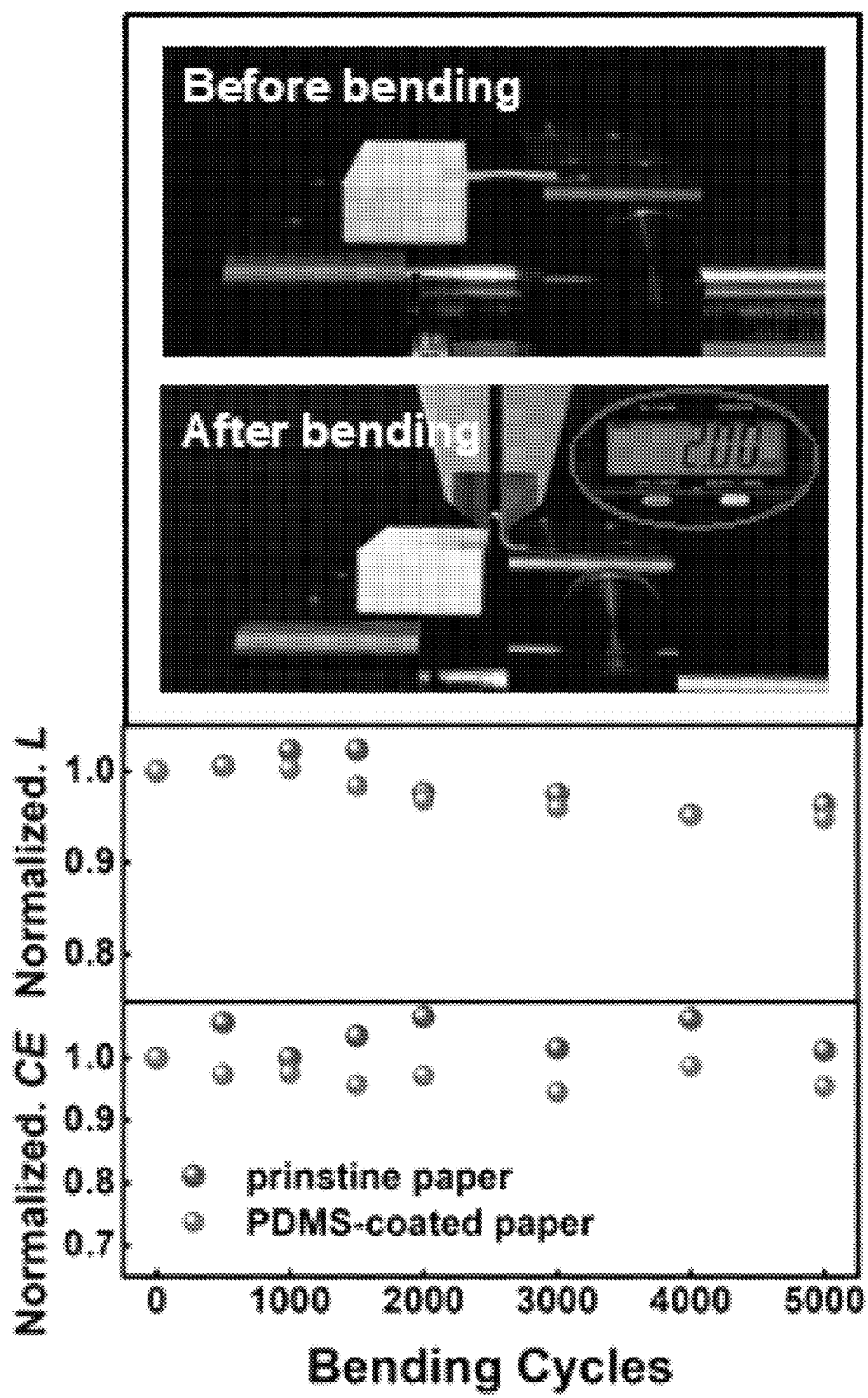
FIG. 20I contains images of an experimental setup for bending tests at relaxed and bent states of a $MAPbBr_3$ green LED and graphs (bottom) of the normalized luminance and current efficiency measured before and after 5000 bending cycles with a curvature radius of 1 mm.

The mechanical durability and flexibility of the handwritten PeLEDs on pristine and PDMS-coated papers were also characterized. Since each layer of the LED was designed to be intrinsically stretchable, the devices fabricated on paper were expected to be capable of surviving severe deformations. As shown in the insets of FIG. 20I, the device can be bent to a concave status with only a 1 mm curvature radius and remain functional. When tested for up to 5000 bending cycles, the normalized luminance for green PeLEDs on both pristine paper and PDMS-coated paper only experienced a~5% drop (FIG. 20I). The normalized current efficiency decreased by ~5% for the device on PDMS-coated paper but increased by ~6% on pristine paper. It is also worth noting that the bending test took tens of hours to finish (device lit only during the measurements, not continuously), indicating that our handwritten and unencapsulated PeLEDs had a suitable operational life for long-term use in ambient conditions.

Example 7 Characterization of Handwritten Perovskite Photodetectors on Paper Substrates To characterize various aspects of perovskite photodetectors on paper substrates fabricated using the handwriting method described above, the following experiments were conducted.

Figure 21B:
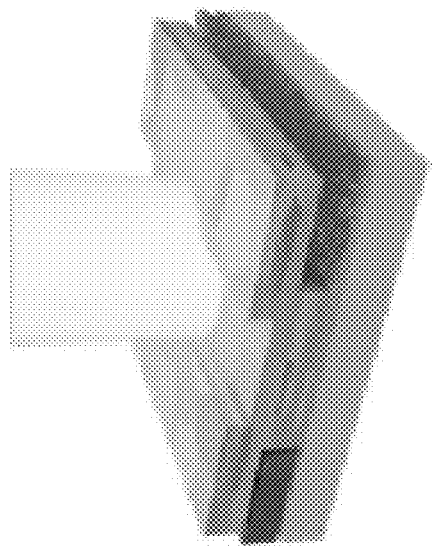
FIG. 21B is a schematic of handwritten PePDs with a lateral photoconductor configuration under 530 nm light illumination.
Figure 21A:
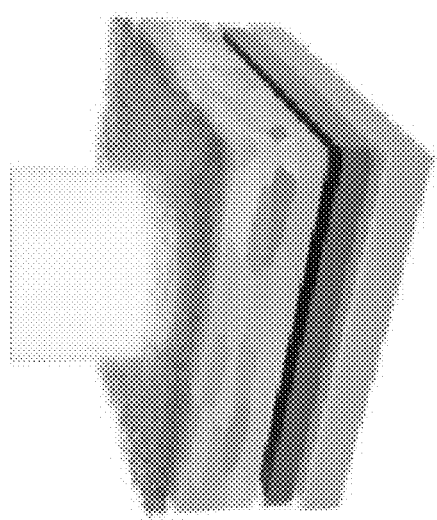
FIG. 21A is a schematic of handwritten PePDs with a vertical photodiode configuration.

The handwriting fabrication strategy was used to fabricate another perovskite optoelectronic device, a perovskite photodetector (PePD). Two representative PePD device configurations, a vertical photodiode (FIG. 21A) and a lateral photoconductor (FIG. 21B), were fabricated on paper substrates using the handwriting methods described above and tested as described below. The vertical perovskite photodiode (FIG. 21A) was constructed with a PEDOT:PSS/PEO bottom electrode, a MAPbBr$_3$/PMMA photoactive layer, and an AgNWs top electrode. The lateral photoconductor (FIG. 21B) was constructed with PEDOT:PSS/PEO and AgNW asymmetric electrodes covered by a MAPbBr$_3$/PMMA photoactive layer in between the channel.

The processes used to fabricate the PePD with a vertical configuration were very similar to the PeLED fabrication described above, with the only difference being the elimination of the PEI layer. To fabricate the PePD with a lateral configuration, a pair of parallel electrodes were first handwritten on pristine paper using PEDOT:PSS/PEO and AgNWs inks, respectively. The gap between these two electrodes determines the channel length of the PePD and could be carefully customized with the use of a ruler and ballpoint pens with fine nibs. A channel length as narrow as tens of micrometers had been achieved. Next, the perovskite/polymer composite ink was written to bridge the two bottom electrodes, followed by thermal annealing at 80° C.

Figure 21D:
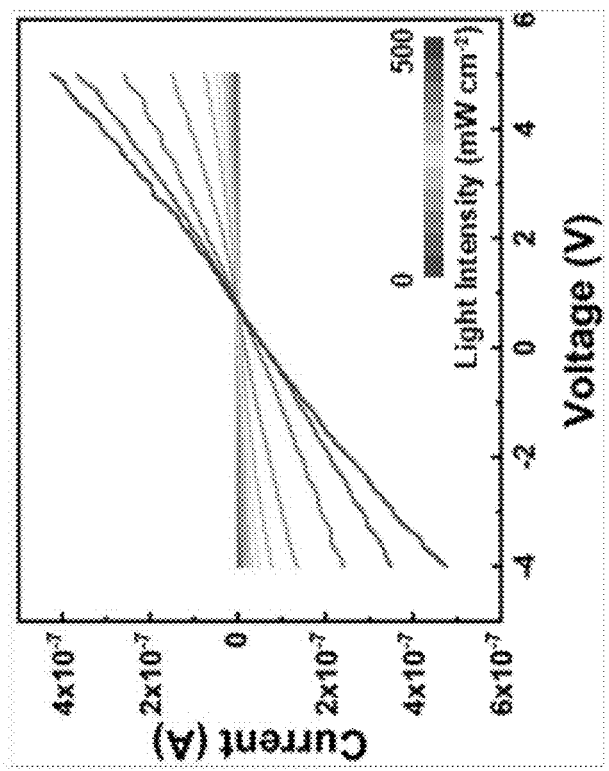
FIG. 21D is a graph showing measured current-voltage (I-V) curves under dark conditions or with incident light intensities varying from 0.1 to 500 mW cm$^{-2}$ for the lateral perovskite photoconductor of FIG. 21B.
Figure 21C:
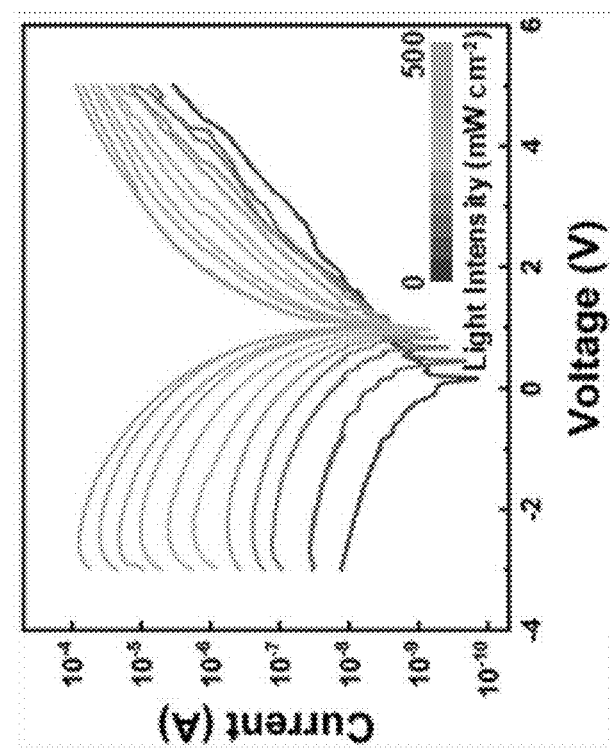
FIG. 21C is a graph showing measured current-voltage (I-V) curves under dark conditions or with incident light intensities varying from 0.1 to 500 mW cm$^{-2}$ for the vertical perovskite photodiode of FIG. 21A.

Current-voltage (I-V) curves of both types of PePDs were characterized in the dark and under 540 nm illumination with various power densities. For the vertical photodiode configuration shown in FIG. 21C, the device exhibited a low dark current ($I_{dark}$) of hundreds of pA and a high photocurrent ($I_{light}$) of tens of μA under the illumination of 500 mW/cm², yielding a PD on/off ratio ($I_{light}/I_{dark}$) of $1.1 \times 10^4$ at −0.5 V bias or $9.2 \times 10^3$ at −2.5 V bias. Clear diode behavior with a rectification ratio of over 300 in dark conditions at (−3 and +5 V) was also observed in such vertical photodiodes. As the irradiation intensity increased, the corresponding open-circuit voltage ($V_{oc}$) also increased gradually to approximately 1 V. Furthermore, due to the built-in electric field in the photodiode, a small or even zero bias voltage was sufficient to extract the photogenerated carriers in the photoactive layer, resulting in photocurrent. In contrast, the PePD with the lateral configuration shown in FIG. 21B exhibited drastically different behavior with roughly linear and symmetric I-V characteristics (FIG. 21D), suggesting a typical photoconductor behavior. It is worth pointing out that a small short-circuit current ($J_{sc}$) and a consistent open-circuit voltage of around 0.75 V were observed under illumination in such a lateral photoconductor device. Normally, the I-V characteristics of an ideal photoconductor should pass through the origin with both Voc and Jsc equal to 0. The existence of a small Voc can be attributed to the parasitic photovoltaic effect caused by the asymmetric bottom electrodes, or more specifically, the parasitic Schottky junctions formed at the interface between the electrodes and the perovskite photoactive layer. As a result, the PePD with lateral photoconductor configuration could also work under a zero-volt bias voltage.

Figure 21F:
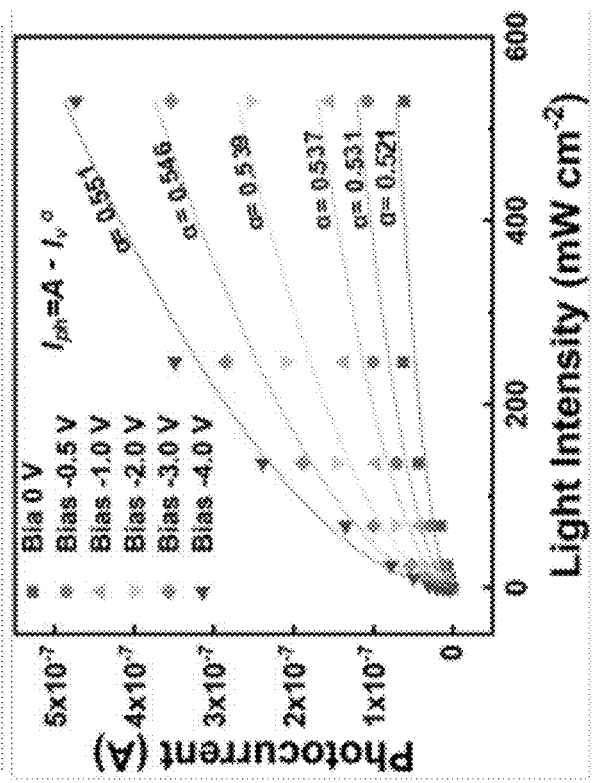
FIG. 21F is a graph of the photocurrent-light intensity curves under different bias voltages for the lateral perovskite photoconductor of FIG. 21B.
Figure 21E:
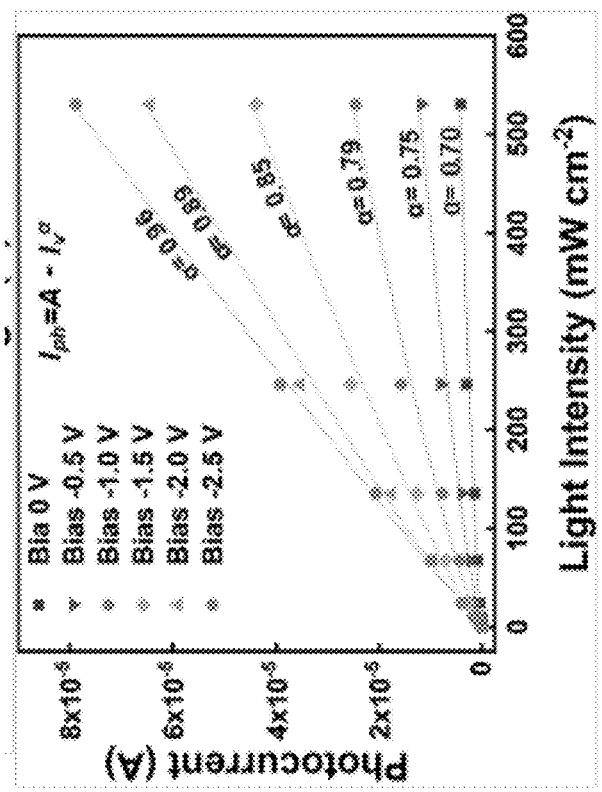
FIG. 21E is a graph of the photocurrent-light intensity curves under different bias voltages for the vertical perovskite photodiode of FIG. 21A.

The relations between the photocurrent ($I_{ph}$) and irradiation power density (Iv) of the vertical photodiode (FIG. 21A) and a photoconductor (FIG. 21B) under different bias voltages were characterized and presented in FIGS. 21E and 21F, respectively. The curves were fitted by the power law $I_{ph}=A \cdot I_v^\alpha$, where $I_{ph}=I_{light}-I_{dark}$, $I_v$ is the irradiation power density, and the exponent a is a constant used as a fitting parameter. The fitting value of a for the vertical PePD was up to 0.96 at-2.5 V bias, suggesting an approximately linear relationship and close to ideal photodiode behavior. On the other hand, the a for the lateral PePD was 0.551 at −4.0 V bias, indicating a non-linear relation between photocurrent and irradiation power density, which was likely caused by increased recombination of photogenerated carriers under high-intensity light illumination. Furthermore, such strong recombination of photogenerated electron-hole pairs at higher incident light intensities would eventually become dominant, resulting in a decreasing trend of responsivity for increasing light intensity.

Figure 21G:
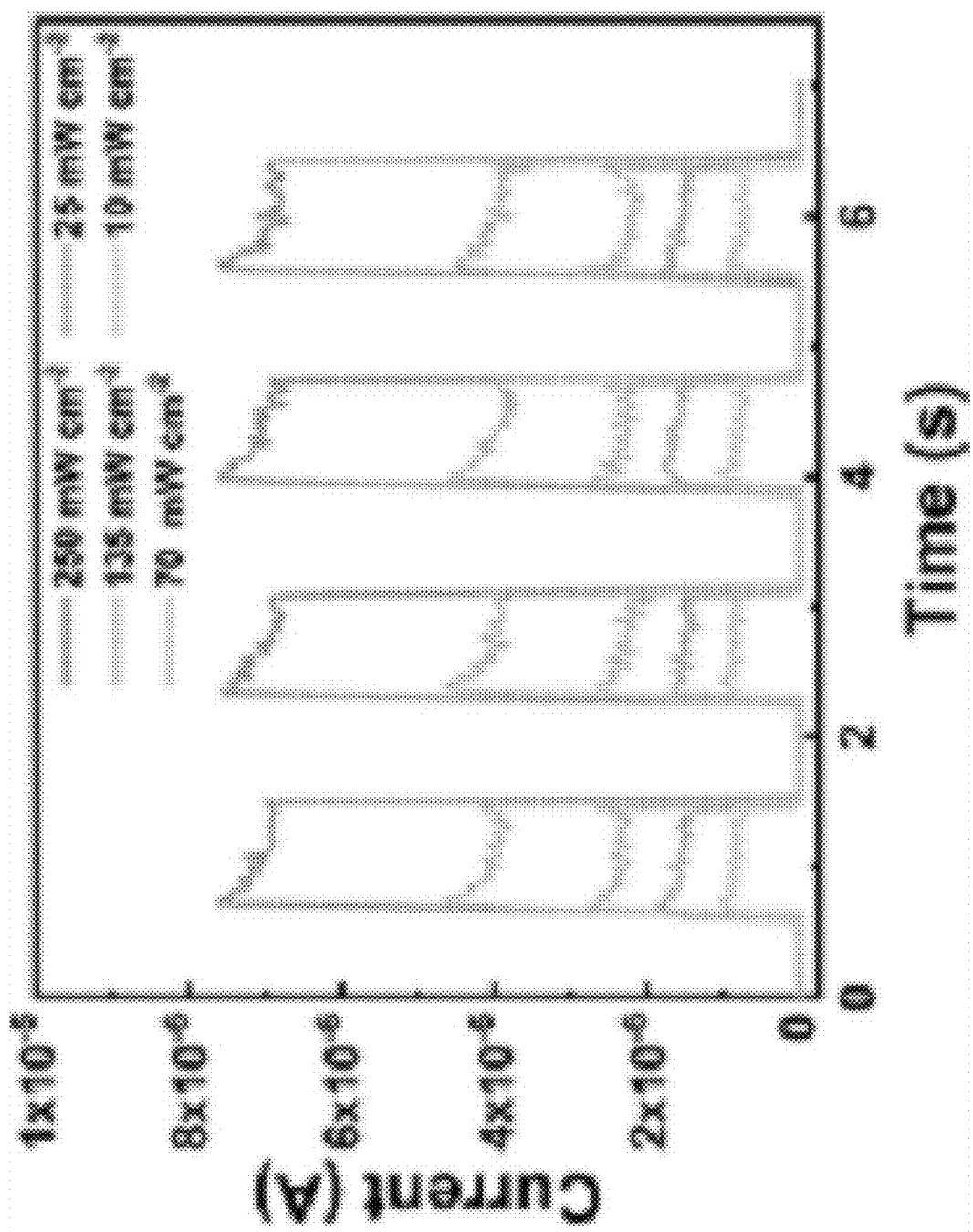
FIG. 21G is a graph of dynamic photoresponse measured under different light intensities and at a bias voltage of −0.5 V for the vertical perovskite photodiode of FIG. 21A.
Figure 21H:
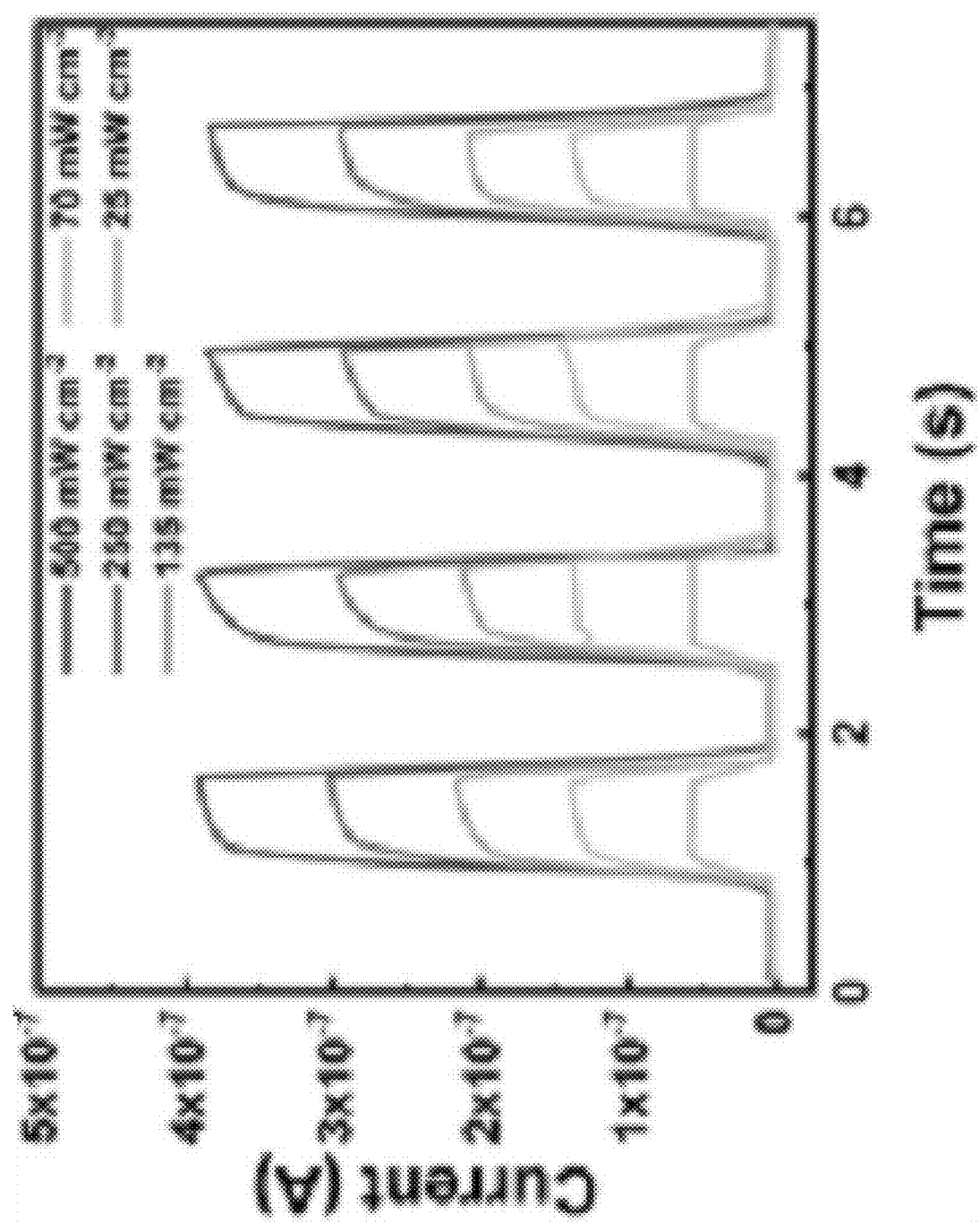
FIG. 21H is a graph of dynamic photoresponse measured under different light intensities and at a bias voltage of −4.0 V for the lateral perovskite photoconductor of FIG. 21B.
Figure 21I:
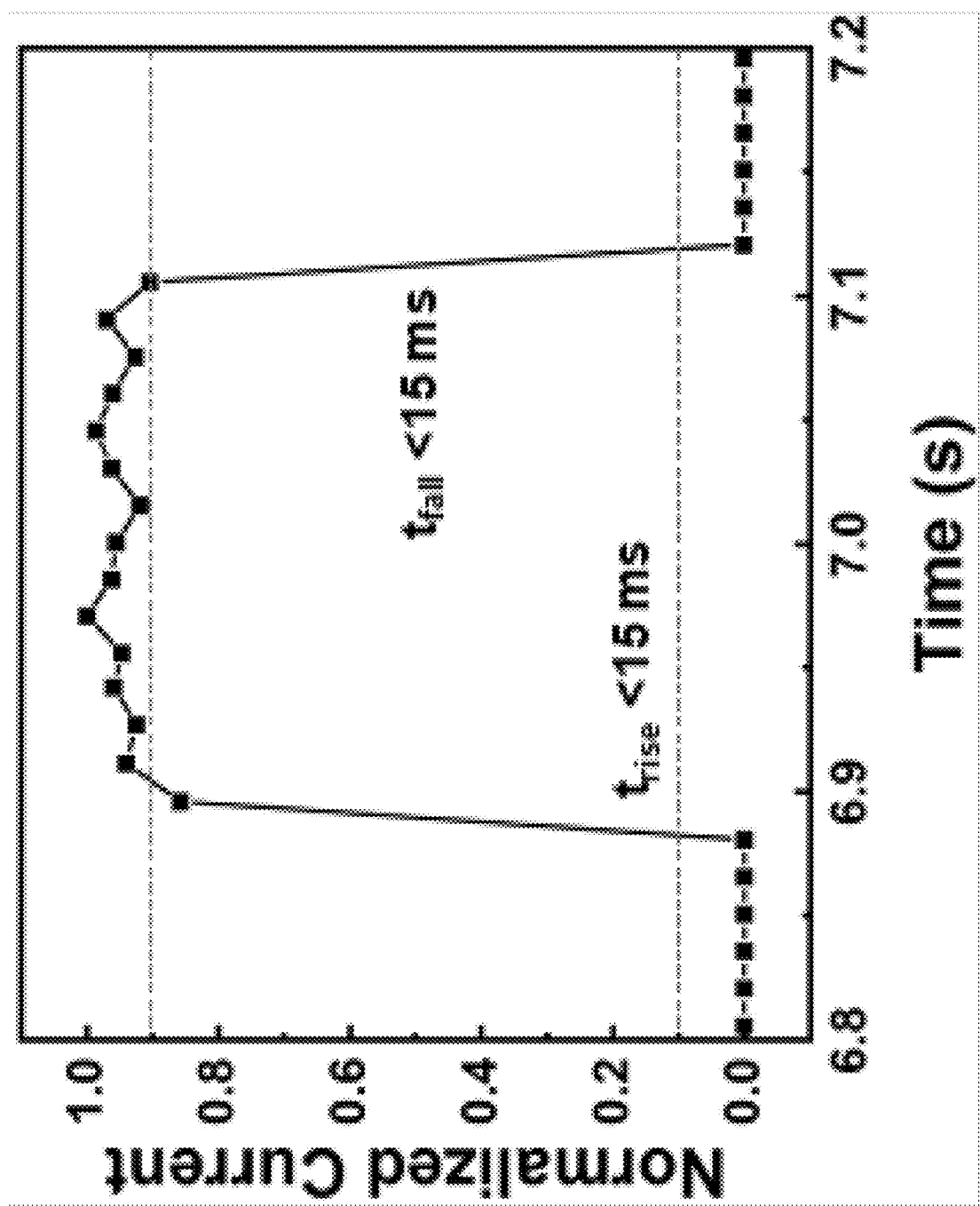
FIG. 21I is a graph showing a zoomed-in view of one cycle from the graph of FIG. 21G showing the rise and fall time of the device of FIG. 21A.
Figure 21J:
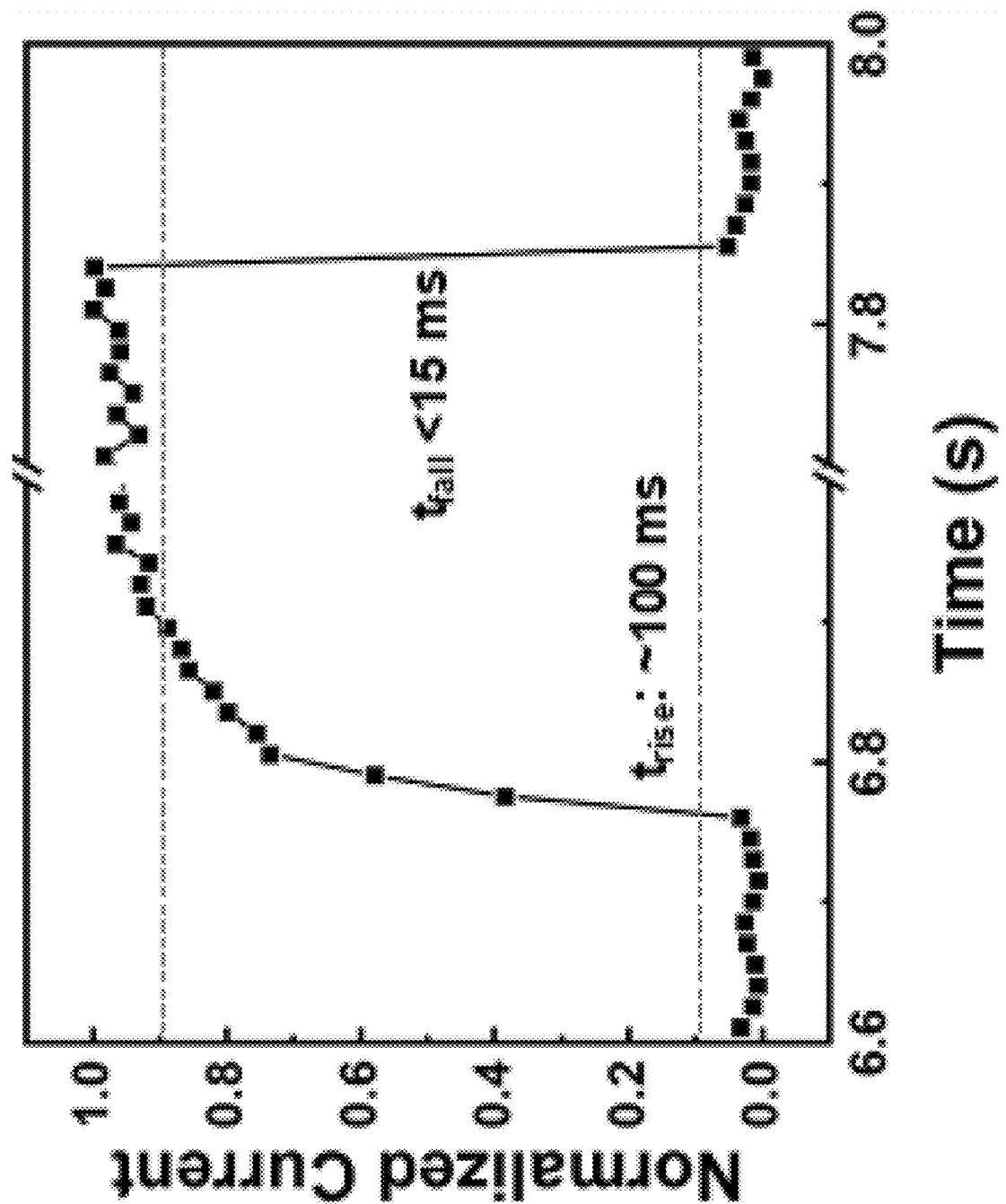
FIG. 21J is a graph showing a zoomed-in view of one cycle from the graph of FIG. 21H showing the rise and fall time of the device of FIG. 21B.

The dynamic photoresponse of the vertical and lateral PePDs were also measured under different incident light intensities and plotted in FIGS. 21G and 21H, respectively. Highly repeatable and monotonically increasing photoresponses were observed with increasing incident light intensity. The response time is defined as the rise time ($t_{rise}$) and fall time ($t_{fall}$) needed for the photocurrent to switch between 10% and 90% of the maximum value during a light on-off cycle. Photodiodes are known to typically offer a much faster switching speed than photoconductors as the rise/fall time of the former is limited by the carrier transit time through the depletion region while the latter is limited by the carrier lifetime. For the vertical photodiode, both rise and fall times were expected to be significantly shorter than the measured 15 ms since only two data points were collected during the transition (FIG. 21I), due to limitations imposed by the sampling rate of the semiconductor analyzer used for these measurements. For the lateral photoconductor, the rise time was measured to be around 100 ms while the fall time was less than 15 ms (FIG. 21J). To verify the hypothesis that perovskite/PMMA composite was a preferred choice for photodetector applications, additional handwritten vertical photodiodes were prepared on the paper substrate using the MAPbBr$_3$/PS composite film (used in the PeLEDs) as a photoactive layer. Absorption spectra were first measured to confirm that the choice of polymer additive (none, or PMMA or PS) had little influence on the intrinsic light absorbing property of the perovskite/polymer composites and pure perovskite. Compared with MAPbBr$_3$/PMMA-based photodiode illustrated in FIG. 21A, the MAPbBr$_3$/PS-based photodiode exhibited a slower response time and one order of magnitude lower PD on/off ratio ($1.25 \times 10^3$ at −2.5 V), suggesting more recombination of photogenerated carriers and shorter carrier lifetime.

What is claimed is:

1. A photoelectronic device, comprising:
   a. a substrate comprising any one of PDMS-coated glass, PDMS-coated PET, PDMS-coated paper, PDMS-coated textile, vinyl, latex, or metal foil;
   b. a first electrode comprising polyethylene oxide (PEO)-modified poly(3,4-ethylenedioxythiophene) polystyrene sulfonate (PEO-modified PEDOT:PSS), wherein the PEO comprises up to about 70 wt % of the PEO-modified PEDOT:PSS;
   c. a photoactive layer comprising perovskite microcrystals embedded in a polymer matrix, wherein the perovskite microcrystals comprise MAPbBr$_3$, MAPb(Cl$_{1-x}$Br$_x$)$_3$, MAPb(Br$_x$I$_{1-x}$)$_3$, quasi-2D BA$_2$(MAPbI$_3$)$_{n-1}$PbI$_4$, and any combination thereof and the polymer matrix comprises PEO, PS, PMMA, and any combination thereof; and
   d. a second electrode comprising a silver nanowire (AgNW) network.

2. The device of claim 1, wherein the photoelectronic device is a vertical photoconductor comprising:
   a. the first electrode positioned over the substrate, the first electrode comprising the PEO-modified PEDOT:PSS with about 30% wt of PEO;
   b. the photoactive layer positioned over the first electrode, the photoactive layer comprising the MAPbBr$_3$ perovskite crystals embedded in a PMMA polymer matrix; and
   c. the second electrode positioned over the photoactive layer, the second electrode comprising the silver nanowire (AgNW) network.

3. The device of claim 1, wherein the photoelectronic device is a horizontal photoconductor comprising:
   a. the first electrode positioned over the substrate, the first electrode comprising the PEO-modified PEDOT:PSS with about 30% wt of PEO;
   b. the second electrode positioned over the substrate and separated from the first electrode to define a gap, the second electrode comprising the silver nanowire (AgNW) network; and
   c. the photoactive layer positioned over the first electrode and the second electrode within the gap, the photoactive layer comprising the MAPbBr$_3$ perovskite crystals embedded in a PMMA polymer matrix.

4. The device of claim 1, wherein the photoelectronic device is an LED comprising:
   a. the first electrode positioned over the substrate, the first electrode comprising the PEO-modified PEDOT:PSS with about 30% wt of PEO;

b. the photoactive layer positioned over the first electrode, the photoactive layer comprising the perovskite microcrystals embedded in the polymer matrix, wherein the perovskite microcrystals comprise $MAPb(Cl_{1-x}Br_x)_3$, $MAPb(BrxI_{1-x})_3$, quasi-2D $BA_2(MAPbI_3)_{n-1}PbI_4$, and any combination thereof and the polymer matrix comprises PEO, PS, PMMA, and any combination thereof;

c. a buffer layer positioned over the photoactive layer, the buffer layer comprising polyethyleneimine (PEI); and d. the second electrode positioned over the buffer layer, the second electrode comprising the silver nanowire (AgNW) network.

5. The device of claim 4, wherein the photoactive layer comprises a $MAPbBr_3$/PEO composite.

6. The device of claim 1, wherein the first electrode, the photoactive layer, and the second electrode are formed from ink compositions applied by a printing device or a handwriting device, the printing device comprising an inkjet printer or a microplotter and the handwriting device comprising a pen.

* * * * *